(12) United States Patent
Draxler et al.

(10) Patent No.: US 6,725,430 B2
(45) Date of Patent: Apr. 20, 2004

(54) PROCESS FOR DESIGNING HIGH FREQUENCY CIRCUITS IN MULTIPLE DOMAINS

(75) Inventors: Paul J. Draxler, San Diego, CA (US); William Woodall, Vista, CA (US)

(73) Assignee: Qualcomm Incorporated, San Diego, CA (US)

( * ) Notice: Subject to any disclaimer, the term of this patent is extended or adjusted under 35 U.S.C. 154(b) by 190 days.

(21) Appl. No.: 10/011,611

(22) Filed: Nov. 5, 2001

(65) Prior Publication Data

US 2003/0101418 A1 May 29, 2003

(51) Int. Cl.[7] .............................................. G06F 17/50
(52) U.S. Cl. ........................ 716/1; 716/2; 716/4; 716/6; 716/8
(58) Field of Search ....................... 235/462, 15; 716/1, 716/2, 4, 6, 8

(56) References Cited

U.S. PATENT DOCUMENTS 5,396,053 A * 3/1995 Swartz et al. .......... 235/462.15
5,781,439 A * 7/1998 Rostoker et al. ............... 716/8

* cited by examiner

Primary Examiner—Vuthe Siek
Assistant Examiner—Thuan Do
(74) Attorney, Agent, or Firm—Philip Wadsworth; Charles D. Brown; Richard Bachand

(57) ABSTRACT

A process of designing a high frequency circuit in multiple domains, such as prototype and production domains, is described. The process begins by obtaining one or more parameters for each domain, such as physical parameters defining, for each layer of the substrate, the layer and the material in the layer, or electrical parameters defining, for each layer, transmission media on or within the layer. Once the parameters for the first and second domains have been obtained, the process proceeds to deriving, responsive to one or more of these parameters, interchangeable implementations in the first and second domains of the one or more circuit elements.

75 Claims, 44 Drawing Sheets

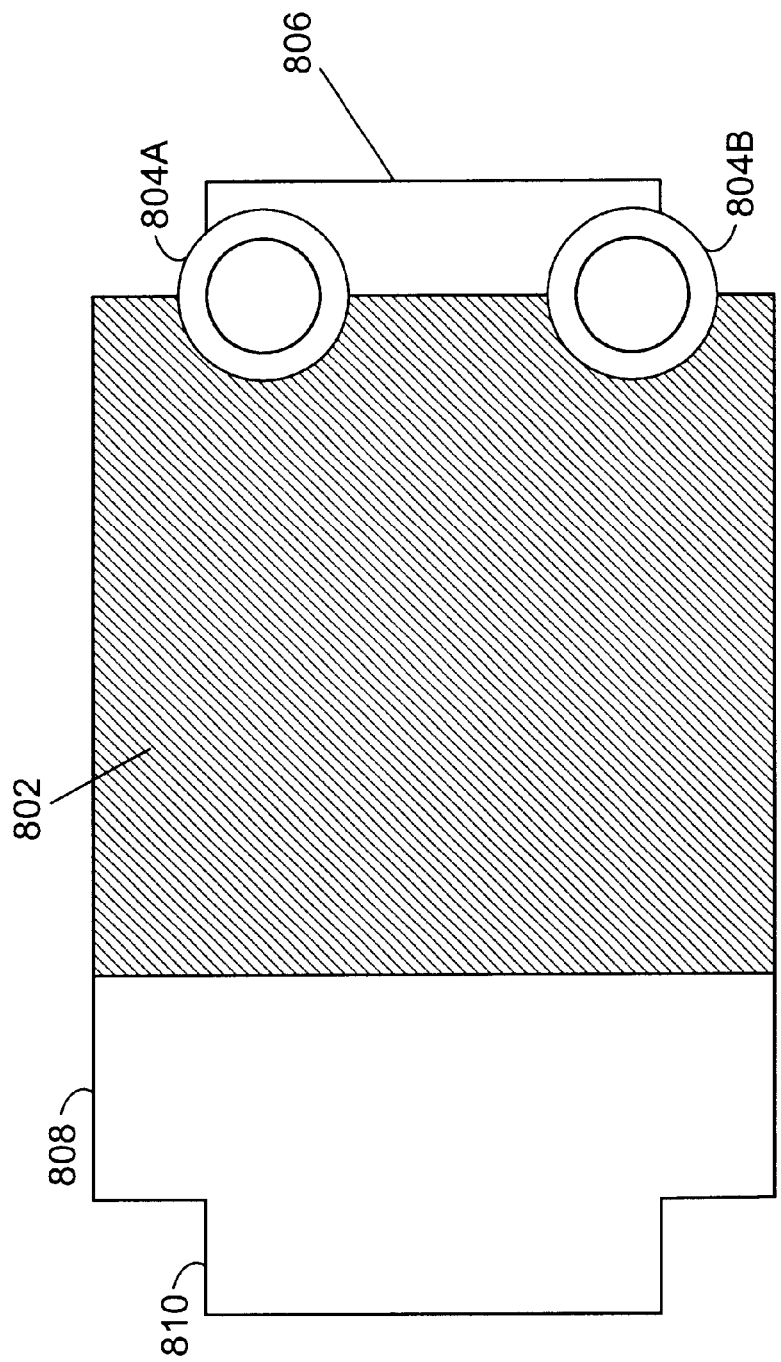

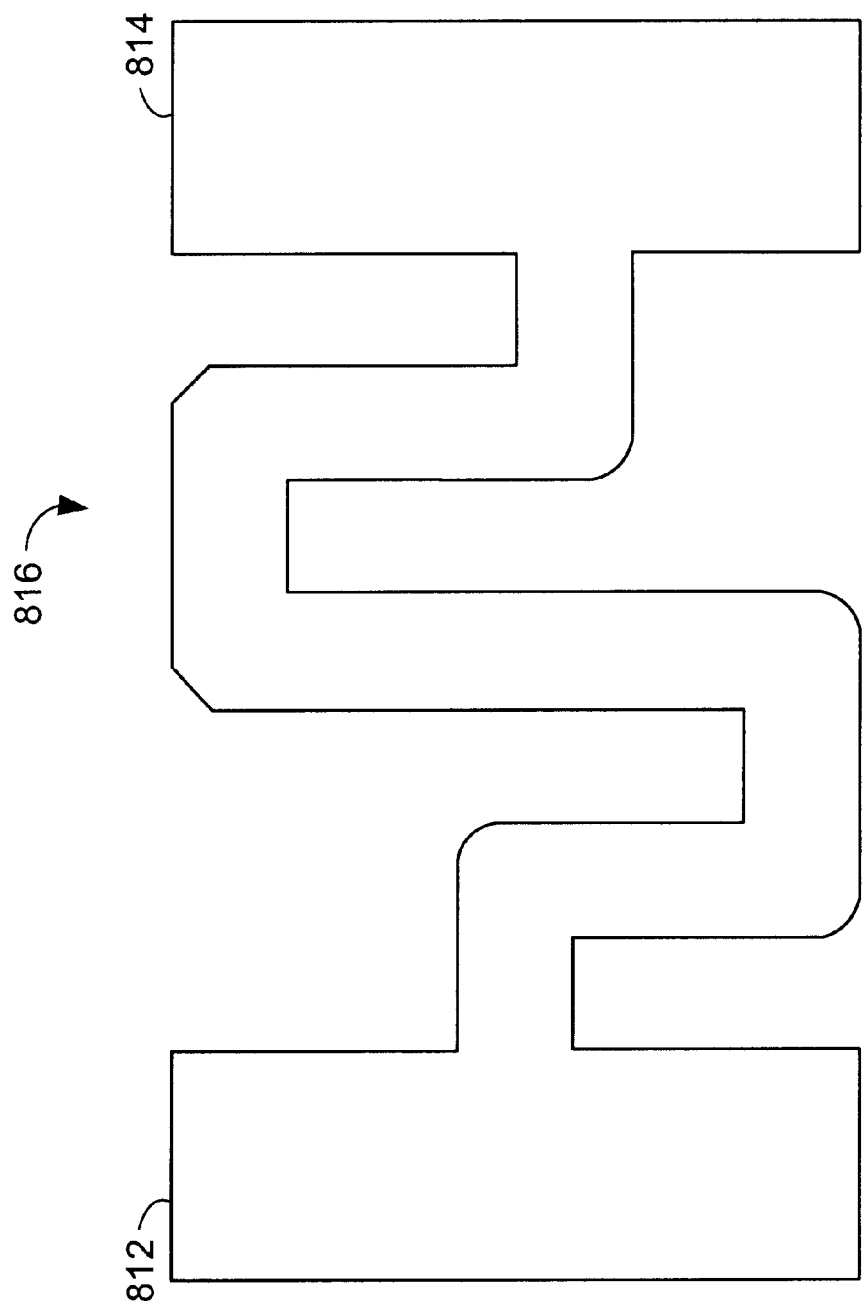

PROCESS FOR DESIGNING HIGH FREQUENCY CIRCUITS IN MULTIPLE DOMAINS

FIELD OF THE INVENTION

This invention relates to the field of high frequency circuit design, including but not limited to RF and microwave circuit design, and more specifically, to high frequency circuit designs simultaneously interchangeable into multiple domains, such as prototype and production domains.

RELATED ART

In the late 1800s, after Heinrich Hertz confirmed J. C. Maxwell's wave equations, and proved that electromagnetic energy radiates through the air in the form of long transverse waves, many new fields of endeavor were born, ranging from radio, TV and sonar, which emerged in the first half of the $20^{th}$ century, to wireless communications, including cellular, PCS, fixed wireless, and satellite communications, which became prevalent in the latter half of the $20^{th}$ century.

As these applications have evolved, the trend has been to utilize higher and higher operating frequencies, both because high frequencies facilitate faster and higher capacity information transmission than low frequencies, but also because high frequency transmissions are more efficient and entail smaller circuit elements than low frequency transmissions. In order to support these applications, electrical engineers and circuit designers have had to develop circuits capable of operating at the high frequencies.

This has posed significant challenges since, at high frequencies, many circuit elements, such as resistors, capacitors, and inductors, typically deviate quite a bit from their idealized behavior. Compounding this problem is that, at high frequencies, voltages and currents are no longer spatially uniform when compared to the physical size of the circuit elements, and instead must be treated as propagating waves, such as transverse electromagnetic (TEM) waves in which the electric and magnetic field components are orthogonal to each other and to the direction of propagation. Consequently, conventional circuit analysis techniques, in which circuit elements are modeled as idealized lumped elements which obey Kirchoff's circuit laws, no longer apply since they ignore the spatial variations in the voltage and current which occur at high frequencies, and do not account for the manner in which circuit elements deviate from their ideal behavior. Instead, more advanced models using transmission line and distributed elements, which account for this spatial variation in voltage and current, and which account for the frequency dependent behavior of the circuit elements, are required.

The non-ideal behavior of circuit elements at high frequencies can be illustrated with reference to FIGS. 1A, 2A, and 3A, which depict simplified, first order, high frequency models of, respectively, a resistor, capacitor and inductor, and FIGS. 1B, 2B, and 3B, which are respectively a plot of the real part of the impedance exhibited by the model of FIGS. 1A, the imaginary part of the admittance exhibited by the model of FIG. 2A divided by $2\pi f$, and the imaginary part of the impedance exhibited by the model of FIG. 3A divided by $2\pi f$, over high frequencies. (In FIGS. 1B, 2B, and 3B, both axes are assumed to be $\log_{10}$ scale axes).

Referring to FIG. 1A, a resistor R is modeled as two inductors L in series with each other and the parallel combination of a capacitor C and the resistor R. The inductors L model the leads to the resistor R, and C represents stray capacitance. Referring to FIG. 1B, the dotted line represents the idealized behavior of the resistor R, and the solid line represents the frequency-dependent behavior exhibited by the resistor at high frequencies. As illustrated, the real part of the impedance starts out at the value R, and then, as the frequency increases, decreases due to the effect of the stray capacitance, beginning at the point identified with numeral 102.

Referring to FIG. 2A, a capacitor C is modeled as inductor L in series with resistor $R_s$, and with the parallel combination of the capacitor C and resistor $R_e$. The inductor L represents parasitic lead inductance, and the series resistor $R_s$ represents losses through the leads. The resistor $R_e$ represents losses through the capacitor dielectric at high frequencies. Referring to FIG. 2B, the dotted line represents the idealized behavior of the capacitor, and the solid line represents the behavior of the capacitor at high frequencies. As illustrated, the capacitor starts out exhibiting idealized behavior (where the imaginary part of the admittance divided by $2\pi f$ is constant and does not vary with frequency when both are plotted on $\log_{10}$ scale axes). Then, as the frequency increases, this admittance parameter begins to increase at the point identified with numeral 104.

Referring to FIG. 3A, the inductor L is modeled as a shunt capacitance $C_s$ in parallel with the series combination of inductor L and series resistance $R_s$. The shunt capacitance $C_s$ represents the parasitic capacitance introduced by adjacent coils of the inductor, and the series resistance $R_s$ represents losses which occur through the coils and leads of the inductor. Referring to FIG. 3B, the dotted line represents the idealized behavior of the inductor, and the solid line represents the behavior of the inductor at high frequencies. As illustrated, the inductor starts out exhibiting idealized behavior (where the imaginary part of the impedance divided by $2\pi f$ is constant and does not vary with frequency when both are plotted on $\log_{10}$ scale axes). Then, as the frequency increases, this impedance parameter begins to increase at the point identified with numeral 106

At this point, a natural question to consider is what frequencies are "high" frequencies? The answer is that a "high" frequency is one which depends upon the circumstances and includes consideration of several factors such as whether the more sophisticated circuit analysis techniques referred to above are required, whether the corresponding wavelength is comparable with or less than the physical dimensions of the circuit elements involved, whether parasitic reactances are significant compared to the primary parametric value, and whether unspecified responses at higher harmonics thereof contribute to circuit performance. Referring to the table below, which is a classification of the frequency spectrum developed by the Institute of Electrical and Electronic Engineers (IEEE), it can be seen that the wavelength begins to be comparable to the physical dimensions of typical circuits elements at a point somewhere within or preceding the VHF band. In light of this factor and the other factors mentioned above, a general rule is that, a "high" frequency is any frequency beyond a point somewhere within or preceding the VHF band. Coincidentally, RF frequencies are generally understood to extend from somewhere within the VHF band to and including the S band, so "high" frequencies are generally understood to include RF frequencies. Moreover, microwave frequencies are generally understood to begin at and extend beyond the C band, so a "high" frequency is generally understood to include microwave frequencies as well.

| FREQUENCY BAND | FREQUENCY | WAVELENGTH IN FREE SPACE |
| --- | --- | --- |
| ELF (Extreme Low Frequency) | 30–300 Hz | 1,000–10,000 km |
| VF (Voice Frequency) | 300–3,000 Hz | 100–1,000 km |
| VLF (Very Low Frequency) | 3–30 kHz | 10–100 km |
| LF (Low Frequency) | 30–300 kHz | 1–10 km |
| MF (Medium Frequency) | 300–3,000 kHz | 0.1–1 km |
| HF (High Frequency) | 3–30 MHz | 10–100 m |
| VHF (Very High Frequency) | 30–300 MHz | 1–10 m |
| UHF (Ultrahigh Frequency) | 300–3,000 MHz | 10–100 cm |
| SHF (Superhigh Frequency) | 3–30 GHz | 1–10 cm |
| EHF (Extreme High Frequency) | 30–300 GHz | 0.1–1 cm |
| Decimillimeter | 300–3,000 GHz | 0.1–1 mm |
| P Band | 0.23–1 GHz | 30–130 cm |
| L Band | 1–2 GHz | 15–30 cm |
| S Band | 2–4 GHz | 7.5–15 cm |
| C Band | 4–8 GHz | 3.75–7.5 cm |
| X Band | 8–12.5 GHz | 2.4–3.75 cm |
| Ku Band | 12.5–18 GHz | 1.67–2.4 cm |
| K Band | 18–26.5 GHz | 1.13–1.67 cm |
| Ka Band | 26.5–40 GHz | 0.75–1.13 cm |
| Millimeter wave | 40–300 GHz | 1–7.5 mm |
| Submillimeter wave | 300–3,000 GHz | 0.1–1 mm |

The design of a high frequency circuit typically undergoes two distinct phases, a prototype phase and a production phase. During the prototype phase, also sometimes referred to as the pre-production phase, one or more prototypes of the circuit are typically built and then tested to make sure the circuit works for its intended purpose. During this phase, it is common for the circuit to be tuned. In order to allow changes which are inherent to tuning to be easily and flexibly made, the circuit elements as typically implemented as surface mounted devices (SMD) where the circuit elements are mounted and soldered onto the surface of a suitable substrate such as a printed wiring board (PWB) or printed circuit board (PCB). Since the elements are mounted on the surface of the substrate, they are accessible and can easily be changed.

Examples of surface mounted devices include thin-film chip resistors of aluminum or beryllium based materials, ceramic single-plate or multilayer capacitors, and wire-wound or flat coil inductors. Current thin-film chip resistors are available in the following size codes: 0402, 0603, 0805, 1206, and 1218 (the number represented by the first two digits multiplied by ten is the length of the resistor in mils, and the number represented by the next two digits multiplied by ten is the width of the resistor in mils; hence, a resistor with a size code of 0402 has a length of 40 mils and a width of 20 mils). For these devices, the resistances range from $\frac{1}{10}$ $\Omega$ to several M$\Omega$. Current surface mounted capacitors are available in sizes ranging from 15 mils square for a single layer configuration to 400 by 425 mils for multi-layer configurations. The capacitances of these devices range from 0.1 pF to several $\mu$F. Current surface mounted wire-wound inductors are available in sizes ranging from 60 by 30 mils to 180 by 120 mils. The inductances of these devices range from 1 nH to 1000 $\mu$H. Flat coil implementations are available at sizes as small as 2 mm by 2 mm, with inductances ranging from 1 to 500 nH. (For purposes of comparison, note that 1 mil=0.0001 inch=0.0254 mm).

During the production phase, the design is typically frozen, and production volumes of the circuit then manufactured. Since further design changes are not typically possible, the need for surface mounted implementations is lessened or eliminated. However, the surface mounted implementations are usually adhered to in the production phase even though alternative implementations are available that are cheaper and require less board space than the surface mounted implementations.

One such alternative that has recently become available, due to the advent of multi-layer substrates such as multi-layer printed wiring boards (PWBs) and printed circuit boards (PCBs), is integrated implementations in which the components are integrated into one or more layers of the multi-layer substrate. At present, these integrated implementations are available for passive components, i.e., resistors, capacitors, and inductors, and it is expected that integrated implementations will soon become available for additional components, such as active components, and surface acoustic wave (SAW) components such as SAW filters. In these integrated implementations, the components are typically integrated within one or more microvia layers on the uppermost portion of a multilayer PWB or PCB. These integrated implementations can provide cost savings of 1–2 ¢ per component and consume less board space compared with corresponding surface mounted implementations.

However, despite these advantages, the surface mounted implementations are still adhered to in the production phase because it is generally considered too risky to switch to the integrated implementations, even for high volume production runs. The fear is that the integrated implementations will introduce unanticipated parasitic capacitances or inductances, or otherwise deviate from their expected behavior at high frequencies, causing unacceptable circuit performance or degradation. Since this type of risk is generally avoided during the production phase, the integrated implementations are typically unexploited despite the cost and board space savings that are possible.

In "SMX—A Novel Object-Oriented Optimization System," M. H. Bakr, et al., 2001 IEEE MTT-S Digest, pp. 2083–2086, and "Space-Mapping Optimization of Microwave Circuits Exploiting Surrogate Models," M. H. Bahr, et al., IEEE Transactions on Microwave Theory and Techniques, Vol. 48, No. 12, December 2000, pp. 2297–2306, a certain space-mapping technique is proposed for mapping between coarse and fine models, but the two models are only represented in a single domain and focused on a single implementation, and therefore fall far short of a solution to the problem described above.

Hence, there is a need for an enabling technology that will allow these alternative integrated implementations to be utilized more fully during the production phase of high frequency circuits.

SUMMARY

The invention provides a process of designing a high frequency circuit in multiple domains, such as prototype and production domains. The process begins by obtaining one or more parameters relating to a first domain and one or more parameters relating to a second domain.

The one or more parameters for either domain may relate to a substrate for supporting one or more circuit elements or to transmission media on or within the substrate. The substrate for either domain may be any suitable element for supporting one or more circuit elements, including, without limitation, a PWB (printed wiring board) (which for purposes of this disclosure is defined to include PCBs (printed circuit boards)), silicon, or low temperature co-fired ceramic (LTCC). Both single layer and multi-layer substrates are possible, possibly with one or more of the top-most or bottom-most layers implemented as microvia layers.

The one or more parameters for either domain may be physical parameters including, without limitation, for each layer of the substrate, parameters defining the layer and the material in the layer, including permittivity ($\epsilon_r$), permeability ($\mu_r$), loss tangent ($\tan\Delta_s$), height (h) or height range; parameters defining the metallization of the layer, including conductivity ($\sigma_r$), thickness (t), and etch factor; parameters defining the layer stackup, including the configuration of the ground, power, and signal planes; parameters defining trace rules, including minimum and maximum line spacing and widths; and parameters defining via rules, including via stack dependencies, via hole sizes or size ranges, via spacings or spacing ranges, and via hole pad size requirements or dependencies.

The one or more parameters for either domain may also be electrical parameters defining, for each layer, and for one or more possible ground plane configurations, the width of a transmission line having a characteristic impedance ($Z_0$) of 50 Ω, the characteristic impedance ($Z_0$) of a maximum size transmission line (such as for supporting an 0805 component), and the characteristic impedance ($Z_0$) of a minimum size transmission line. Other possible electrical parameters include coupled line characteristics such as $Z_{even}$, $Z_{odd}$, c, $\gamma_{even}$, and $\gamma_{odd}$ for one or more or a range of line spacings (where γ is a complex propagation constant having as a real part α, the attenuation constant, and having as an imaginary part β, the wave number or propagation constant). The one or more electrical parameters may be derived from the one or more physical parameters or separately provided in addition to the physical parameters. In some cases, the electrical parameters may be provided in lieu of the physical parameters.

Once the parameters for the first and second domains have been obtained, the process proceeds to deriving, responsive to one or more of these parameters, interchangeable implementations in the first and second domains of the one or more circuit elements.

In one embodiment, this step involves first specifying a template of a domain-independent implementation of a circuit element, and then mapping this template into an implementation of the element in the first domain, e.g., a prototype domain surface mounted capacitor mounted on the surface of a single layer substrate, and also mapping this template into an implementation of the circuit element in the second domain, e.g., a production domain capacitor integrated within the bottom-most layer of a two layer substrate.

To ensure that the implementations are interchangeable, models of each of the implementations may be derived and one or more characteristics of the models may then be compared over a desired frequency range to ensure that the implementations are in fact interchangeable. Examples of the models which may be obtained include without limitation EM simulation models, parameterized models, lumped element equivalent circuit models, or any combination of the foregoing. One-port, two-port, or multi-port models are possible. Moreover, parameterized models in terms of scattering (S), admittance (Y), impedance (Z), hybrid (h), chain (ABCD), or other parameters are also possible. The models should be sufficient to accurately represent the behavior of the corresponding implementations over a desired frequency range, e.g., 0.5 GHz to 5.0 GHz in increments of 0.5 GHz.

Examples of the characteristics which may be compared include susceptance (imaginary part of one of the Y parameters), reactance (imaginary part of one of the Z parameters), conductance (real part of one of the Y parameters), resistance (real part of one of the Z parameters), absolute value of any of the Y, Z, S, h, or ABCD parameters, or phase of any of the Y, Z, S, h, or ABCD parameters. If the one or more characteristics do not adequately match over the desired frequency range, adjustments may then be made to one or both of the implementations until these one or more characteristics adequately match over the desired frequency range.

In one embodiment, primary characteristics of the models are compared, and adjustments made to one or both of the implementations until these characteristics very nearly match exactly over the desired frequency range. A "primary" characteristic is one which bears a relationship, whether direct, inverse, proportional, functional or otherwise, to the value of the circuit element being modeled and possibly other parameters such as frequency. For a capacitor or inductor, examples of the primary characteristic include the imaginary part of $Y_{21}$ or $Y_B$, the imaginary part of $Z_{21}$ or $Z_B$, or any other these parameters multiplied by or divided by frequency, since these bear a relationship to the value of the respective circuit element, i.e., capacitance of the capacitor and the inductance of the inductor. For a resistor, examples of the primary characteristic include the real part of $Y_{21}$ or $Y_B$, or the real part of $Z_{21}$ or $Z_B$, since these bear a relationship to the resistance of the resistor.

Then, one or more secondary characteristics of the models may also be compared, typically after the effects of the primary characteristic has been removed, and additional adjustments made to one or both of the implementations until one or both of these characteristics match. Sequential optimization is also possible, where, after the effects of the primary characteristic has been removed, the type and number of parasitics needed to account for the residual behavior of the circuit element are sequentially determined over different segments of the frequency spectrum. Additional adjustments may be needed to obtain matches between each of these sets of parasitics. Generally speaking, a "secondary" characteristic is one which bears a relationship, whether direct, inverse, proportional, functional or otherwise, to the value of a parasitic circuit element in the model and possibly other parameters such as frequency. Moreover, as general rule, the degree of match of the secondary characteristics need not be as exact as with the primary characteristic. For a parasitic capacitor or inductor, examples of secondary characteristics include the imaginary part of $Y_{11}$, $Y_{22}$, $Y_A$, or $Y_C$, the imaginary part of $Z_{11}$, $Z_{22}$, $Z_A$, or $Z_C$, or any of these parameters multiplied by or divided by frequency. For a parasitic resistance, examples of secondary characteristics include the real part of $Y_{11}$, $Y_{22}$, $Y_A$, or $Y_C$, or the real part of $Z_{11}$, $Z_{22}$, $Z_A$, or $Z_C$.

If the one or more characteristics are sufficiently similar to warrant a conclusion that there is a match, the process may conclude since two interchangeable implementations of the same one or more circuit elements have been produced in first and second domains. If not, additional adjustments may be made to one or both of the implementations until there is a sufficient match.

The implementations, corresponding models and model characteristics, templates, and parameters may be tangibly embodied in a variety of forms, e.g., on human readable or audible media such as paper, on processor readable media such as disk, or (in the case of the implementations) as physical circuitry. In addition, the process itself may be tangibly embodied on a processor readable medium, e.g., as a series of computer executable instructions embodying the process stored on a processor readable medium. The process may also be tangibly embodied in the form of a computer program product, e.g., computer program, program code, or code module which, upon execution by a process, performs the process.

In addition to the foregoing process, the invention also provides a product comprising interchangeable implementations in first and second domains of one or more circuit elements of a high frequency circuit. Again, these interchangeable implementations may be tangibly embodied in a variety of forms, i.e., on human readable or audible media, processor readable media, or as physical circuitry. In addition, the implementations may be accompanied by corresponding models of the implementations and/or model characteristics and/or the parameters from which the implementations and models were derived. This underlying information may be useful for purposes of analyzing the impact of changes in technology, parameters, frequencies, and the like, and whether the implementations can still be considered interchangeable in light of these changes.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

For purposes of this disclosure:

A "high" frequency is one which depends upon the circumstances and includes consideration of several factors such as whether the more sophisticated circuit analysis techniques referred to above are required, whether the corresponding wavelength is comparable with or less than the average size of the circuit elements involved, whether parasitic reactances are significant compared to the primary parametric value, and whether unspecified responses at higher harmonics thereof contribute to circuit performance. In light of these factors, a "high" frequency is generally any frequency beyond a point somewhere within or preceding the VHF band, including RF and microwave frequencies.

An "implementation" of a circuit element is a tangible embodiment or complete or partial definition of the circuit element in any form, including but not limited to forms where the circuit element is embodied or defined by parameters indicated on human readable or audible media, e.g., paper, on processor readable media, e.g., disk, or as physical circuitry.

A "domain" is a frame of reference or manner of representing an intended application or environment of an implementation of a circuit element.

"Interchangeable" implementations of a circuit element are implementations where the behavior thereof is sufficiently comparable such that the performance of the overall circuit including the circuit element is substantially or essentially the same.

A "primary" characteristic is one which bears a relationship, whether direct, inverse, proportional, functional or otherwise, to the value of the circuit element being modeled and possibly other parameters such as frequency.

A "secondary" characteristic is one which bears a relationship, whether direct, inverse, proportional, functional or otherwise, to the value of a parasitic circuit element in the model and possibly other parameters such as frequency.

A "processor" is any device capable of executing a series of instructions embodying a process, including but not limited to a computer, microprocessor, an ASIC, finite state machine, DSP, etc.

A "processor readable medium" is any device readable by a processor and capable of storing a series of instructions embodying a process, including but not limited to RAM, ROM, EPROM, EEPROM, PROM, disk, hard disk, floppy disk, CD-ROM, DVD, flash memory, etc.

Embodiments of Processes According to the Invention

Figure 1A:
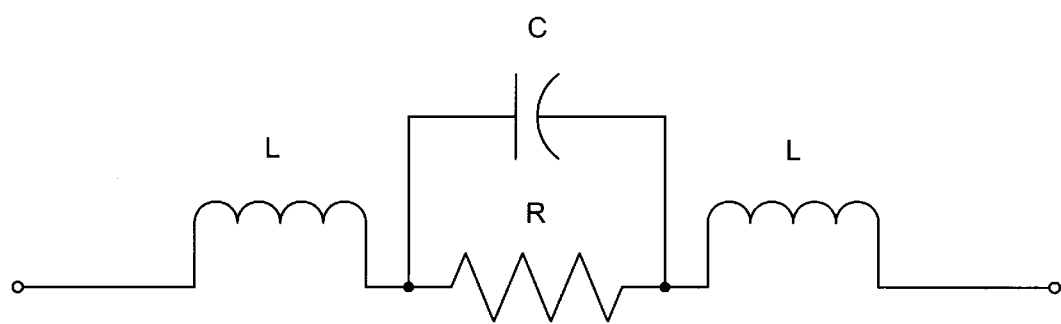
FIG. 1A is a simplified, first order high frequency model of a resistor.
Figure 1B:
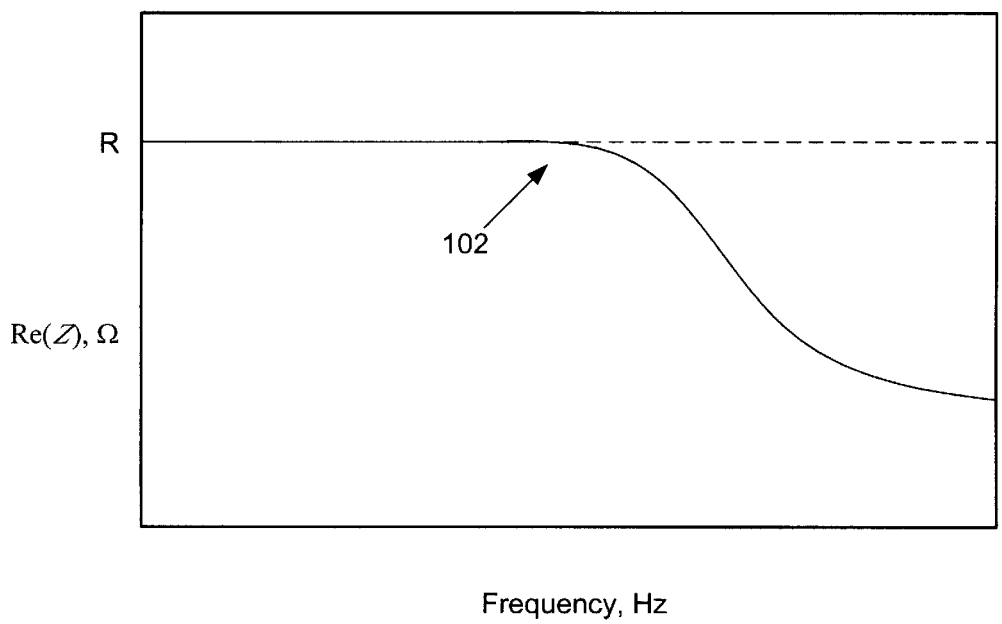
FIG. 1B is a plot comparing the high frequency behavior of the resistor of FIG. 1A relative to its idealized behavior.
Figure 2A:
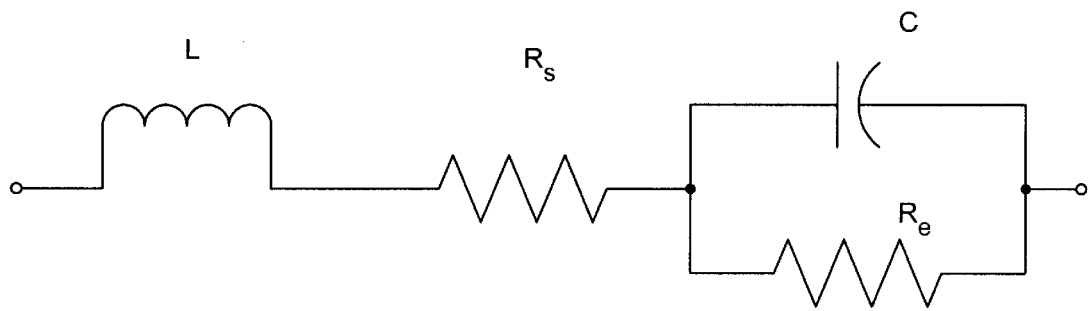
FIG. 2A is a simplified, first order high frequency model of a capacitor.
Figure 2B:
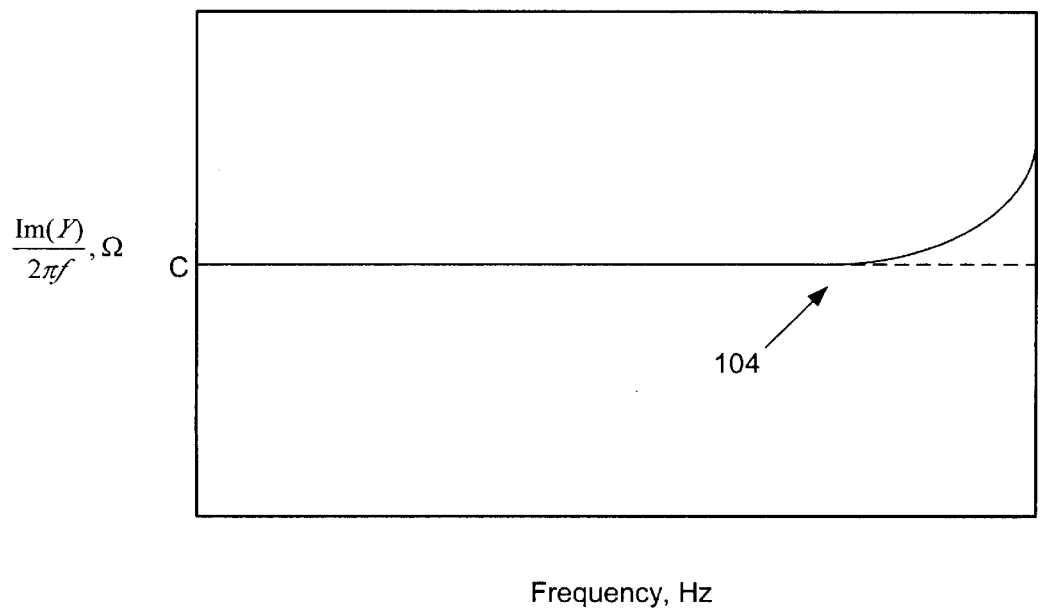
FIG. 2B is a plot comparing the high frequency behavior of the capacitor of FIG. 2A relative to its idealized behavior.
Figure 3A:
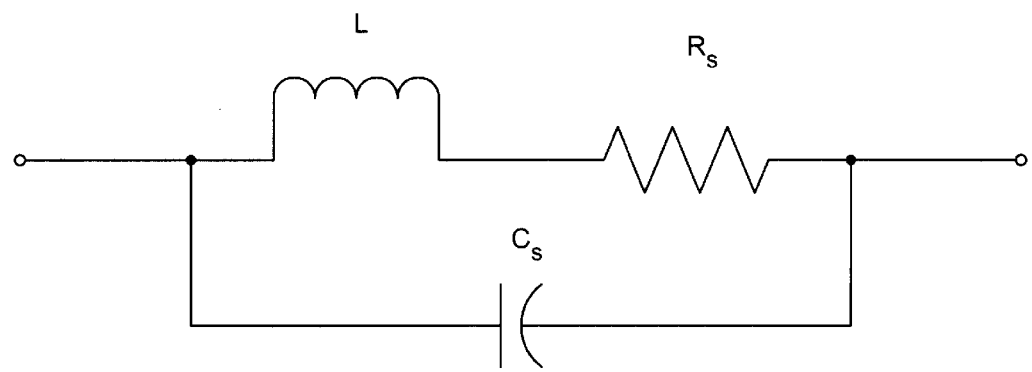
FIG. 3A is a simplified, first order high frequency model of an inductor.
Figure 3B:
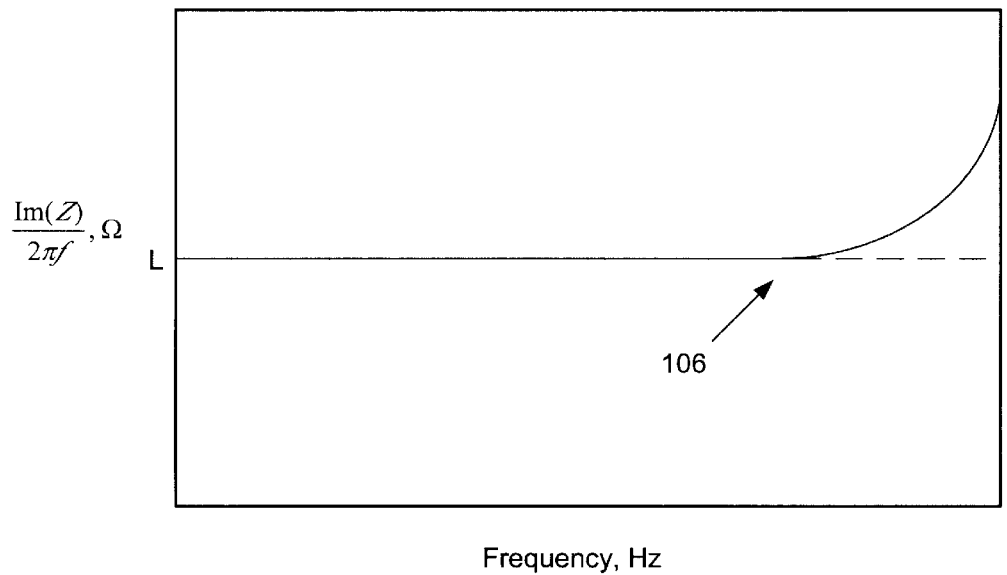
FIG. 3B is a plot comparing the high frequency behavior of the inductor of FIG. 3A relative to its idealized behavior.
Figure 4:
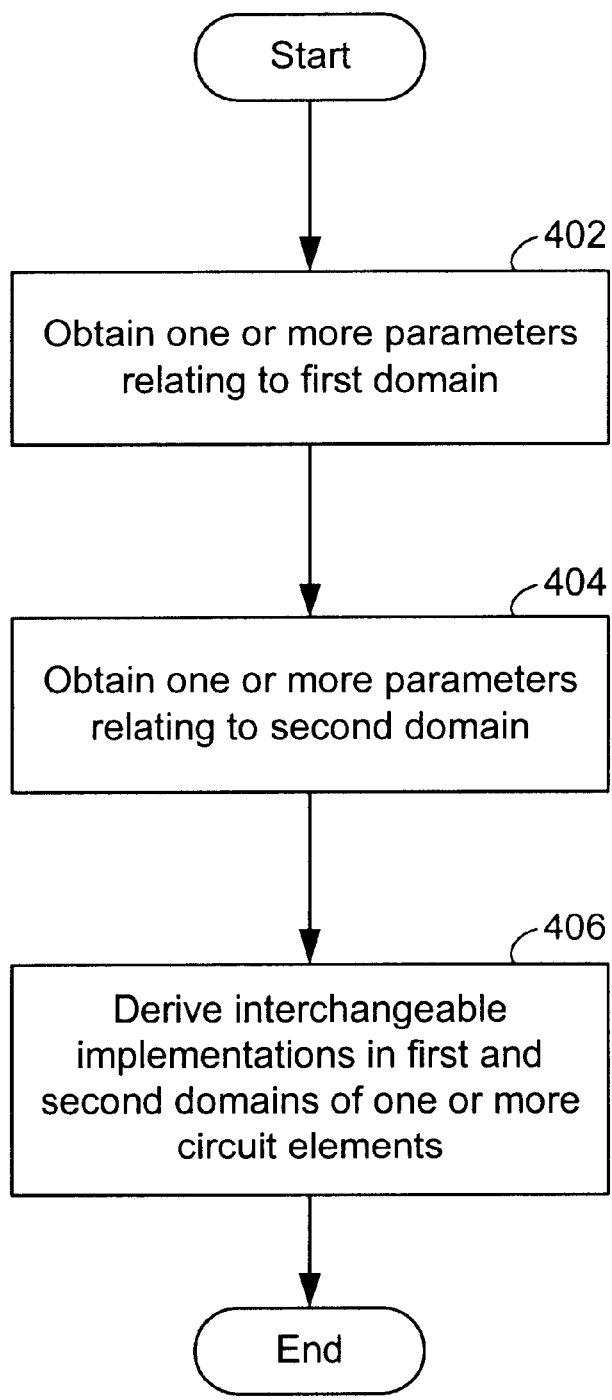
FIG. 4 is a flowchart of a first embodiment of a method of designing a high frequency circuit in multiple domains according to the invention.

Referring to FIG. 4, a first embodiment of a process of designing a high frequency circuit in multiple domains, including but not limited to prototype and production domains, is illustrated. This particular embodiment is discussed in relation to first and second domains, but it should be appreciated that the invention is not limited to situations involving two domains, but encompasses situations involving more than two domains.

The process begins with step 402, which comprises obtaining one or more parameters relating to a first domain. For example, the one or more parameters may relate to (a) a substrate for supporting one or more circuit elements, or (b) transmission media on or within the substrate. However, other examples are possible, so this example should not be construed as limiting.

The process proceeds to step 404, which comprises obtaining one or more parameters relating to a second domain. Again, the parameters may relate to (a) a substrate for supporting one or more circuit elements, or (b) transmission media on or within the substrate. However, again, other examples are possible, so this example should not be construed as limiting.

In the case where the one or more parameters for either domain relate to a substrate for supporting one or more circuit elements, the substrate for either domain may be any suitable element for supporting one or more circuit elements, including, without limitation, a PWB (which for purposes of this disclosure is defined to include PCBs), silicon, or low temperature co-fired ceramic (LTCC). Both single layer and multi-layer substrates are possible, possibly with one or more of the top-most or bottom-most layers implemented as microvia layers.

Figure 7A:
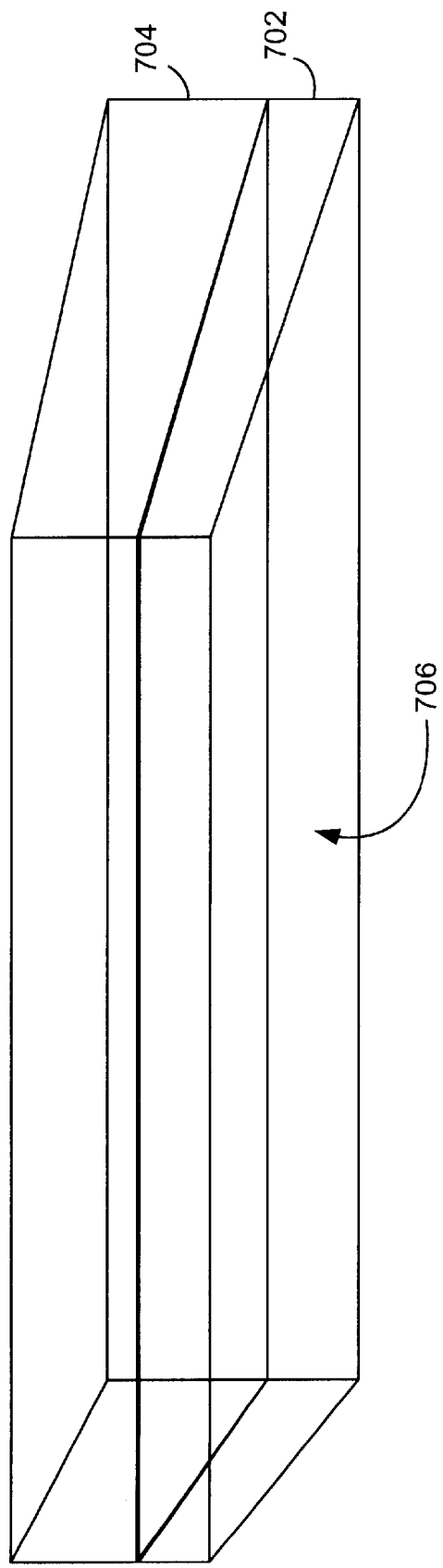
FIG. 7A illustrates an example of a production domain substrate configured to accommodate integrated components.

An example of a production domain substrate is illustrated in FIG. 7A. Many other examples are possible, so this example should not be taken as limiting. In this particular example, the substrate has two layers, identified respectively with numerals 702 and 704, with layer 702 being formed of a suitable material such as FR4, and with layer 704 comprising a microvia layer. A ground plane 706 forms the bottom surface of layer 702. Transmission media, e.g., microstrips, may be present on or within one or both of the layers. Moreover, microvia layer 704 may be and generally is configured with via holes and the like to allow for one or more circuit elements to be integrated into the layer.

Figure 7B:
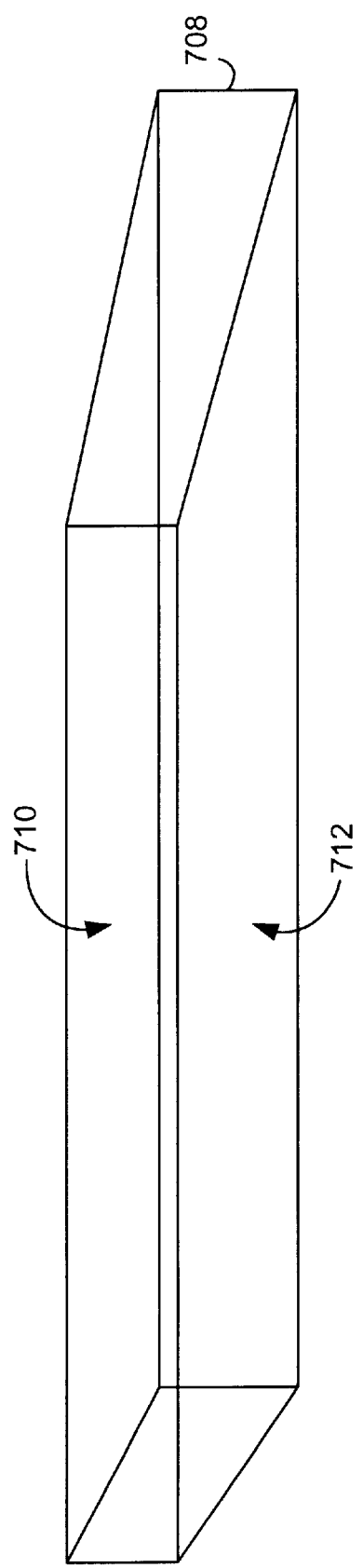
FIG. 7B illustrates an example of a prototype domain substrate configured to accommodate surface mounted components.

An example of a prototype domain substrate is illustrated in FIG. 7B. Again, many other examples are possible, so this example should not be taken as limiting. In this particular example, the substrate has a single layer, identified with numeral 708, formed of a material such as FR4. Transmission media may be present on or within the layer. Also, a ground plane 712 forms the lower surface of layer 708. Upper surface 710 of layer 708 is configured to support one or more circuit elements implemented as surface mounted components.

The one or more parameters for either domain may be physical parameters including, by way of example and not limitation, for each layer of the substrate, parameters defining the layer and the material in the layer. Alternatively, or in addition, the one or more parameters for either domain may also be electrical parameters defining, for each layer, transmission media on or within the layer. The one or more electrical parameters may be derived from the one or more physical parameters or separately provided in addition to the physical parameters. In some cases, the electrical parameters may be provided in lieu of the physical parameters.

Once the parameters for the first and second domains have been obtained, the process proceeds to step 406, which comprises deriving, responsive to one or more of these parameters, interchangeable implementations in the first and second domains of the one or more circuit elements.

Figure 5:
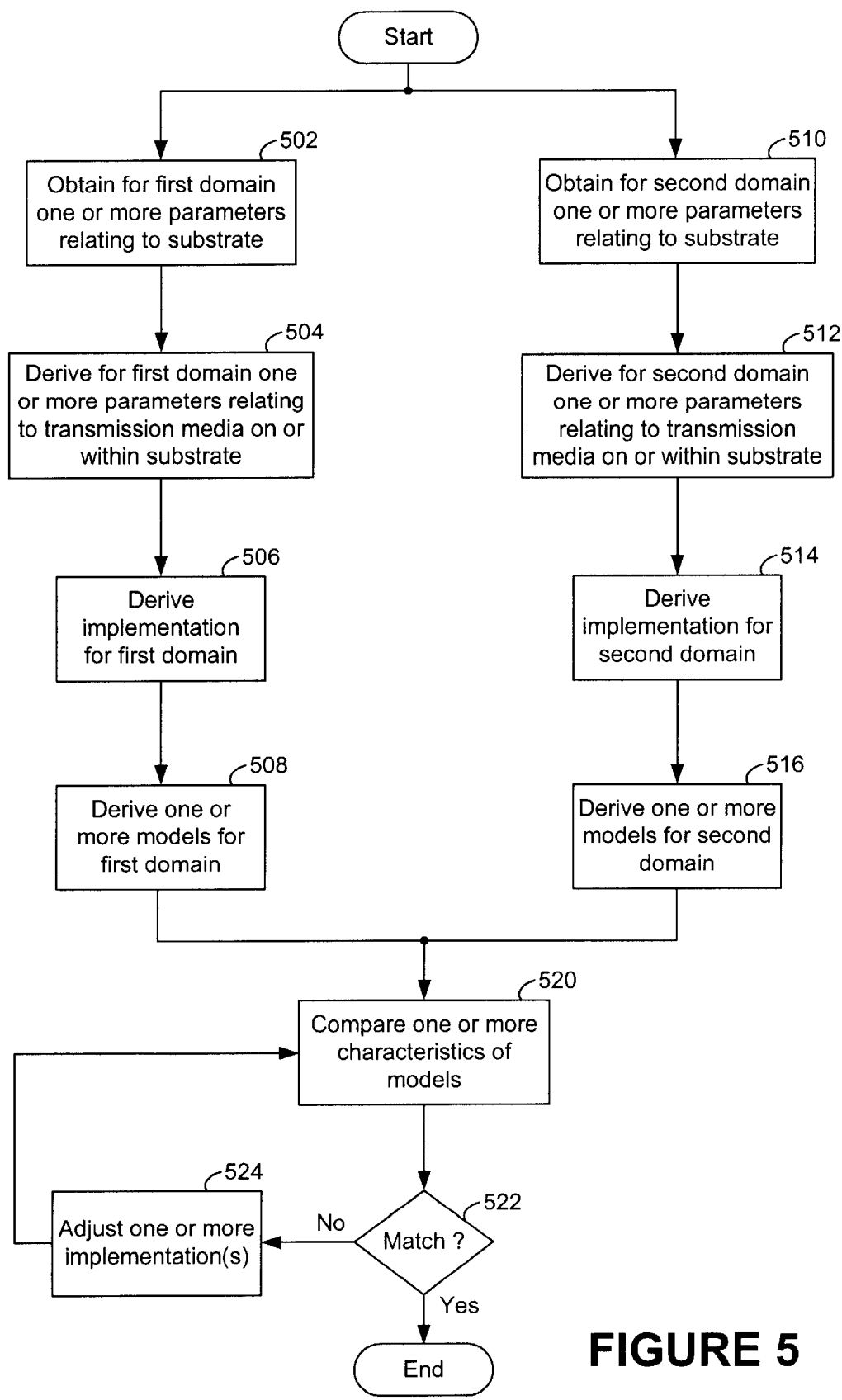
FIG. 5 is a flowchart of a second embodiment of a method of designing a high frequency circuit in multiple domains according to the invention.

A second embodiment of a process of designing high frequency circuits in multiple domains is illustrated in FIG. 5. As illustrated, the process begins by branching into two separate paths which may be performed in parallel. The first path comprises steps 502–508, which are performed in relation to a first domain, and steps 510–516, which are performed in relation to a second domain.

Step 502 comprises obtaining for the first domain one or more parameters relating to a substrate for supporting one or more circuit elements, and step 510 comprises obtaining for the second domain one or more parameters relating to a substrate for supporting the one or more circuit elements. The one or more parameters for either domain may be physical parameters including, by way of example and not limitation, for each layer of the substrate, parameters defining the layer and the material in the layer, including permittivity ($\epsilon_r$), permeability ($\mu_r$), loss tangent (tan$\Delta_s$), height (h) or height range; parameters defining the metallization of the layer, including conductivity ($\sigma_r$), thickness (t), and etch factor; parameters defining the layer stackup, including the configuration of the ground, power, and signal planes; parameters defining trace rules, including minimum and maximum line spacing and widths; and parameters defining via rules, including via stack dependencies, via hole sizes or size ranges, via spacings or spacing ranges, and via hole pad size requirements or dependencies.

Step 502 is followed by step 504, which comprises deriving, from the one or more parameters obtained in step 502, one or more parameters relating to transmission media on or within the substrate of the first domain. Similarly, step 510 is followed by step 512, which comprises deriving, from the one or more parameters obtained in step 510, one or more parameters relating to transmission media on or within the substrate of the second domain.

The one or more derivative parameters for either domain may be electrical parameters defining, for each layer, one or more possible ground plane configurations, the width of a transmission line having a characteristic impedance ($Z_0$) of 50 Ω, the characteristic impedance ($Z_0$) of a maximum size transmission line (such as for supporting an 0805 component), and the characteristic impedance ($Z_0$) of a minimum size transmission line. Other possible electrical parameters include coupled line characteristics such as $Z_{even}$, $Z_{odd}$, c, $\gamma_{even}$, and $\gamma_{odd}$ for one or more or a range of line spacings (where γ is a complex propagation constant having as a real part α, the attenuation constant, and having as an imaginary part β, the wave number or propagation constant). Again, other examples are possible, so these examples should not be taken as limiting.

Step 504 is followed by step 506, which comprises deriving an implementation in the first domain of one or more elements of the high frequency circuit. Similarly, step 512 is followed by step 514, which comprises deriving an implementation in the second domain of the one or more elements of the high frequency circuit.

In one configuration, steps 506 and 514 occur by first specifying a domain-independent template of one or more circuit elements, and then mapping this template into an implementation in the first domain, e.g., a prototype domain surface mounted capacitor mounted on the surface of a single layer substrate, and also mapping this template into an implementation in the second domain, e.g., a production domain capacitor integrated within a layer of a two-layer substrate. These two mappings may occur responsive to one or more of the parameters derived in steps 504 and 512, and/or one or more of the parameters obtained in steps 502 and 510.

An example of this mapping process may be described with reference to FIGS. 7C, 7D, and 8A. FIG. 8A is a top view of a domain-independent template of a capacitor in which the cross-hatched portion identified with numeral 802 represents the top-most plate, and the black portion identified with numeral 808 represents the bottom-most plate. (The two plates overlap by a specified portion which is not shown in the figure). The two input ports to the capacitor are the black portions identified with numerals 806 and 810. Both ports are situated on the same lower level as plate 808. The first port, identified with numeral 810, is integral with the bottom plate 808, and the second port, identified with numeral 806, is connected to the top plate 802 through vias 804a and 804b.

Figure 7C:
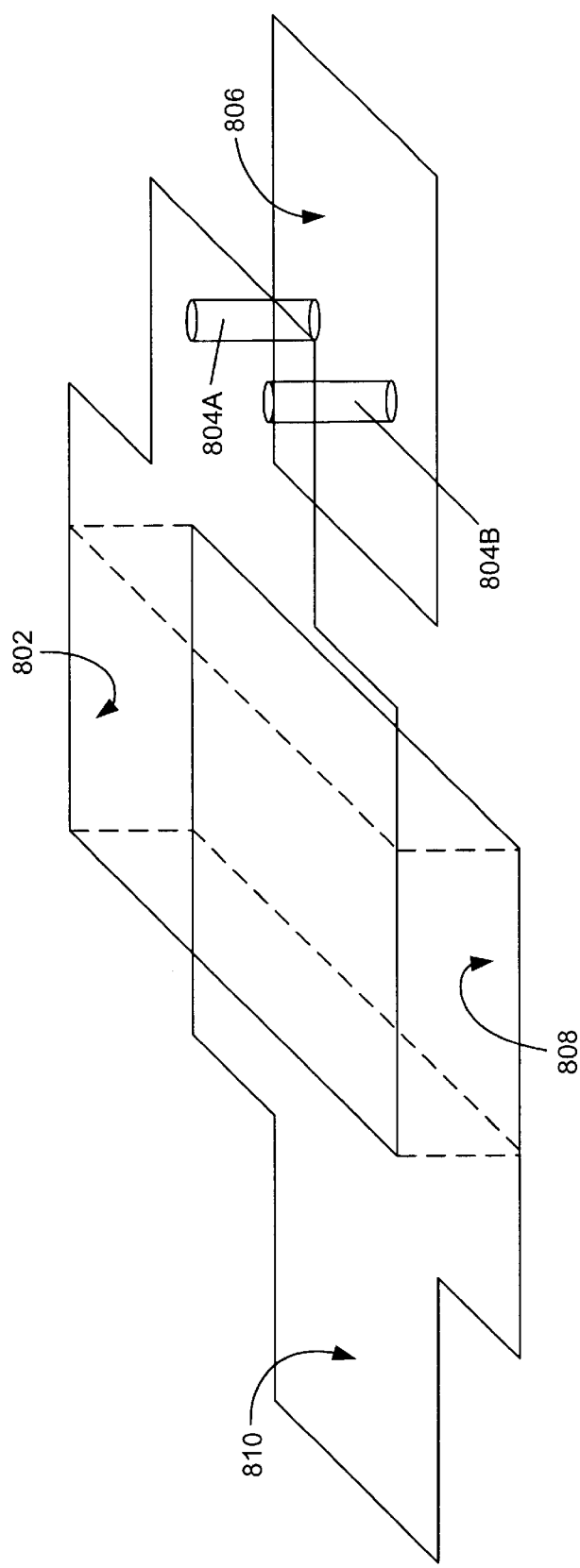
FIG. 7C illustrates an example of a production domain implementation of a capacitor.
Figure 8A:
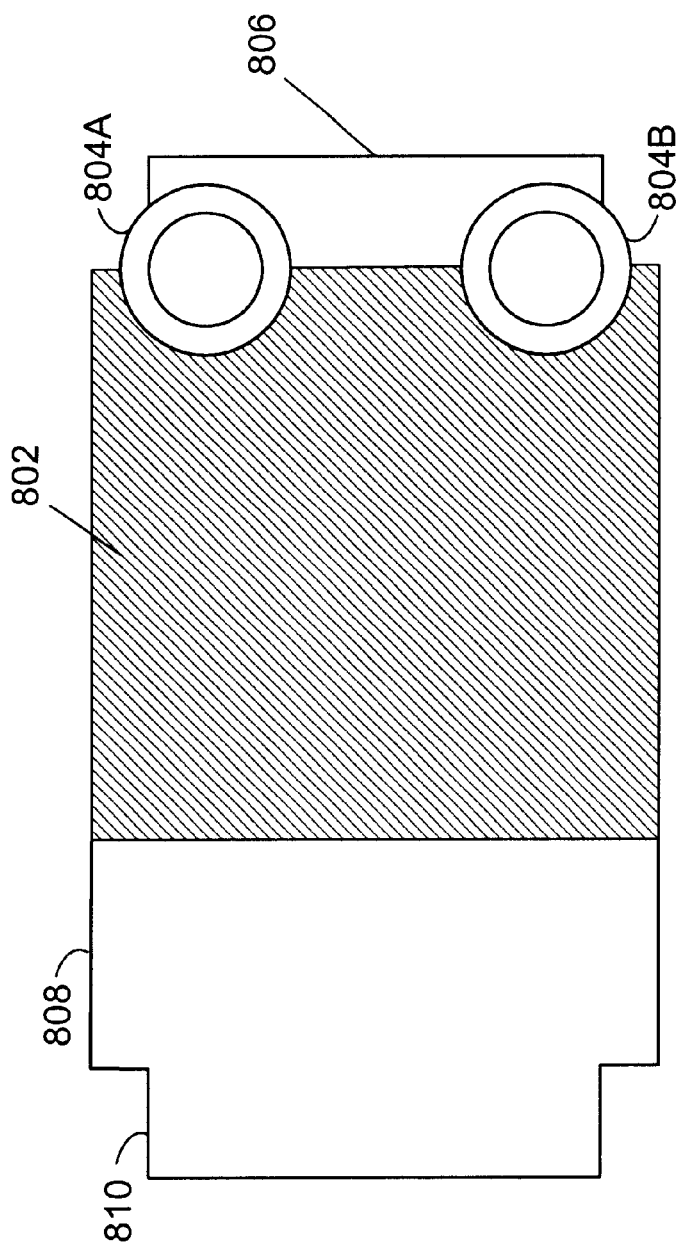
FIGS. 8A–8C are examples of capacitor templates.

FIG. 7C illustrates a production domain implementation of that capacitor. When integrated within the upper layer 704 of the substrate of FIG. 7A, upper plate 802 is formed at the upper surface of layer 704, while bottom plate 808, first port 810 and second port 806 are formed at the bottom surface of layer 704. In addition, vias 804a and 804b are implemented with two of the vias which are normally provided within microvia layer 704.

Figure 7D:
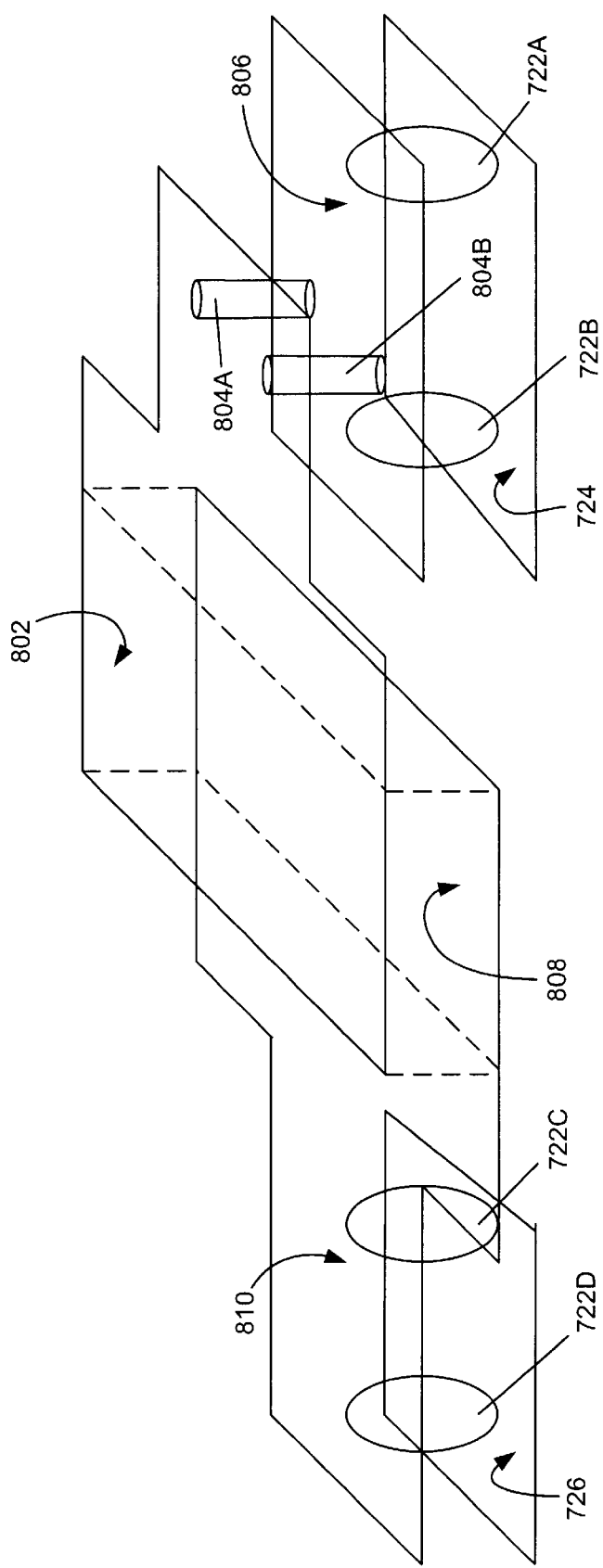
FIG. 7D illustrates an example of a prototype domain implementation of a capacitor.

Similarly, FIG. 7D illustrates a prototype domain implementation of that capacitor. When mounted on top of the single layer substrate of FIG. 7B, upper plate 802 is formed at the upper surface of a piece of substrate material, while bottom plate 808, first port 810 and second port 806 are formed at the bottom surface of the piece of substrate material. First port 810 is mounted, through connectors 722c and 722d (which may be but are not limited to solder balls), to contact pad 726 which is situated on the upper surface 710. In addition, second port 806 is mounted, through connectors 722a and 722b (which again may be but are not limited to solder balls), to contact pad 724 which is also situated on the upper surface 710.

In one implementation, the template may be selected from a library of templates. FIGS. 8A–8D illustrate examples of capacitor templates such as may be included in the library, and FIGS. 8E–8Q illustrate examples of inductor templates such as may be included in the library. Many of other examples are possible, so these examples should not be construed as limiting.

Figure 8B:
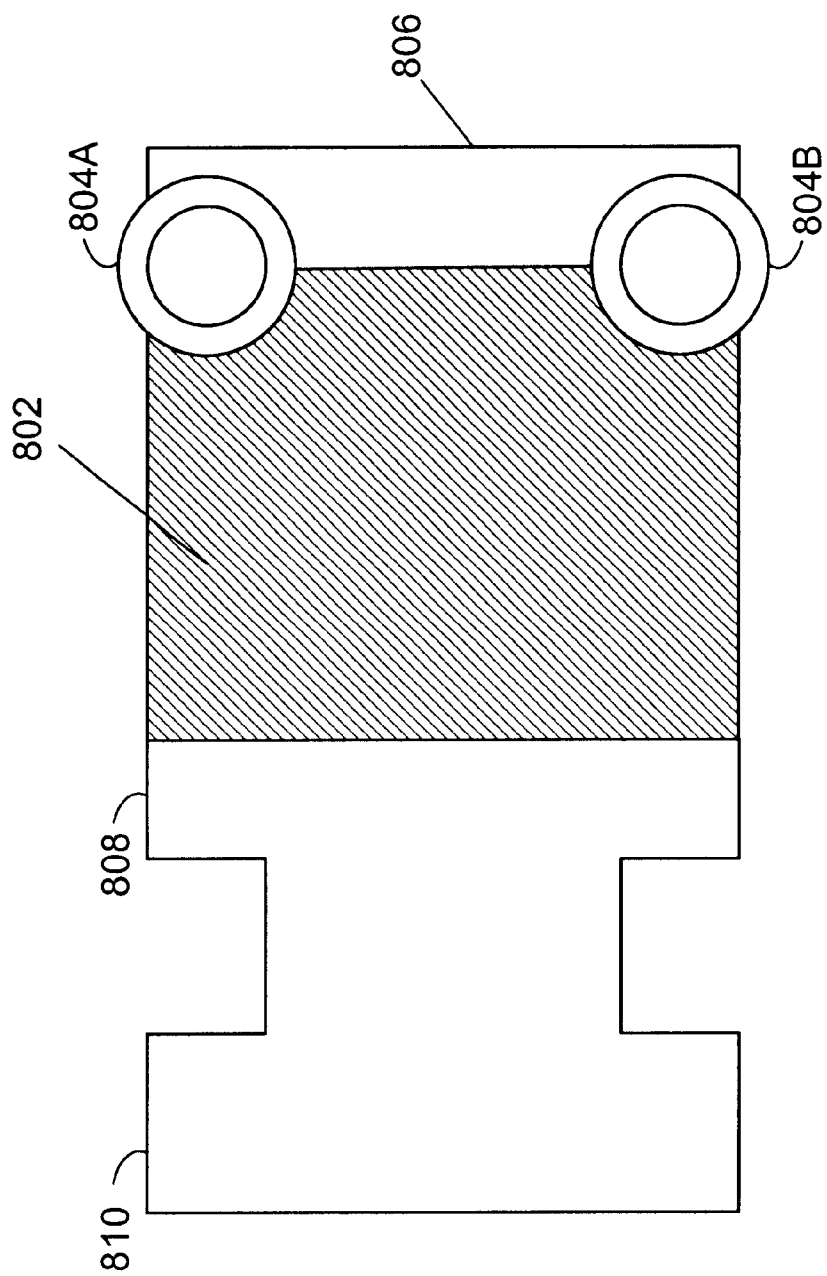

The template illustrated in FIG. 8A has been explained previously. In FIGS. 8B–8C, as in FIG. 8A, the top capacitor plate is cross-hatched and identified with numeral 802; the bottom plate is black and identified with numeral 808; the first port, identified with numeral 810, is integral with and on the same level as the bottom plate 808; the second port, identified with numeral 806, is also on the same layer as the bottom plate and is connected to the top plate through vias 804a and 804b. This template may be implemented on either of the substrates illustrated in FIGS. 7A and 7B in like manner to the template of FIG. 8A.

FIGS. 8D, 8E, and 8I–8M are examples of templates of single layer inductors having first ports, identified with numeral 812, second ports, identified with numeral 814, and an inductor body, identified with numeral 816. These templates may be implemented on the substrate of FIG. 7A by forming a trace in the form of these templates on the lower surface of the microvia layer 704. Similarly, these templates may be implemented on the substrate of FIG. 7B by forming a trace in the form of these templates of the lower surface of a piece of substrate material, and then connecting, e.g., through soldering or the like, the first and second ports thereof to corresponding pads on the upper surface 710 of the substrate.

Figure 8D:
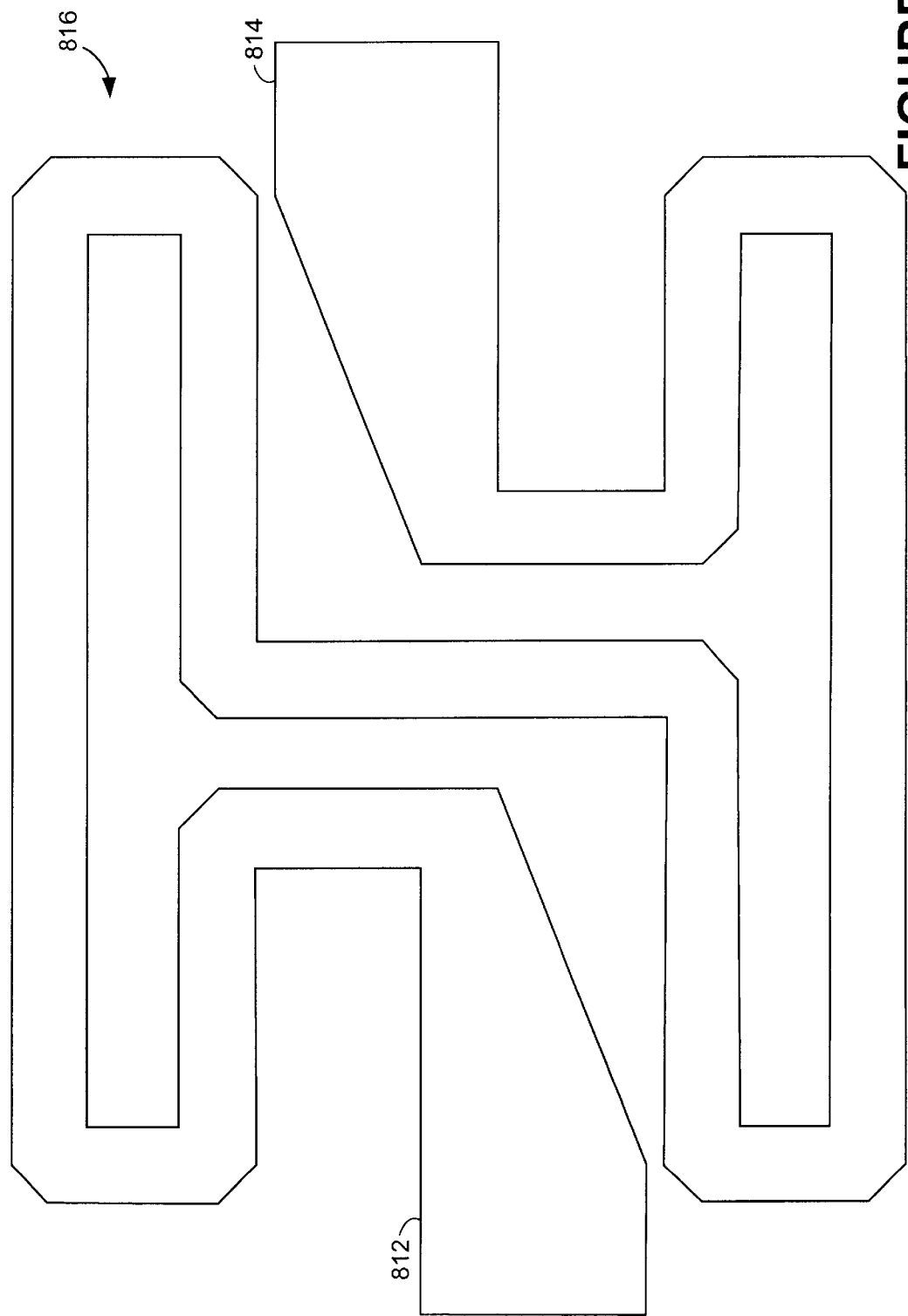
FIGS. 8D–8Q are examples of inductor templates.
Figure 8E:
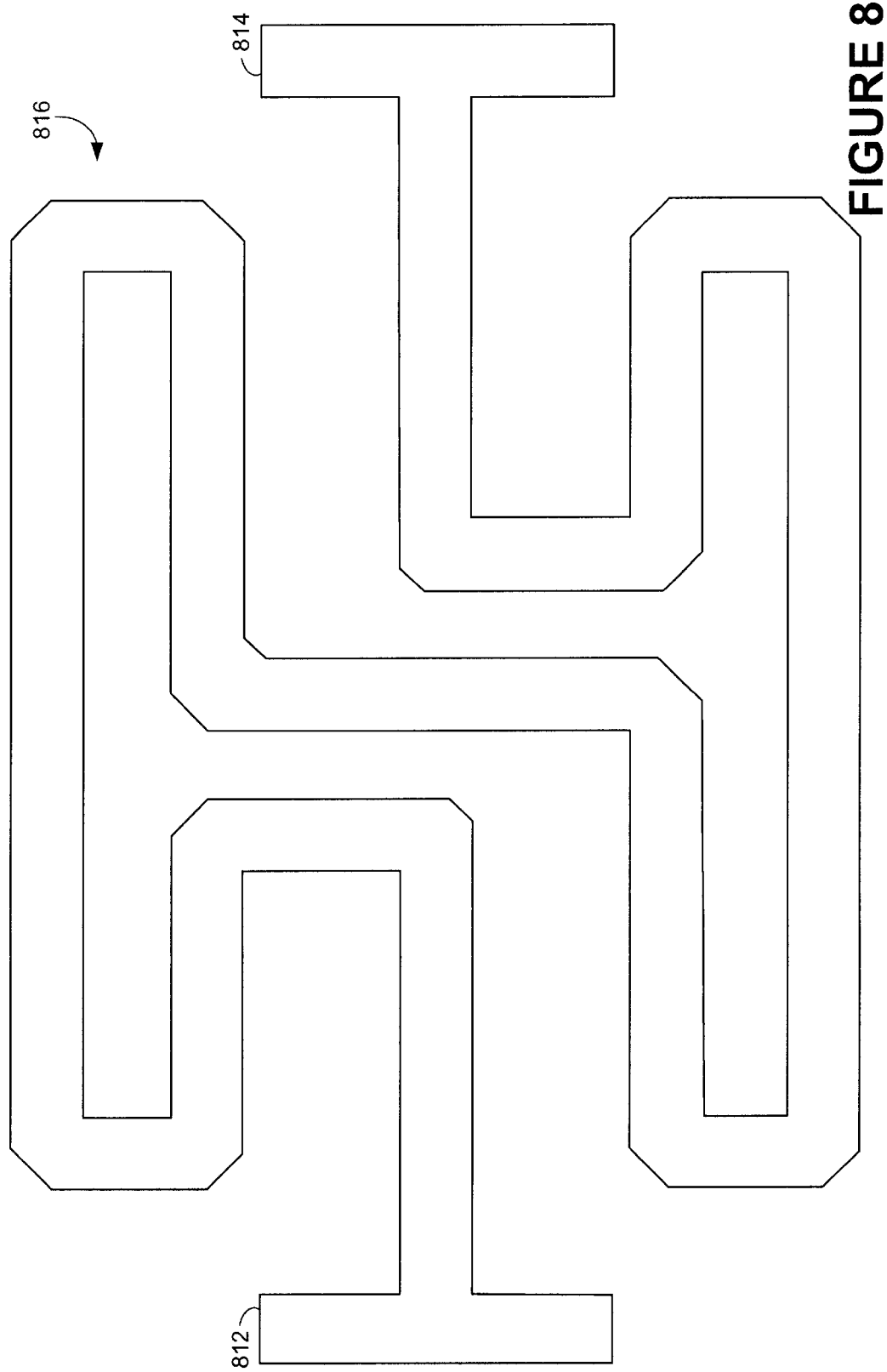
Figure 8F:
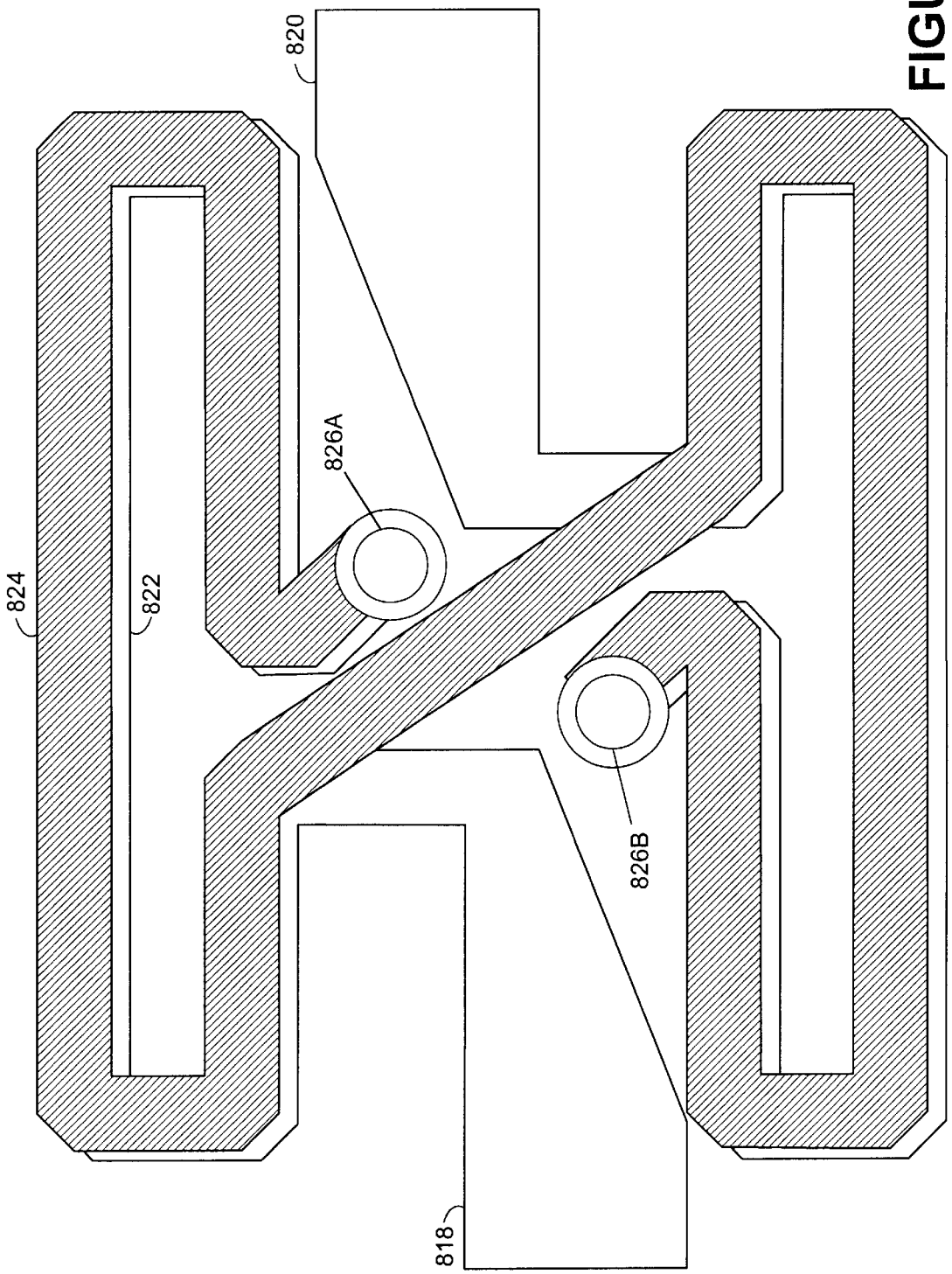
Figure 8G:
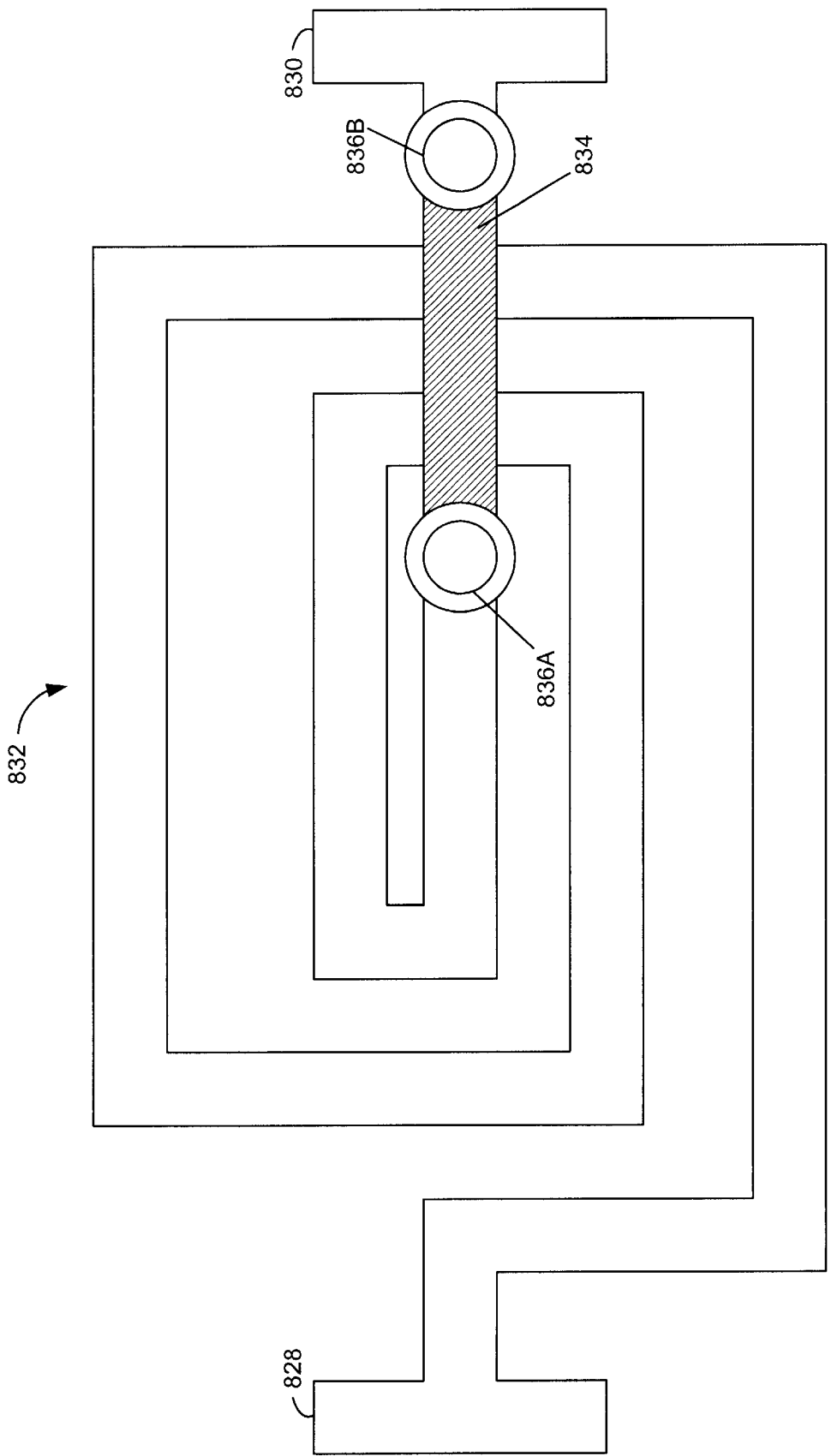
Figure 8H:
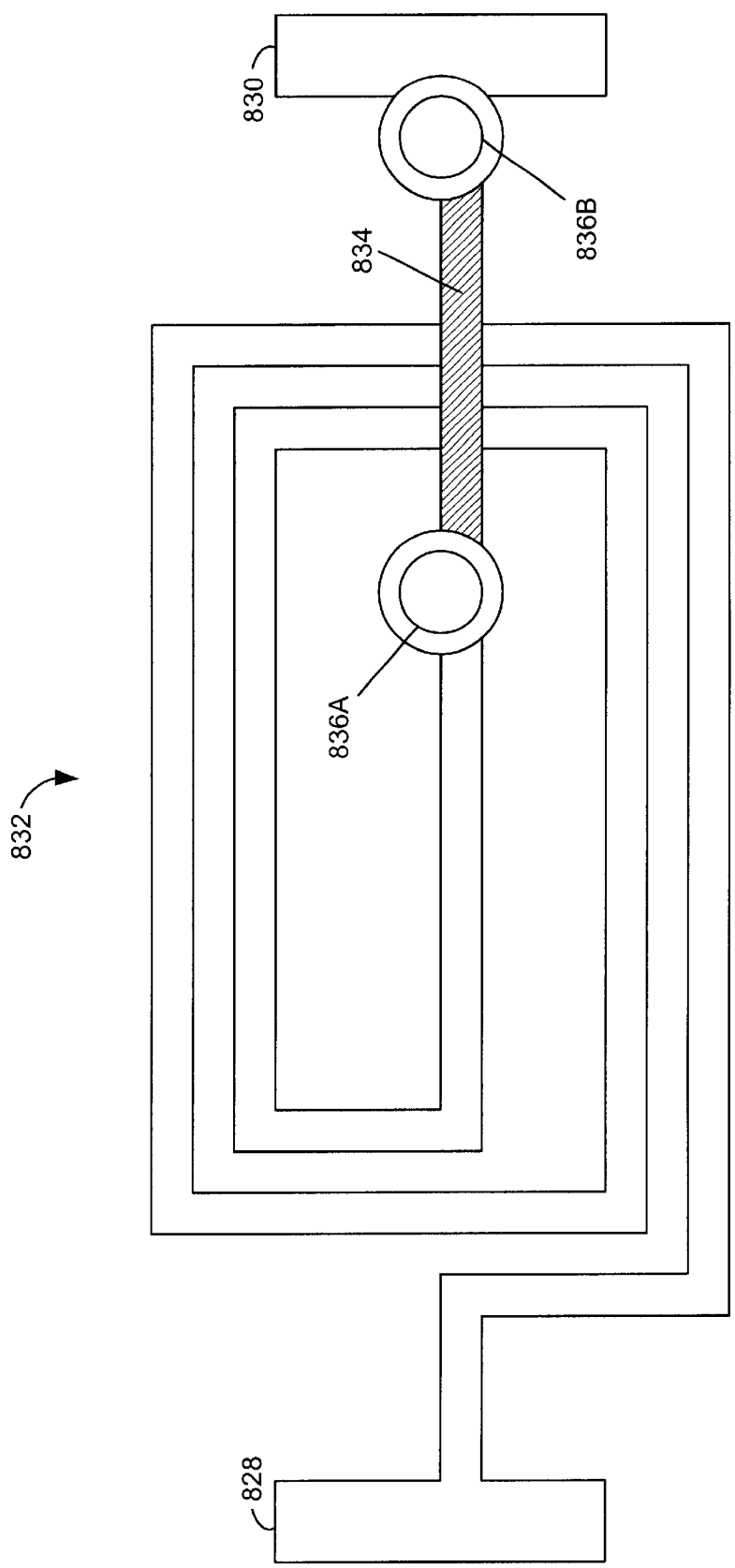
Figure 8I:
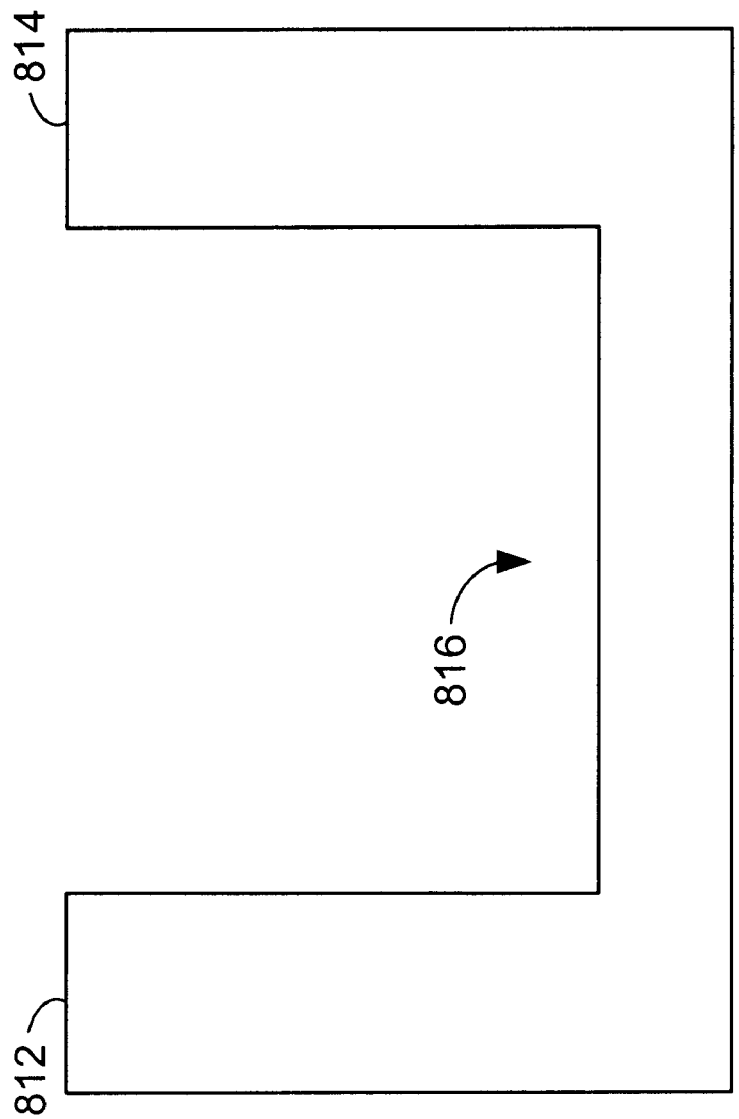
Figure 8J:
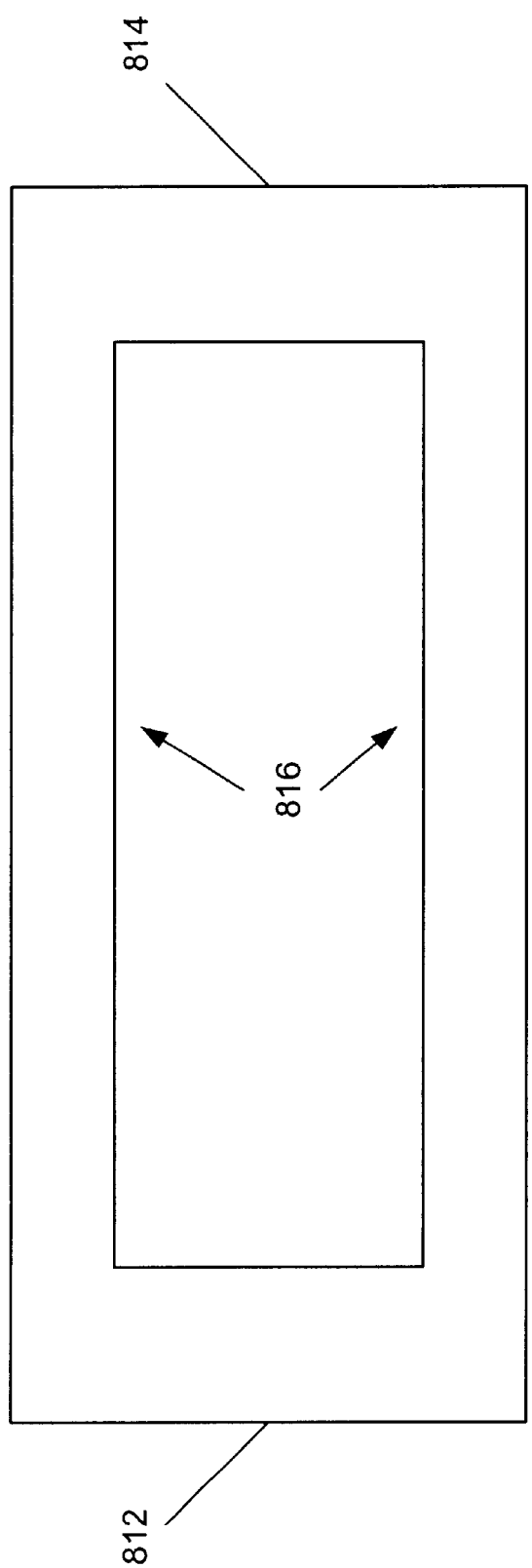
Figure 8K:
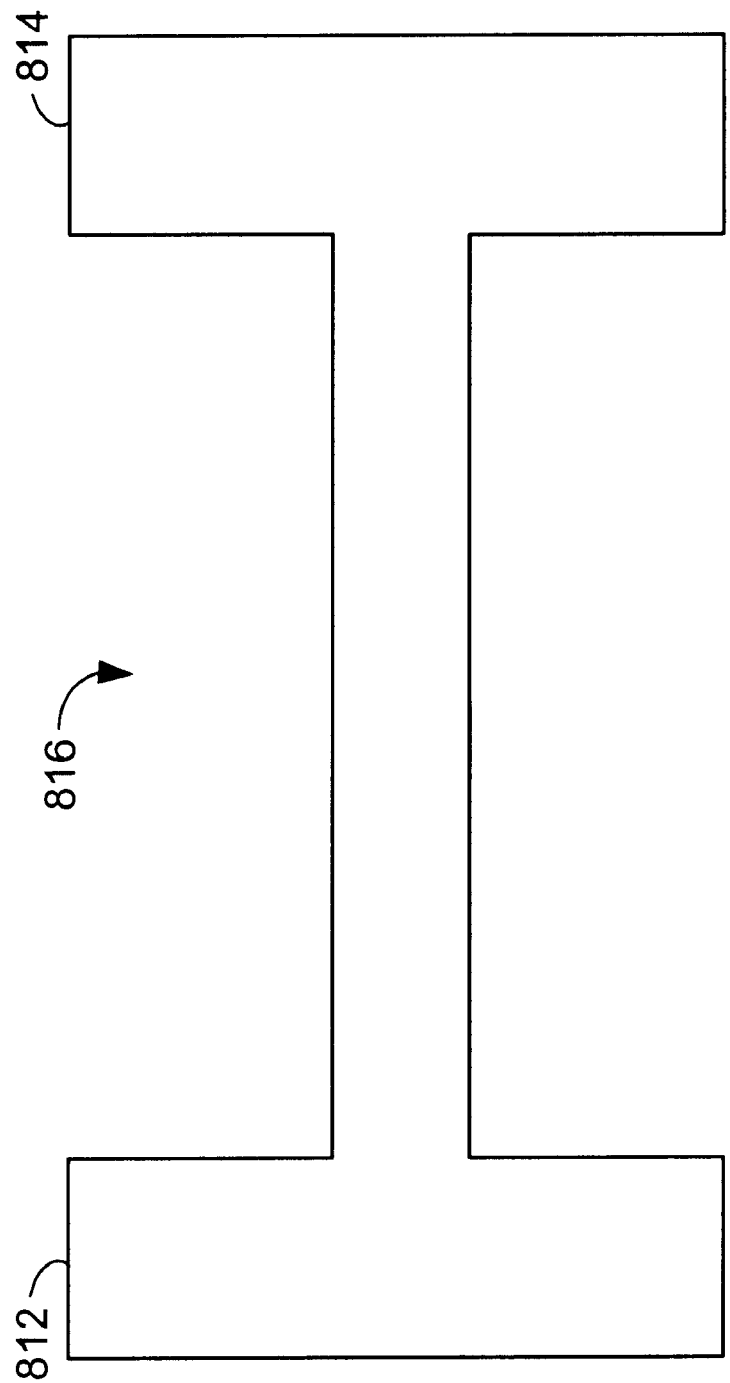
Figure 8L:
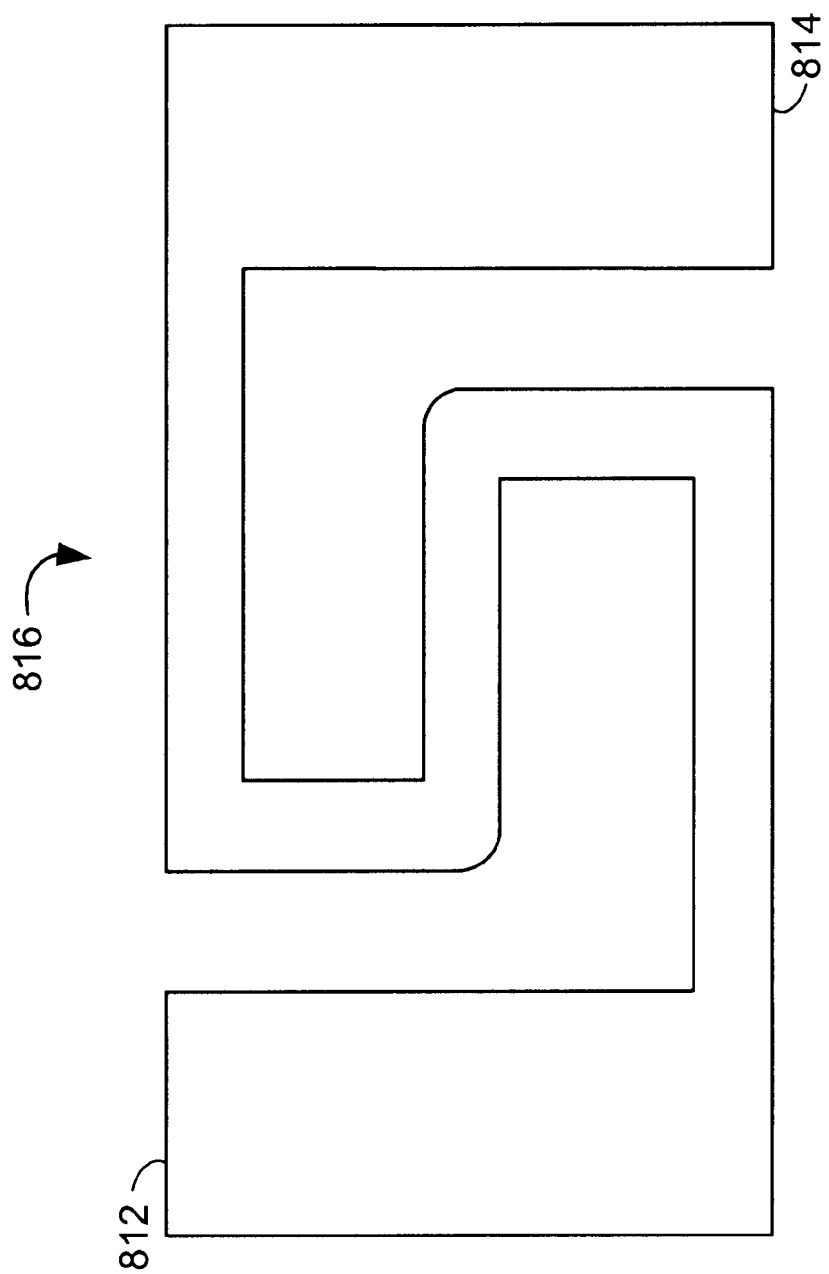
Figure 8N:
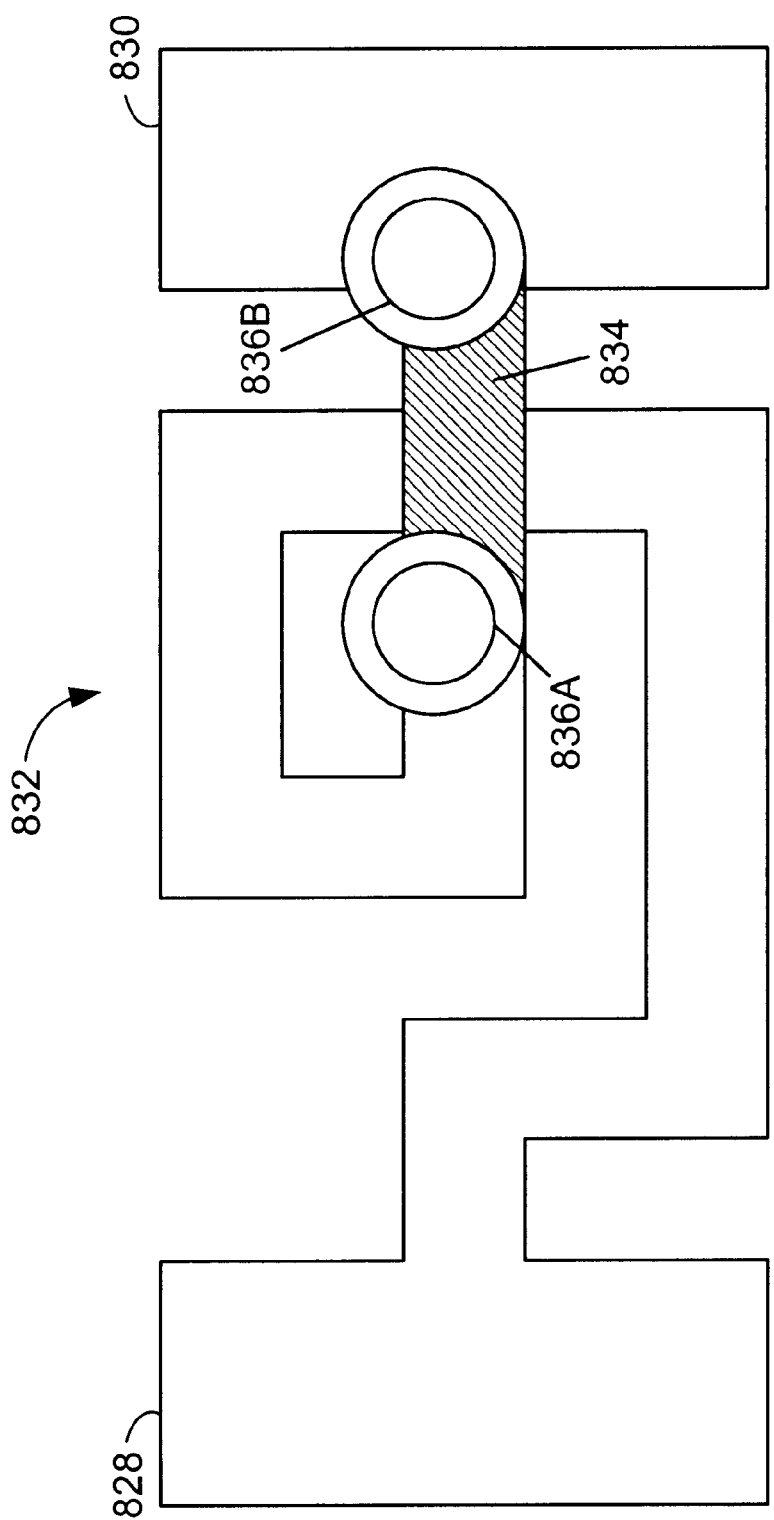

FIG. 8F is a template of a two-layer inductor in which the cross-hatched portion 824 is spaced above a corresponding black portion 822, but is connected to that portion 824 through vias 826a and 826b. In addition, first port 818 and second port 820 are integral with the lower portion 822 and appear on the same layer as it.

This template may implemented on the substrate of FIG. 7A by forming a trace in the shape of upper portion 824 on the upper surface of the microvia layer 704, forming traces in the shape of the lower portion 822, and first and second ports 818, 820, on the lower surface of the microvia layer 704, and then connecting these two portions together through two vias corresponding to vias 826a, 826b.

This template may be implemented on the substrate of FIG. 7B by forming a trace in the shape of upper portion 824 on the upper surface of a piece of substrate material, forming traces in the shape of the lower portion 822, and in the shape of the first and second ports 818, 820 on the lower surface of the piece of substrate, connecting the upper and lower portions 822 and 824 through vias corresponding to vias 826a and 826b, and then connecting, e.g., through soldering or the like, the first and second ports to corresponding pads on the upper surface 710 of the substrate.

FIGS. 8G–8H, 8N, and 8P are templates of two-layer inductors in which the cross-hatched portion 834 is spaced above a black portion 832, but is connected to the black portion 834 through via 836a. First port 828 is at the same level as portion 832, and is integral with it, while second port 830 is also at the same level as portion 832, and is connected to portion 834 through via 836b.

These templates may be implemented on the substrate of FIG. 7A by forming traces in the shape of lower portion 832 and first and second ports 828, 830 on the lower surface of the microvia layer 704, forming a trace in the shape of portion 834 on the upper surface of microvia layer 704, connecting the portions 832 and 834 through a via on the microvia layer 704 corresponding to via 836a, and connecting the portion 834 and second port 830 through a via 836b on the microvia layer 704.

These templates may implemented on the substrate of FIG. 7B by forming a trace in the shape of upper portion 834 on the upper surface of a piece of substrate material, forming traces in the shape of the lower portion 832 and first and second ports 828, 830 on the lower surface of the piece of substrate, connecting the portions 832 and 834 together through a via corresponding to via 836*a*, connecting portion 834 to second port 830 through a via corresponding to via 836*b*, and then connecting, e.g., through soldering or the like, the first and second ports to corresponding pads on the upper surface 710.

Figure 8O:
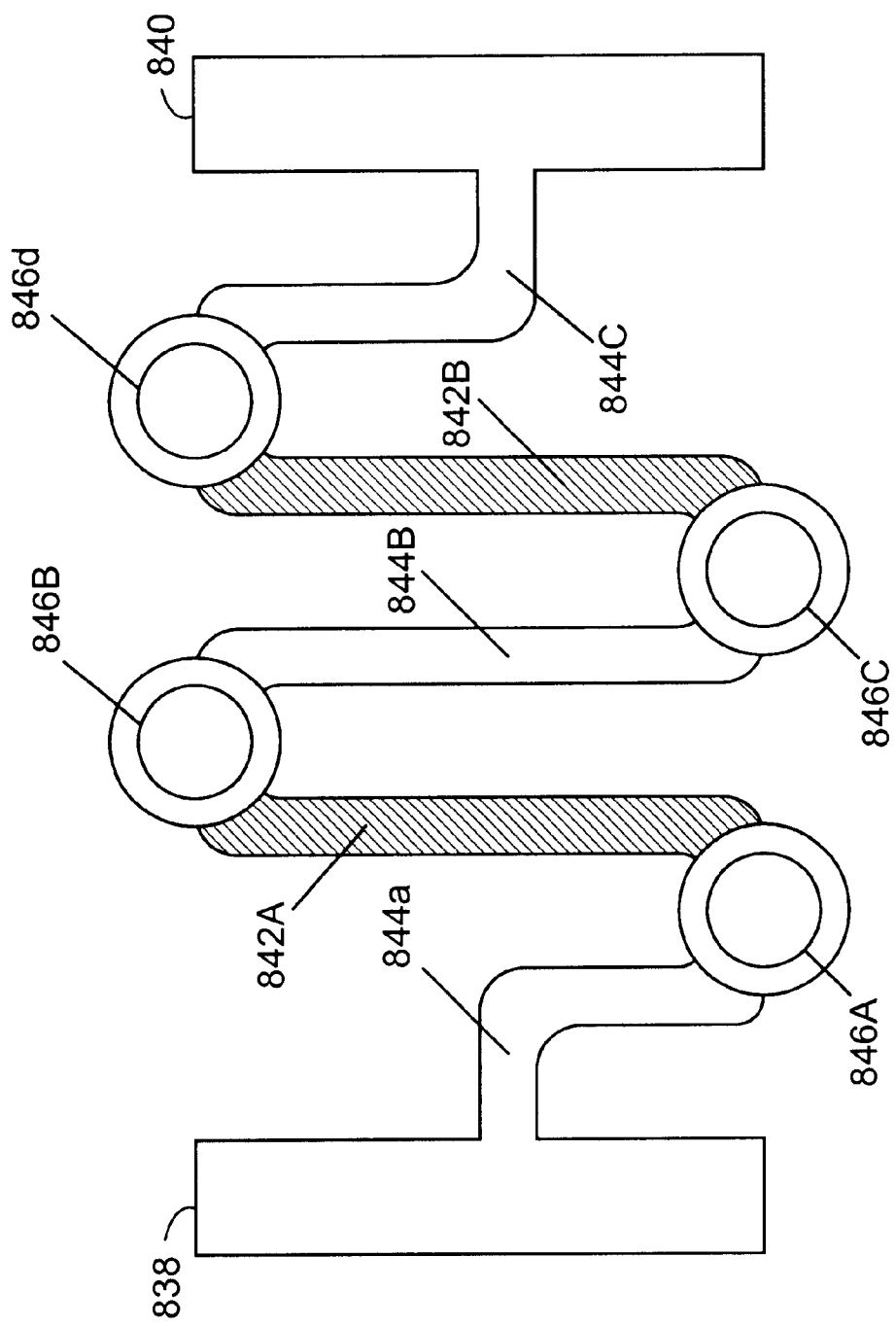
Figure 8P:
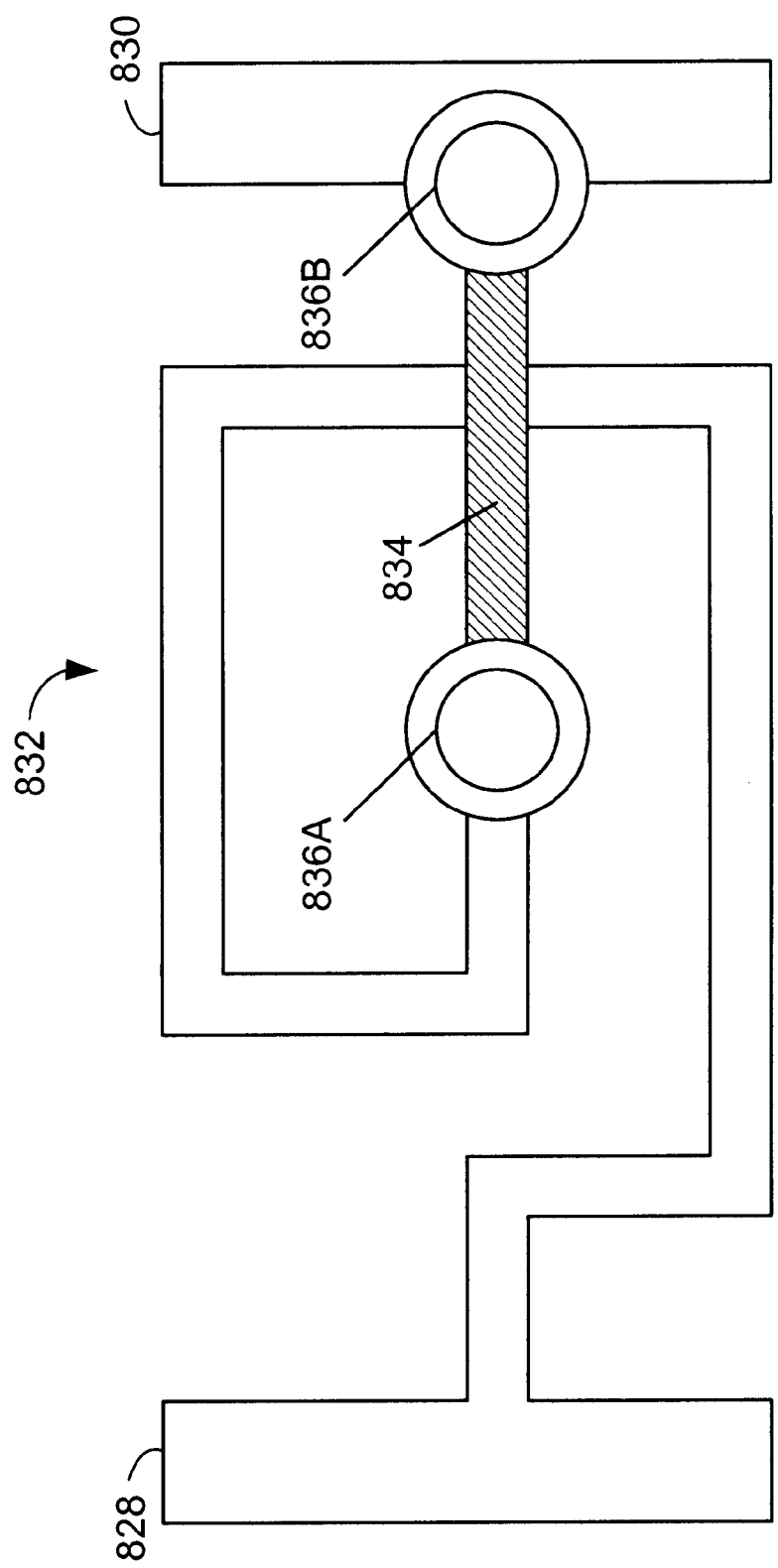
Figure 8Q:
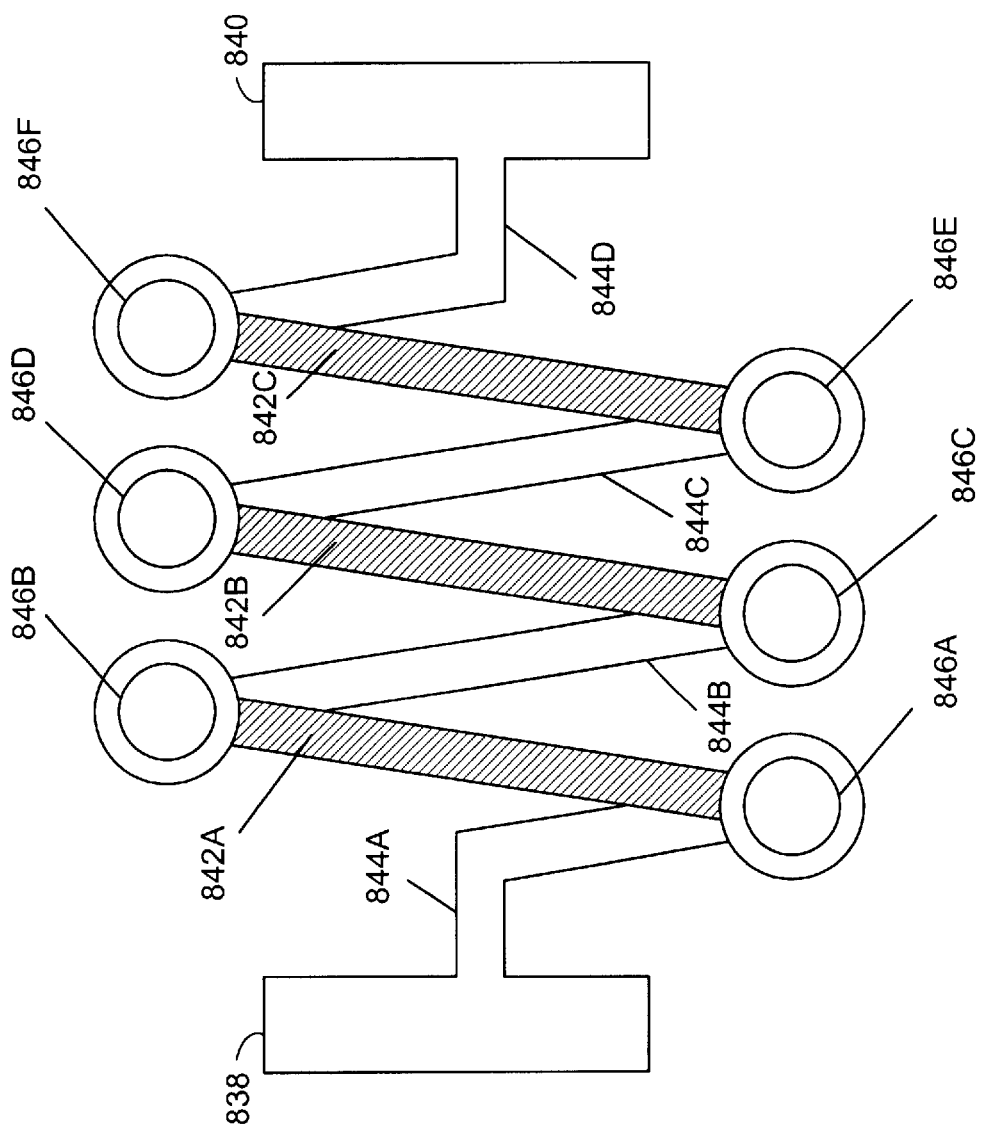

FIGS. 8Q and 8O are examples of templates of vertically coiled inductors. FIG. 8O is a template for a two coil inductor, and FIG. 8Q is a template for a three coil inductor. In both figures, the first and second ports, identified respectively with numerals 838 and 840, and sections 844*a*, 844*b*, 844*c*, and 844*d* are spaced below cross-hatched sections 842*a*, 842*b*, 842*c*. Section 844*a* is integral with the first port 838, and is connected to section 842*a* through via 846*a*; section 842*a* is connected to section 844*b* through via 846*b*; section 844*b* is connected to section 842*b* through via 846*c*; section 842*b* is connected to section 844*c* through via 846*d*; section 844*c* (in FIG. 8Q) is connected to section 842*c* through via 846*e* while section 844*c* (in FIG. 8O) is integral with second port 840; section 842*c* (in FIG. 8Q only) is connected to section 844*d* through via 846*f*; and section 844*d* (in FIG. 8Q only) is integral with second port 844*d*.

These templates may be implemented on the substrate of FIG. 7A by forming traces in the shape of portions 844*a*, 844*b*, 844*c*, and 844*d* (for FIG. 8Q only) and first and second ports 838, 840 on the lower surface of the microvia layer 704, forming a trace in the shape of portions 842*a*, 842*b*, 842*c* (for FIG. 8Q only) on the upper surface of microvia layer 704, and connecting these portions together with vias corresponding to vias 846*a*, 846*b*, 846*c*, 846*d*, 846*e*, and 846*f* (FIG. 8Q only).

These templates may be implemented on the substrate of FIG. 7B by forming traces in the shape of portions 844*a*, 844*b*, 844*c*, and 844*d* (for FIG. 8Q only) and first and second ports 838, 840 on the lower surface of a piece of substrate material, forming a trace in the shape of portions 842*a*, 842*b*, 842*c* (for FIG. 8Q only) on the upper surface of the piece of substrate material, connecting the portions together with vias corresponding to vias 846*a*, 846*b*, 846*c*, 846*d*, 846*e*, and 846*f* (FIG. 8Q only), and then connecting, through soldering or other means, the first and second ports to corresponding pads on the upper surface 710.

Referring back to FIG. 5, to ensure that the implementations are interchangeable, in steps 508 and 516, models of each of the implementations are derived, and then, in step 520, one or more model characteristics are compared over a desired frequency range. Examples of the models which may be derived include, without limitation, EM simulation models, parameterized models, lumped element equivalent circuit models, or any combination of the foregoing. One-, two-port, or multi-port models are possible. Moreover, parameterized models in terms of scattering (S), admittance (Y), impedance (Z), hybrid (h), chain (ABCD), or other parameters are also possible. The models should be sufficient to accurately represent the behavior of the corresponding implementations over a desired frequency range, e.g., 0.5 GHz to 5.0 GHz in increments of 0.5 GHz. Again, many other examples are possible, so these examples should not be taken as limiting.

Examples of the model characteristics which may be compared include, without limitation, susceptance (imaginary part of one of the Y parameters), reactance (imaginary part of one of the Z parameters), conductance (real part of one of the Y parameters), resistance (real part of one of the Z parameters), absolute value of any of the Y, Z, S, h, or ABCD parameters, phase of any of the Y, Z, S, h, or ABCD parameters, or any of the foregoing parameters divided or multiplied by frequency f or angular frequency ω, where ω=2πf.

In decision block 522, a determination is made whether the degree of similarity of the one or more model characteristics is sufficiently similar to warrant a conclusion that there is a match. If not, as indicated by the branch from block 522 to step 524 and then back to step 520, adjustments may then be made to one or both of the implementations (and possibly the corresponding models), until the one or more model characteristics match over the desired frequency range.

In one embodiment, primary characteristics of the models are compared, and adjustments made to one or both of the implementations until the primary characteristics very nearly match exactly over the desired frequency range. A "primary" characteristic is one which bears a relationship, whether direct, inverse, proportional, functional or otherwise, to the value of the circuit element being modeled and possibly other parameters such as frequency. For a capacitor or inductor, examples of primary characteristics include the imaginary part of $Y_{21}$ or $Y_B$, the imaginary part of $Z_{21}$ or $Z_B$, or any of these parameters multiplied by or divided by frequency, since they bear a relationship to the value of the respective circuit element, i.e., capacitance of capacitor or inductance of inductor. For a resistor, examples of primary characteristics include the real part of $Y_{21}$ or $Y_B$, or the real part of $Z_{21}$ or $Z_B$, since they bear a relationship to the resistance of the resistor.

One or more secondary characteristics may then be compared, typically after the effects of the primary characteristic has been removed, and additional adjustments made to one or both of the implementations until one or both of these characteristics match. Sequential optimization is also possible, where, after the effects of the primary characteristic has been removed, the type and number of parasitics needed to account for the residual behavior of the circuit element are sequentially determined over different segments of the frequency spectrum. Additional adjustments may be needed to obtain matches between each of these sets of parasitics. Generally speaking, a "secondary" characteristic is one which bears a relationship, whether direct, inverse, proportional, functional or otherwise, to the value of a parasitic circuit element in the model and possibly other parameters such as frequency. Moreover, as a general rule, the degree of match between the secondary characteristics need not be as exact as with the primary characteristic. For a parasitic capacitor or inductor, examples of secondary characteristics include the imaginary part of $Y_{11}$, $Y_{22}$, $Y_A$, or $Y_C$, the imaginary part of $Z_{11}$, $Z_{22}$, $Z_A$, or $Z_C$, or any of these parameters multiplied or divided by frequency. For a parasitic resistance, examples of secondary characteristics include the real part of $Y_{11}$, $Y_{22}$, $Y_A$, or $Y_C$, or the real part of $Z_{11}$, $Z_{22}$, $Z_A$, or $Z_C$.

If the one or more characteristics are sufficiently similar to warrant a conclusion that there is a match, the process may conclude since two interchangeable implementations of the same one or more circuit elements have been produced in first and second domains.

In the case in which the first and second domains are prototype and production domains, and the implementation in the prototype domain is a surface mounted implementation, and that for the production domain is an integrated implementation, the integrated implementation can be substituted for the surface mounted implementation during the production phase of design with little or no risk that the change will introduce unanticipated parasitics or otherwise impair the operation of the circuit. The reason is that the two implementations have already been shown to be interchangeable, e.g., through modeling or some other mechanism.

The two implementations, as well as the corresponding models, model characteristics, and parameters (physical and/or electrical) may be tangibly embodied in a variety of forms, e.g., on human readable or audible media such as paper, on processor readable media such as disk, or (in the case of the implementations) as physical circuitry. In addition, the process itself may be tangibly embodied on a processor readable medium, e.g., as a series of computer executable instructions embodying the process stored on a processor readable medium. The process may also be tangibly embodied in the form of a computer program product, e.g., computer program, code or code module which, upon execution by a process, performs the process.

Figure 6:
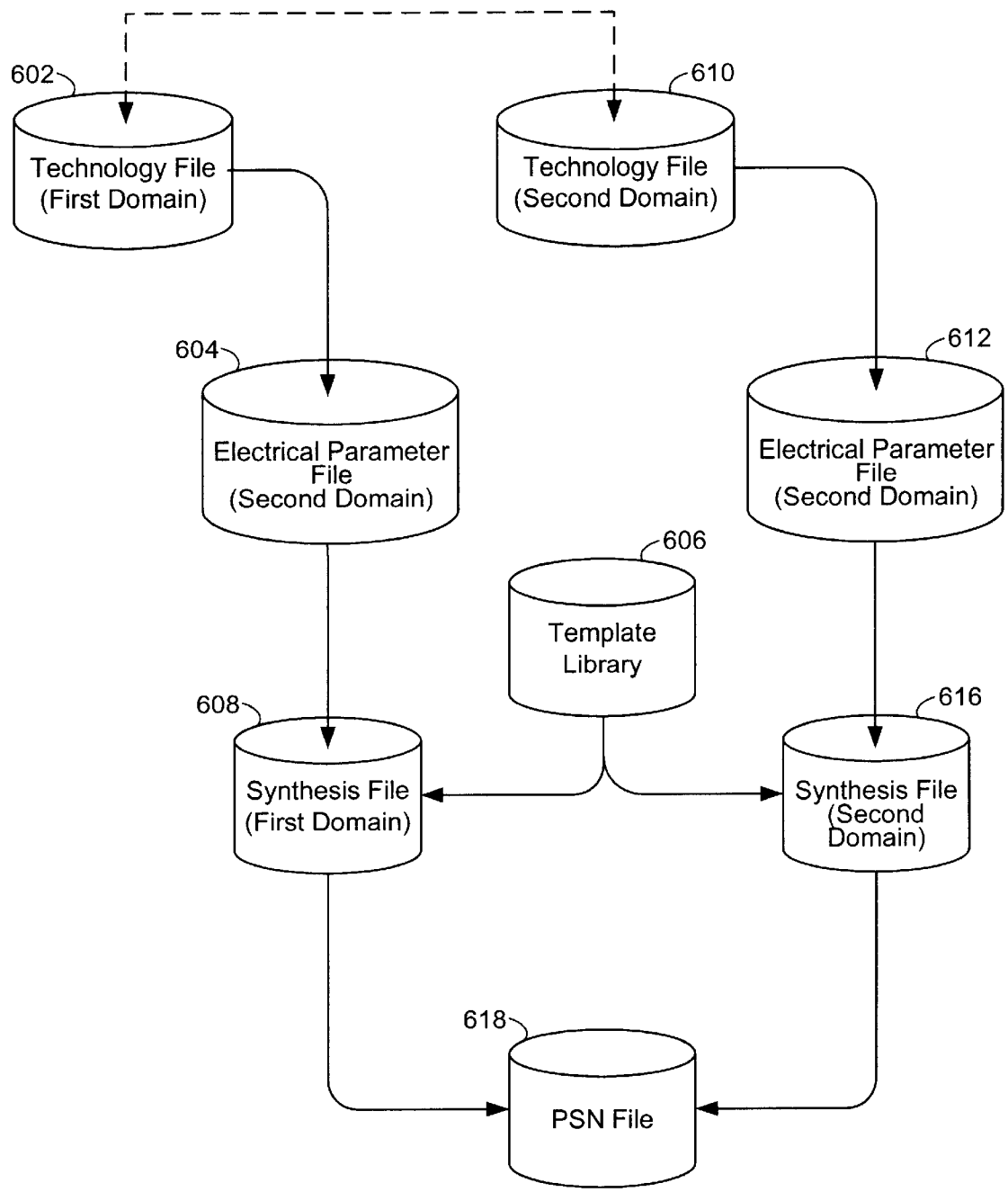
FIG. 6 is a data flow diagram illustrating data files and data flows in one configuration in accordance with the invention.

FIG. 6 illustrates the data flows and data files in one configuration according to the invention. As illustrated, in this configuration, the one or more physical parameters for the first domain may be provided by a user in the form of a Technology File, identified with numeral 602, and the one or more physical parameters for the second domain may also be provided by a user in the form of a Technology File, identified with numeral 610.

In this particular configuration, it is desirable that the substrates described by the physical parameters be such that implementations of a particular circuit element on the two substrates will physically resemble one another. (Such a correspondence between the physical parameters is denoted by the dotted line between the two files 602 and 610 in FIG. 6.) For example, consider the two substrates illustrated in FIGS. 7A and 7B. Although they look dissimilar, the implementation of a particular capacitor on the substrate of FIG. 7A, which implementation is illustrated in FIG. 7C, physically resembles the implementation of that same capacitor on the substrate of FIG. 7B, which implementation is illustrated in FIG. 7D. This similarly is beneficial because, it means the two implementations to be made interchangeable with only minor modifications to the features of the underlying template.

Once they have been derived, the one or more electrical parameters for the first domain may be stored in an Electrical Parameter file, identified with numeral 604, and the one or more electrical parameters for the second domain may also be stored in an Electrical Parameter file, identified with numeral 612.

In this particular configuration illustrated in FIG. 6, a library of templates may be made available in the form of a Template Library File, identified with numeral 606. FIGS. 8A–8D illustrate examples of capacitor templates such as may be embodied in the Template Library File, and FIGS. 8E–8Q illustrate examples of inductor templates such as may be embodied in the Template Library File.

Once derived, the implementation of the one or more circuit elements in the first domain, as well as the corresponding models and model characteristics, may be stored in a first Synthesis File, identified with numeral 608, and the implementation of the one or more circuit elements in the second domain, as well as the corresponding models and model characteristics, may be stored in a second Synthesis File, identified with numeral 614.

Also, a nominal parameter representative of each circuit element, and linked to one or more of the implementations, models, model characteristics, physical parameters, and electrical parameters in each domain, may be derived and stored in a parameterized sub-network (PSN) file, identified with numeral 616. The nominal parameter for a circuit element may be a shorthand representation of the circuit element which, for example, has meaning to a circuit designer. The links correlating this parameter with the implementations, corresponding models and model characteristics, physical parameters, and electrical parameters in the first and second domains allow this more detailed information to be retrieved if needed, e.g., for the purpose of analyzing the impact of changes in technology, frequency, parameters, and the like, and whether a conclusion is still warranted that the implementations are interchangeable in light of these changes. (For this purpose, it is desirable to have a system where changes in technology, frequency, parameters, and the like, automatically ripple through into corresponding changes to the implementations, models, and model characteristics). For a resistor, the nominal parameter may simply be the resistance of the resistor; for an inductor, the inductance of the inductor; and for a capacitor, the capacitance of the capacitor. Again, the configuration illustrated in FIG. 6 is only one of many possible examples, so this particular configuration should not be construed as limiting.

EXAMPLE

An example of the foregoing process will now be described in relation to the three capacitor templates of FIGS. 8A, 8B, and 8C. Since many other examples are possible, this example should not be construed as limiting. In this example, each template is mapped into a corresponding prototype domain implementation in which a surface mounted embodiment of the component is mounted on the upper surface of the substrate of FIG. 7B, and is also mapped into a corresponding production domain implementation in which the component is integrated into the upper layer 704 of the substrate of FIG. 7A. Then, for each template, models are derived for each of the two implementations, and model characteristics compared to ensure that the two implementations are interchangeable. The following describes in detail the modeling procedure which is followed for each of the implementations of each template:

A two-port model of the implementation is derived through EM simulation. Through this simulation, the S parameters of the implementation are derived over a desired frequency range, e.g., 0.5 GHz to 5.0 GHz in 0.5 GHz increments. These parameters are stored in a file, generically referred to as file_name, which is used to generate one- and two-port EM simulation models.

Figure 9A:
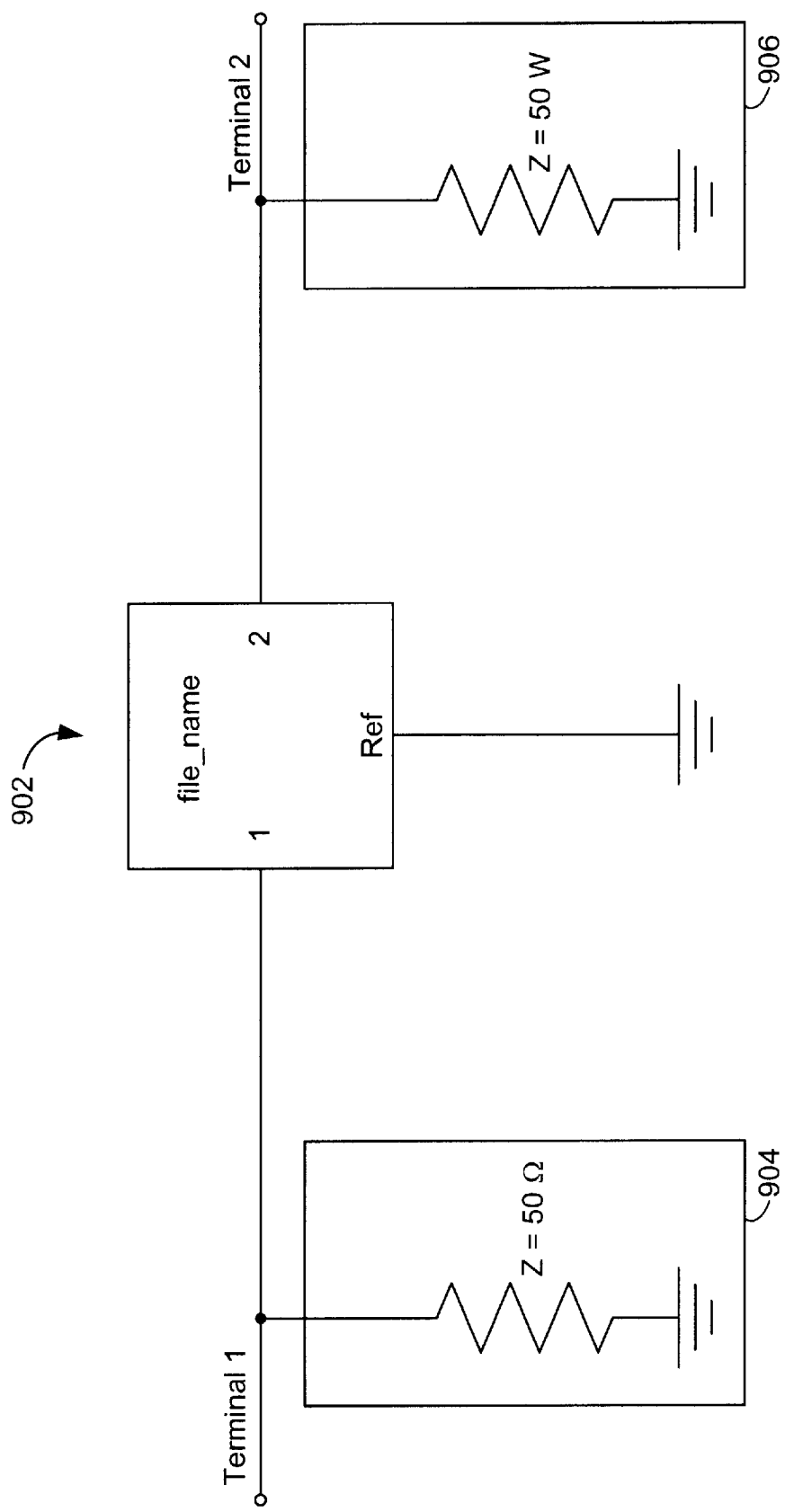
FIG. 9A is a schematic of a two-port circuit model characterized by parameters produced through EM simulation.

FIG. 9A illustrates a representation of a two-port EM simulation model. As shown, the first and second ports, labeled respectively as "Terminal 1" and "Terminal 2", are each connected to a "black box", identified with numeral 902, which is associated with the file, file_name, containing the S parameters derived through EM simulation. Numerals 904 and 906 identify 50 Ω normalization impedances associated with Terminals 1 and 2 solely for purposes of determining the S parameters. These impedances are removed for the purpose of computing other parameters such as Y parameters.

Figure 9B:
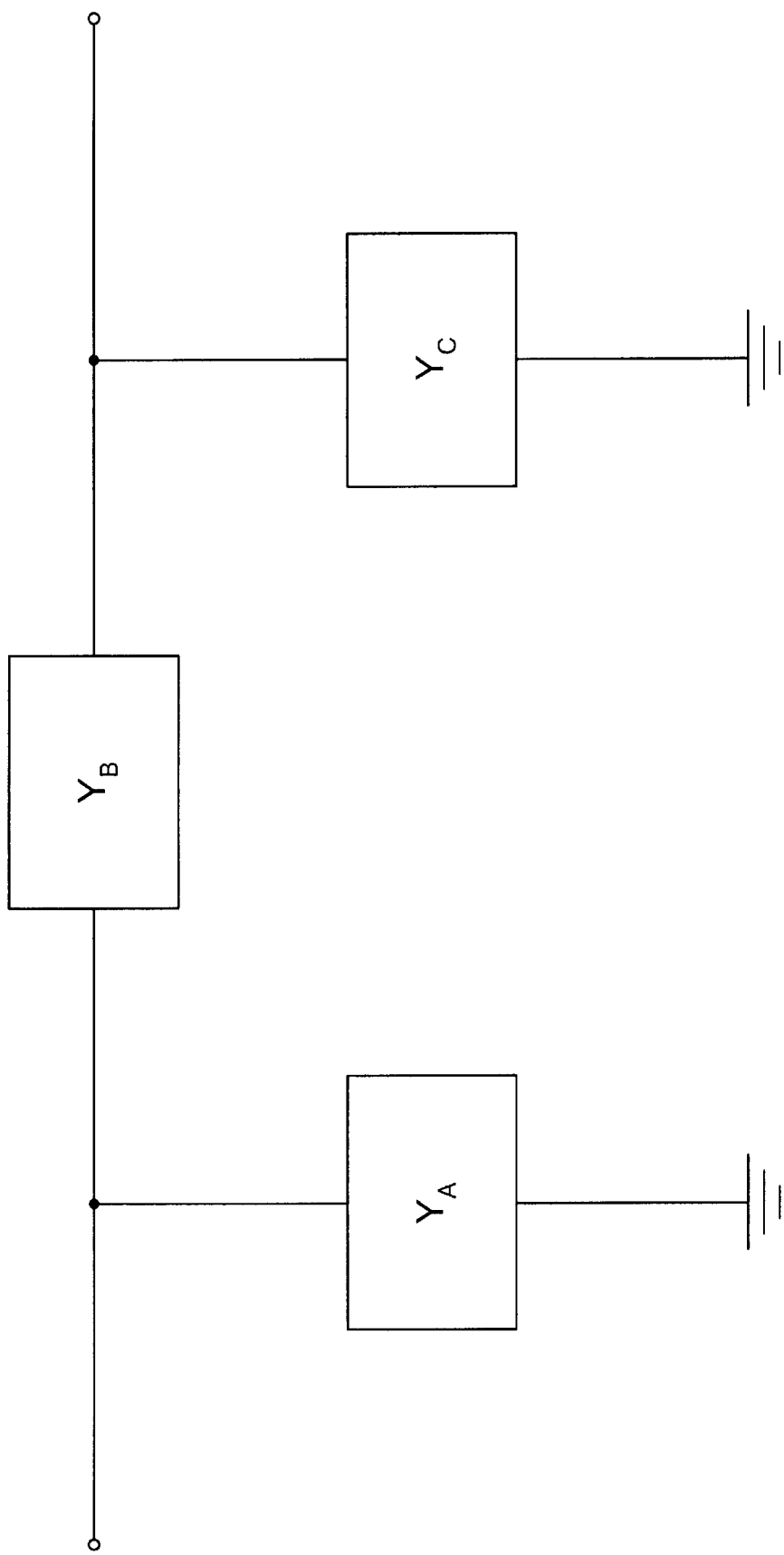
FIG. 9B is a schematic of a two-port circuit model characterized by admittance (Y) parameters.

Next, Y parameters are derived from the S parameters, and the model restated in terms of Y parameters. FIG. 9B illustrates the model of FIG. 9A restated in terms of the $Y_A$, $Y_B$, and $Y_C$ parameters. (An equivalent model is also possible in terms of the $Y_{11}$, $Y_{21}$, $Y_{12}$, and $Y_{22}$ parameters.)

Figure 9C:
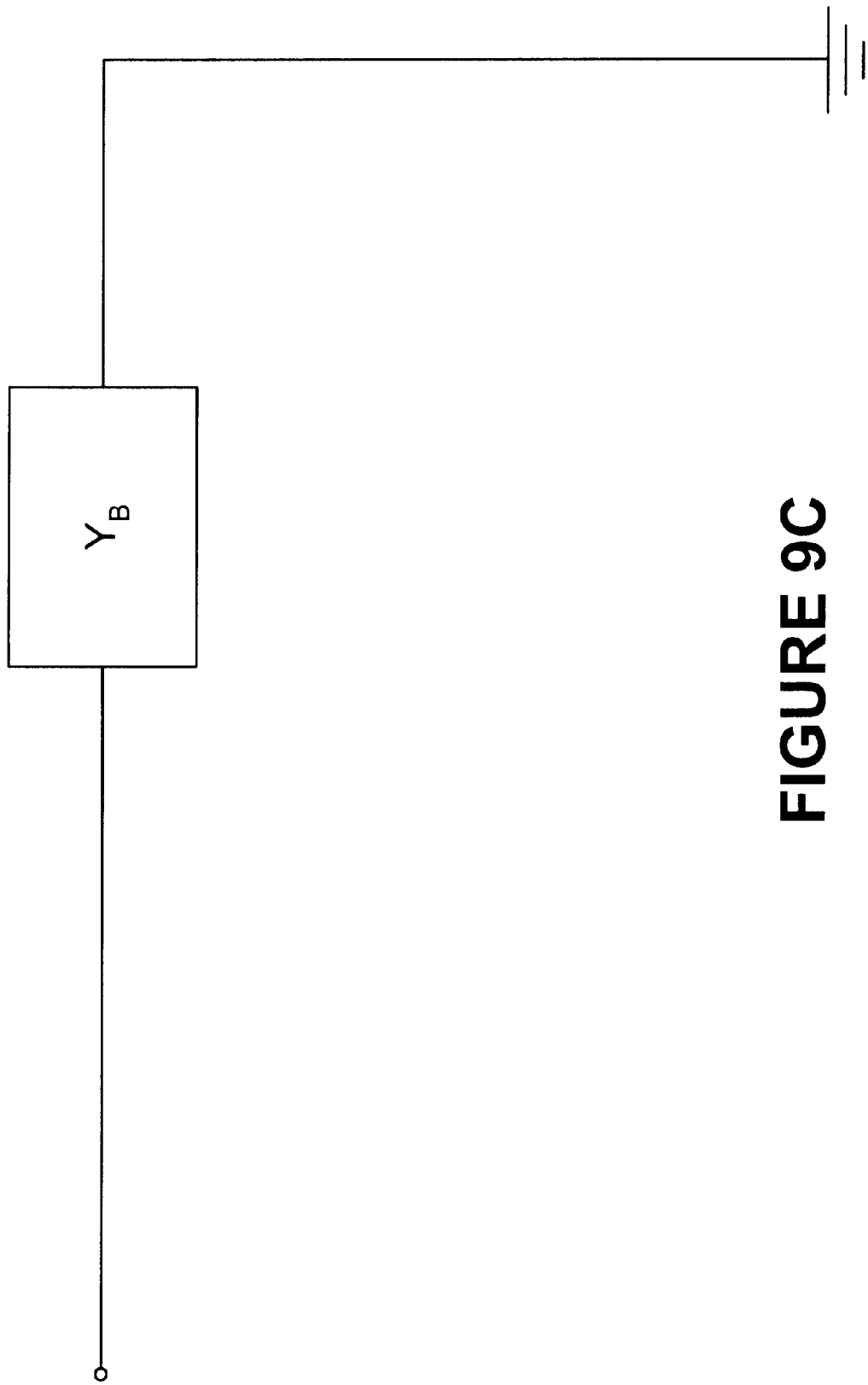
FIG. 9C is a schematic of a single port circuit model characterized by a single admittance ($Y_B$) parameter.

A one-port model is then derived by examination of $Y_B$, and ignoring the effects of the substrate (which amounts to ignoring $Y_A$ and $Y_C$). A representation of the resulting model is illustrated in FIG. 9C. As can be seen, the only Y parameter which is needed to characterize this model is $Y_B$ (which equals—$Y_{21}$).

Figure 9D:
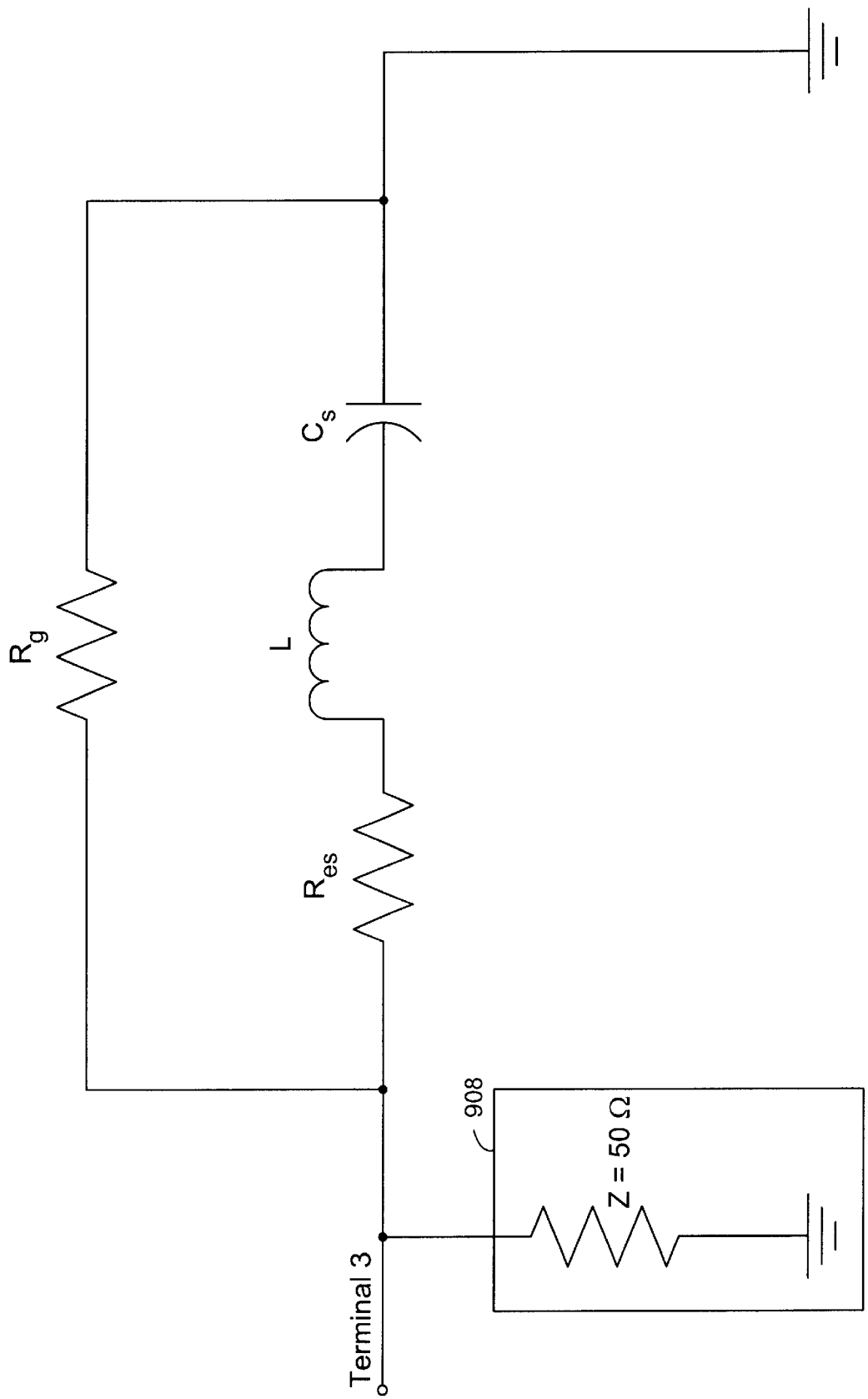
FIG. 9D is a schematic of a single port lumped element circuit model corresponding to the model of FIG. 9C.

An equivalent lumped element model for the implementation is then derived from the model of FIG. 9C. A representation of this lumped element model, which is appropriate for each implementation of each of the capacitor templates of FIGS. 8A, 8B, and 8C, is illustrated in FIG. 9D. As shown, the lumped element model comprises the parallel combination of the resistor $R_g$ with the series combination of $R_{es}$, L, and $C_s$. This lumped element model will be referred to below as the "first lumped element model". (Numeral 908 identifies a 50 Ω normalization impedance associated with Terminal 3 solely for purposes of determining S parameters. This impedance is removed for the purpose of computing other parameters such as Y parameters.)

Figure 9E:
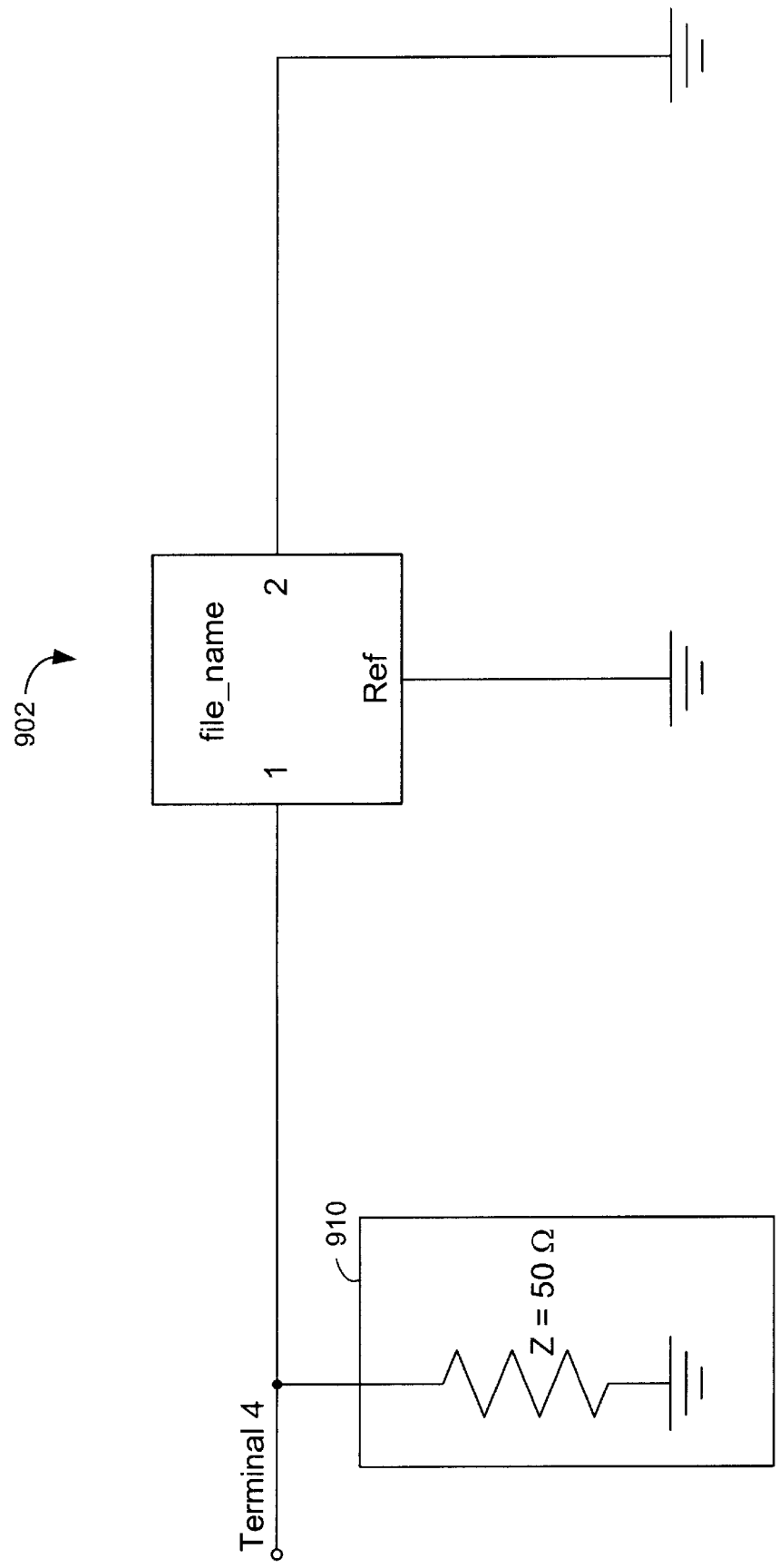
FIG. 9E is a schematic of single port circuit model characterized by parameters produced through EM simulation.

A more complicated one-port model is then derived from the model of FIG. 9A by grounding Terminal 2, while still retaining some of the effects of the substrate (by retaining $Y_A$ but shorting out $Y_C$). A representation of the resulting one-port model is illustrated in FIG. 9E. In this representation, the first port is renamed "Terminal 4" to avoid confusion with the other models. Note that the core portion of the mode, block 902, is still characterized by file-name, the same file (containing S parameters) used to characterize the box 902 in FIG. 9A. (Numeral 910 identifies a 50 Ω normalization impedance associated with Terminal 4 solely for purposes of determining S parameters. This impedance is removed for the purpose of computing other parameters such as Y parameters.)

This model is then restated in terms of Y parameters. A representation of this model is shown is FIG. 9F. As can be seen, this model, unlike that of FIG. 9C, includes the effects of the substrate inasmuch as the parameter $Y_A$ is included.

Figure 9F:
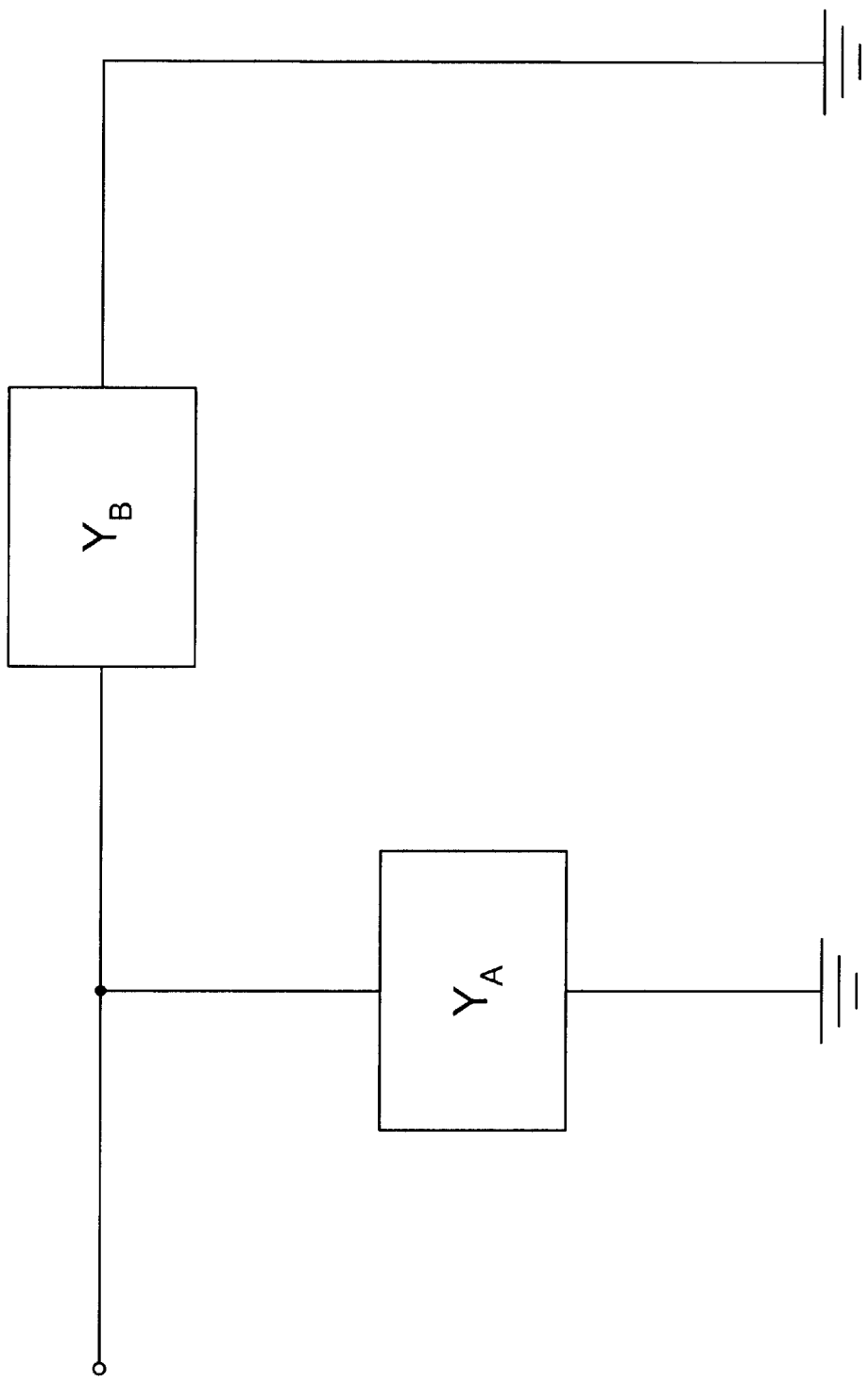
FIG. 9F is a schematic of a single port circuit model characterized by two admittance ($Y_A$ and $Y_B$) parameters.
Figure 9G:
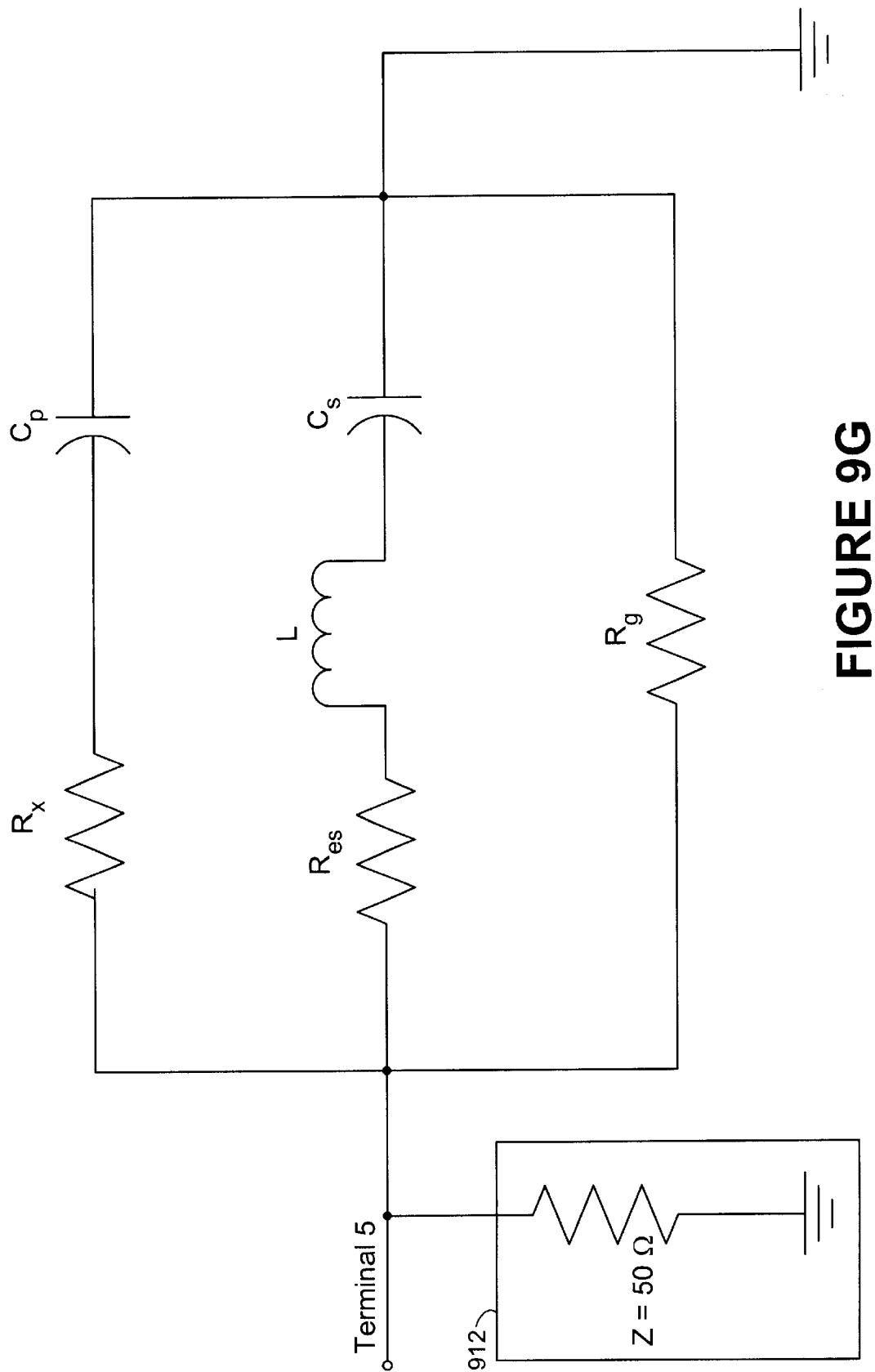
FIG. 9G is a schematic of a single port lumped element circuit model corresponding to the model of FIG. 9F.

An equivalent lumped element model is then derived from the model of FIG. 9F. A representation of this lumped element model, which is appropriate for each implementation of each of the capacitor templates of FIGS. 8A, 8B, and 8C, is illustrated in FIG. 9G. As shown, the lumped element model comprises the parallel combination of (a) the resistor $R_g$; (b) the series combination of $R_{es}$, L, and $C_s$; and (c) the series combination of $R_x$ and $C_p$. (Numeral 912 identifies a 50 Ω normalization impedance associated with Terminal 5 solely for purposes of determining S parameters. This impedance is removed for the purpose of computing other parameters such as Y parameters.)

The lumped element circuit parameters for each of the first and second models are provided in the following tables. For each model, the tables provide the circuit parameters for both the prototype and productions domain implementation of each of the capacitor templates of FIGS. 8A–8C.

| First Lumped Element Model-Prototype Domain Implementations | | | | |
|---|---|---|---|---|
| Parameter | $R_g$ | $R_{es}$ | L | $C_s$ |
| FIG. 8A Template | 47.7 kΩ | 1.55 Ω | 0.313 nH | 0.429 pF |
| FIG. 8B Template | 83.6 kΩ | 1.85 Ω | 0.335 nH | 0.204 pF |
| FIG. 8C Template | 6.6 kΩ | 0.936 Ω | 0.372 nH | 0.877 pF |

| First Lumped Element Model-Production Domain Implementations | | | | |
|---|---|---|---|---|
| Parameter | $R_g$ | $R_{es}$ | L | $C_s$ |
| FIG. 8A Template | 40 kΩ | 1.0 Ω | 0.425 nH | 0.43 pF |
| FIG. 8B Template | 47.7 kΩ | 1.71 Ω | 0.396 nH | 0.216 pF |
| FIG. 8C Template | 17.1 kΩ | 0.926 Ω | 0.466 nH | 0.927 pF |

| Second Lumped Element Model-Prototype Domain Implementations | | | | | |
|---|---|---|---|---|---|
| Parameter | $R_g$ | $R_{es}$ | L | $C_s$ | $R_x$ | $C_p$ |
| FIG. 8A Template | 47.7 kΩ | 1.55 Ω | 0.313 nH | 0.429 pF | 0.00445 Ω | 0.0976 pF |
| FIG. 8B Template | 83.6 kΩ | 1.85 Ω | 0.335 nH | 0.204 pF | 10.1 Ω | 0.082 pF |
| FIG. 8C Template | 6.6 kΩ | 0.936 Ω | 0.372 nH | 0.877 pF | 1.39 MΩ | 0.0324 pF |

| Second Lumped Element Model-Production Domain Implementations | | | | | |
|---|---|---|---|---|---|
| Parameter | $R_g$ | $R_{es}$ | L | $C_s$ | $R_x$ | C |
| FIG. 8A Template | 40 kΩ | 1.0 Ω | 0.425 nH | 0.43 pF | 0 Ω | 0.0125 pF |
| FIG. 8B Template | 47.7 kΩ | 1.709 Ω | 0.396 nH | 0.216 pF | 5.56 Ω | 0.0732 pF |
| FIG. 8C Template | 17.1 kΩ | 0.926 Ω | 0.466 nH | 0.927 pF | 88 Ω | 0.134 pF |

The lumped element models for each implementation of each template are then validated relative to the corresponding EM simulation models to ensure they accurately depict the operation of the implementation over the desired frequency range. In particular, the magnitude and phase of an S parameter for the second lumped element model, $S_{55}$, are compared with the magnitude and phase of the corresponding S parameter for the one-port EM simulation model, $S_{44}$. Similarly, the (inverted) real and imaginary portions of a Y parameter for the first lumped element model, $Y_{33}$, are compared with the (inverted) real and imaginary portions of the corresponding Y parameter for the two-port EM simulation model, $Y_{21}$. These comparisons are performed to ensure that the characteristics sufficiently match over the desired frequency range.

Figure 10A:
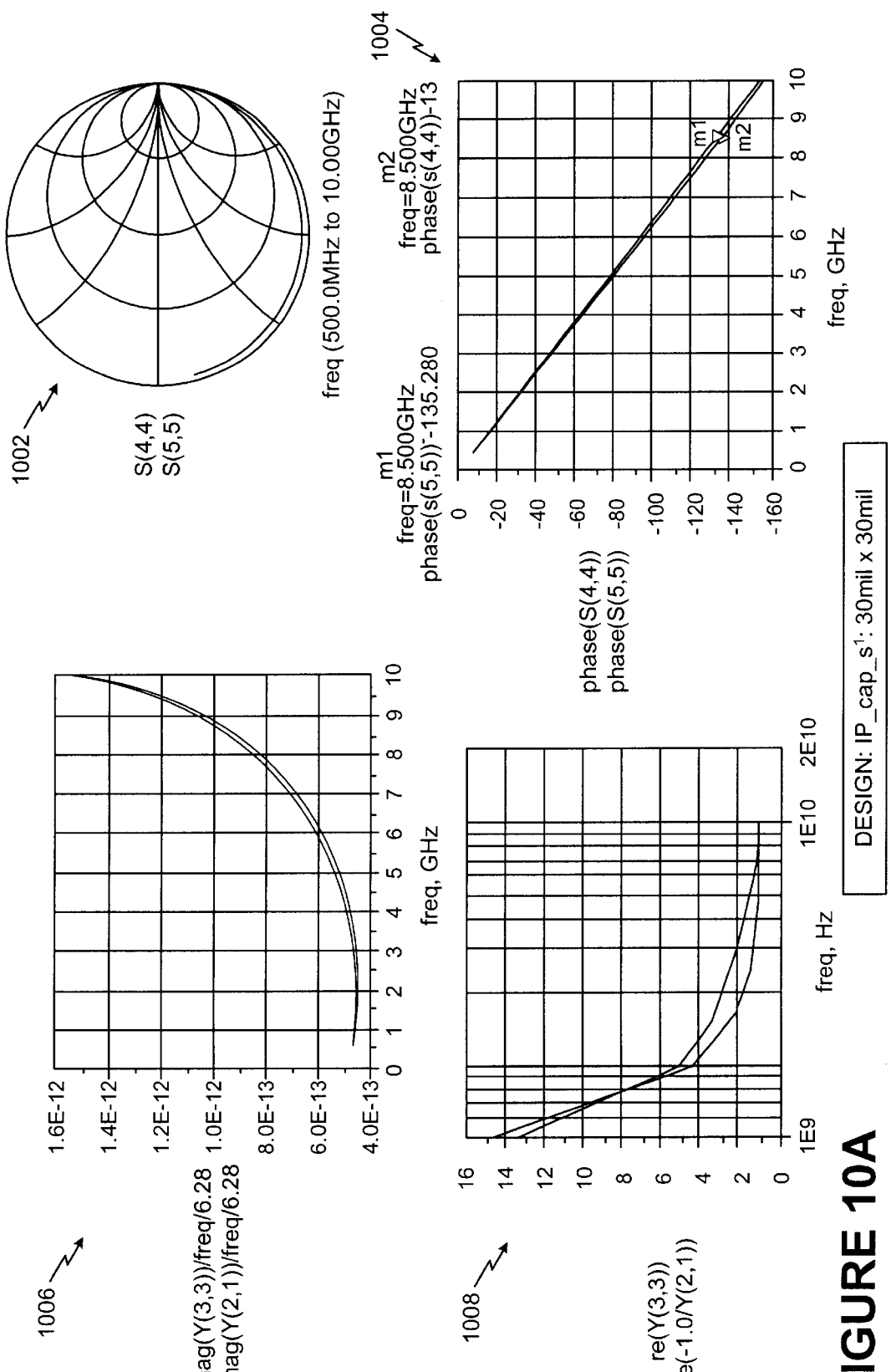
FIG. 10A are plots illustrating the high frequency performance of the production domain implementation of the capacitor of FIG. 8A.
Figure 10B:
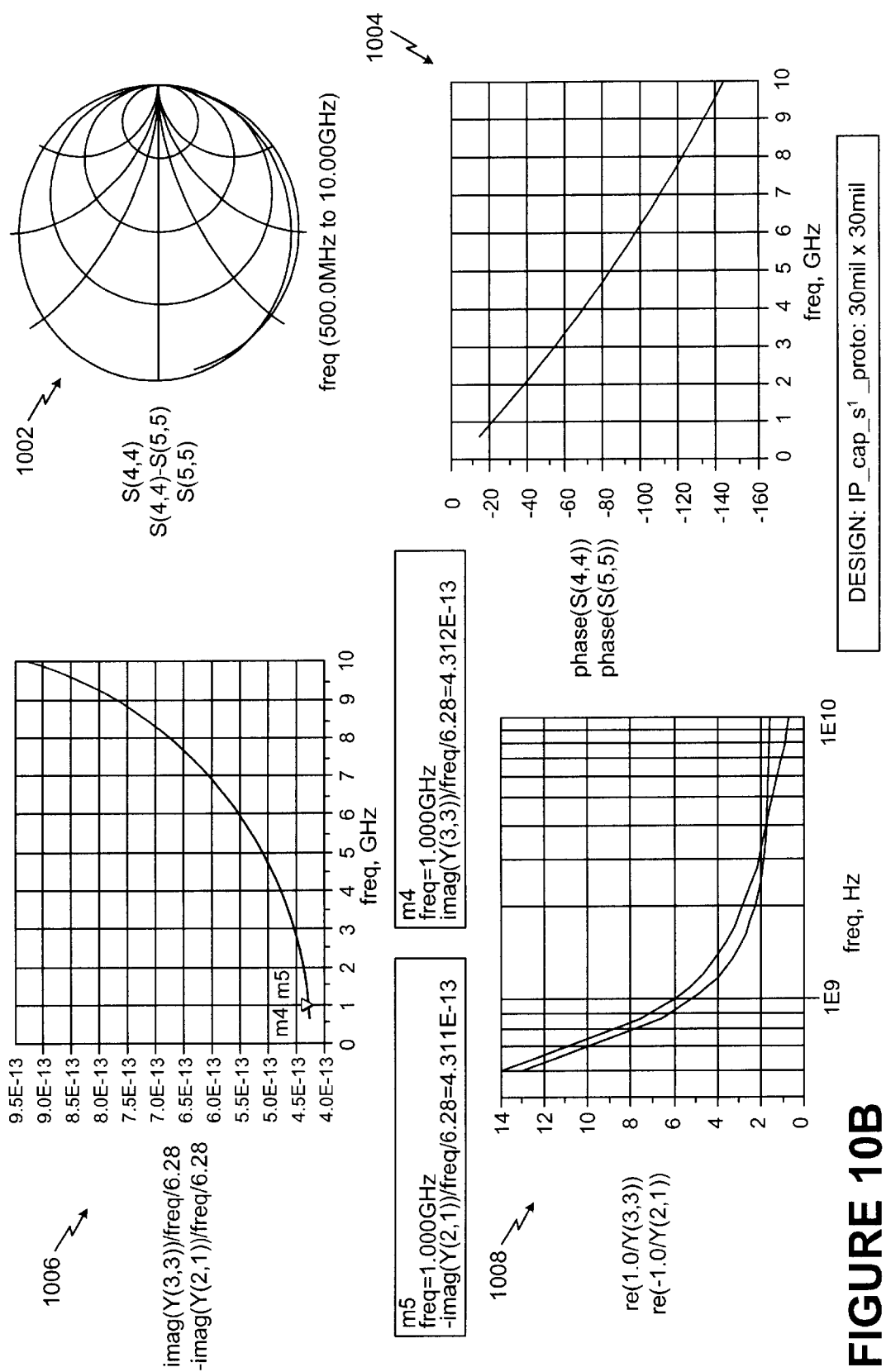
FIG. 10B are plots illustrating the high frequency performance of a prototype domain implementation of the capacitor of FIG. 8A.
Figure 10C:
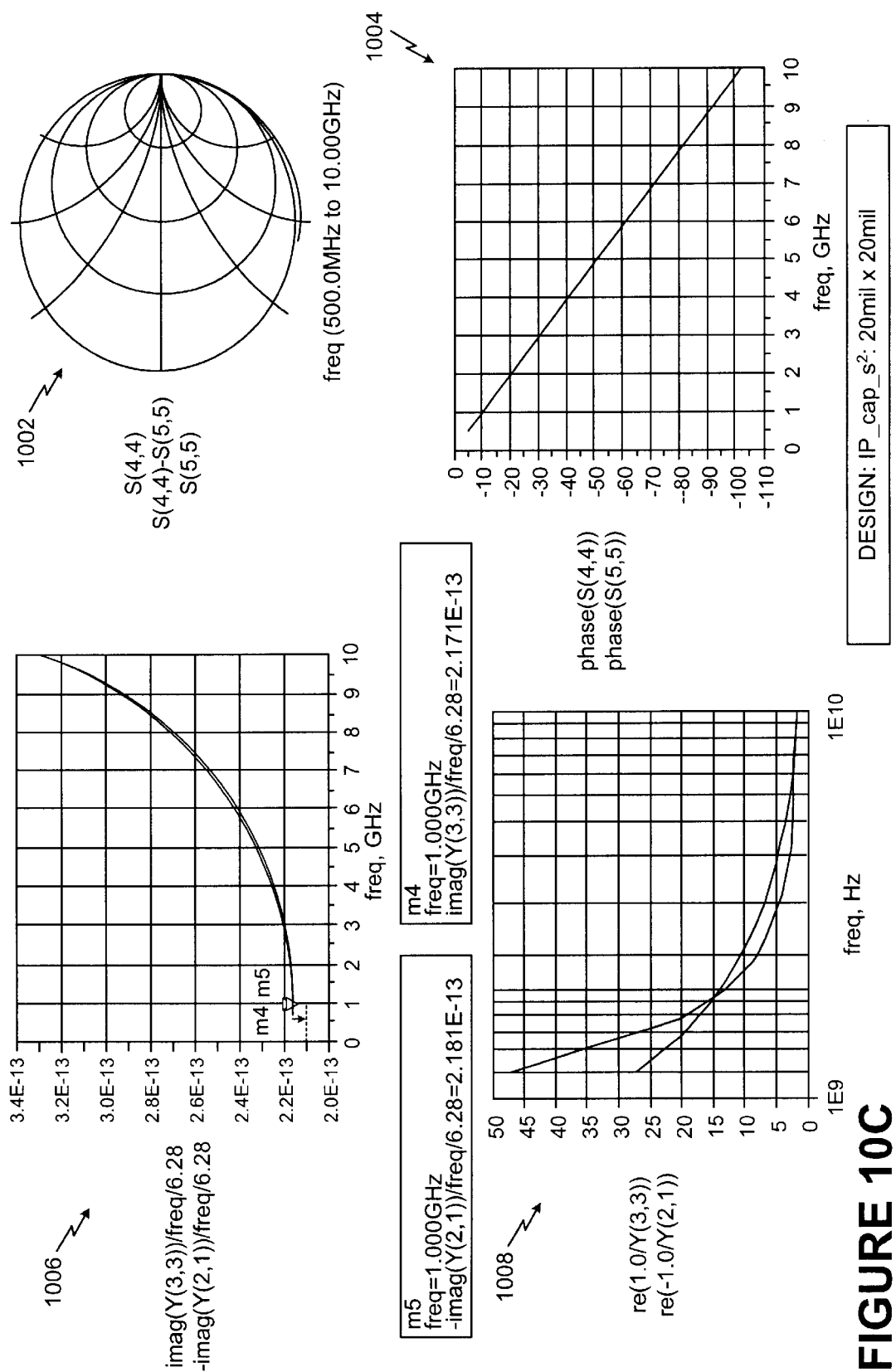
FIG. 10C are plots illustrating the high frequency performance of a production domain implementation of the capacitor of FIG. 8B.
Figure 10D:
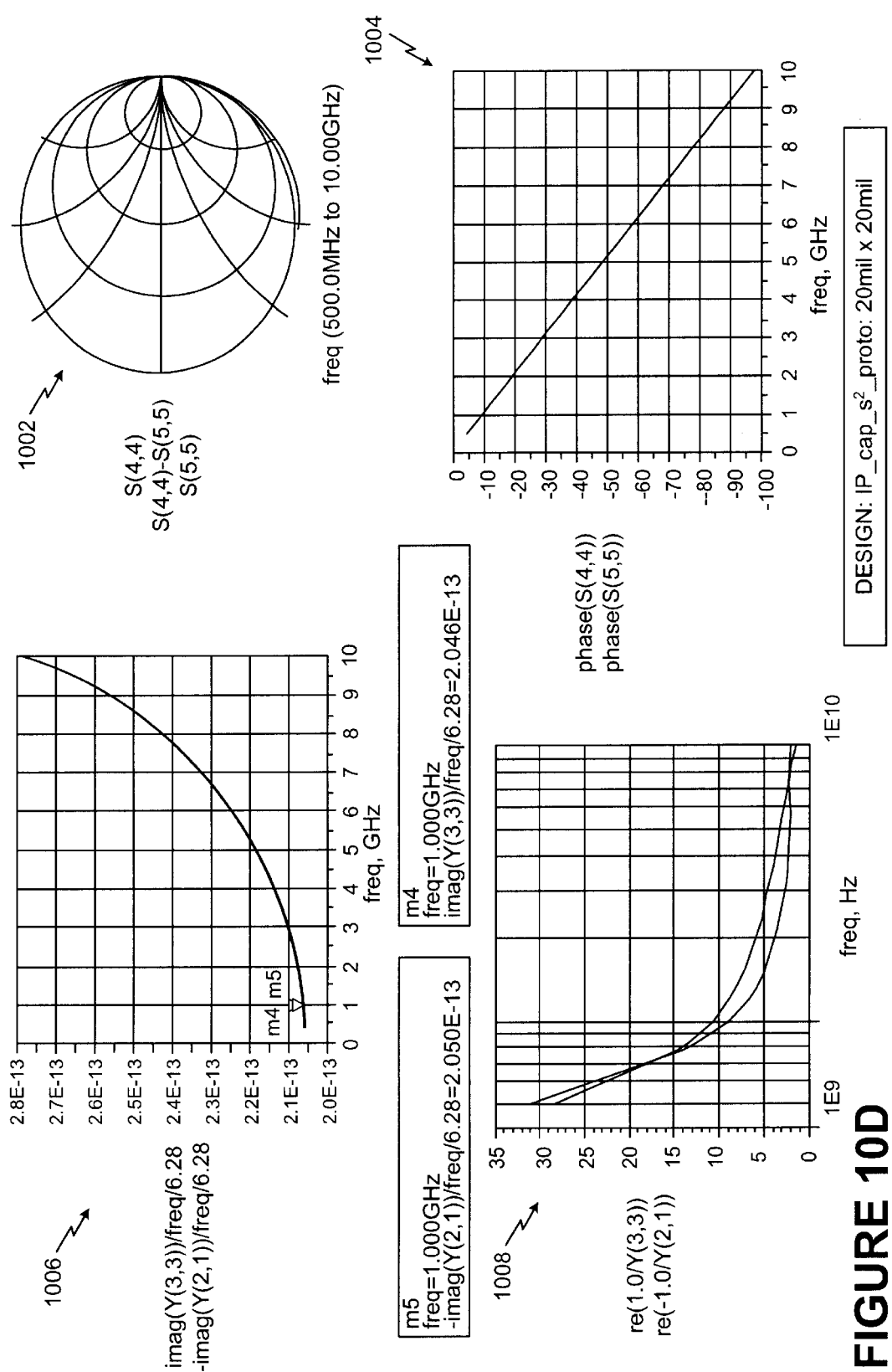
FIG. 10D are plots illustrating the high frequency performance of a prototype domain implementation of the capacitor of FIG. 8B.
Figure 10E:
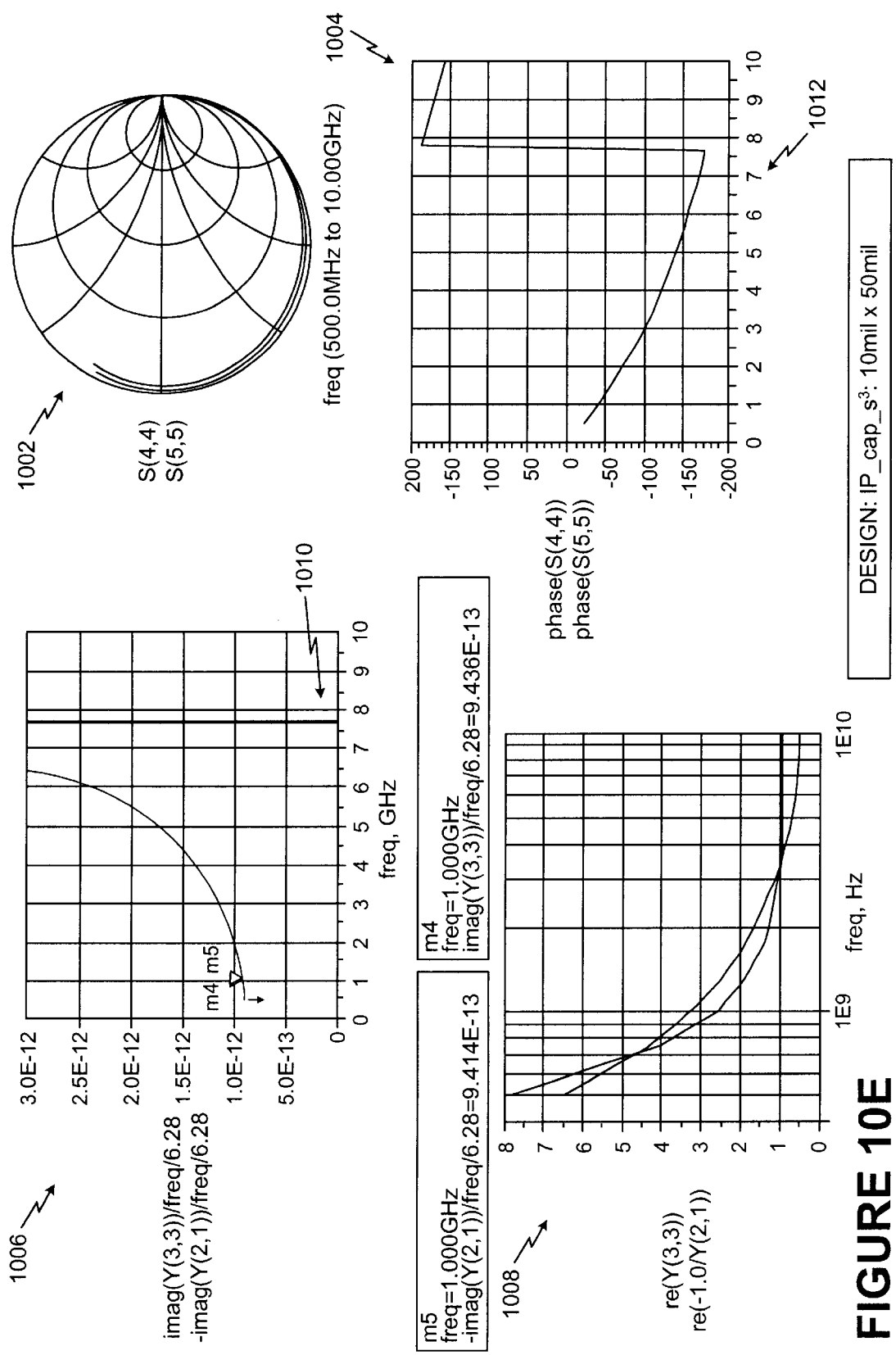
FIG. 10E are plots illustrating the high frequency performance of a production domain implementation of the capacitor of FIG. 8C.
Figure 10F:
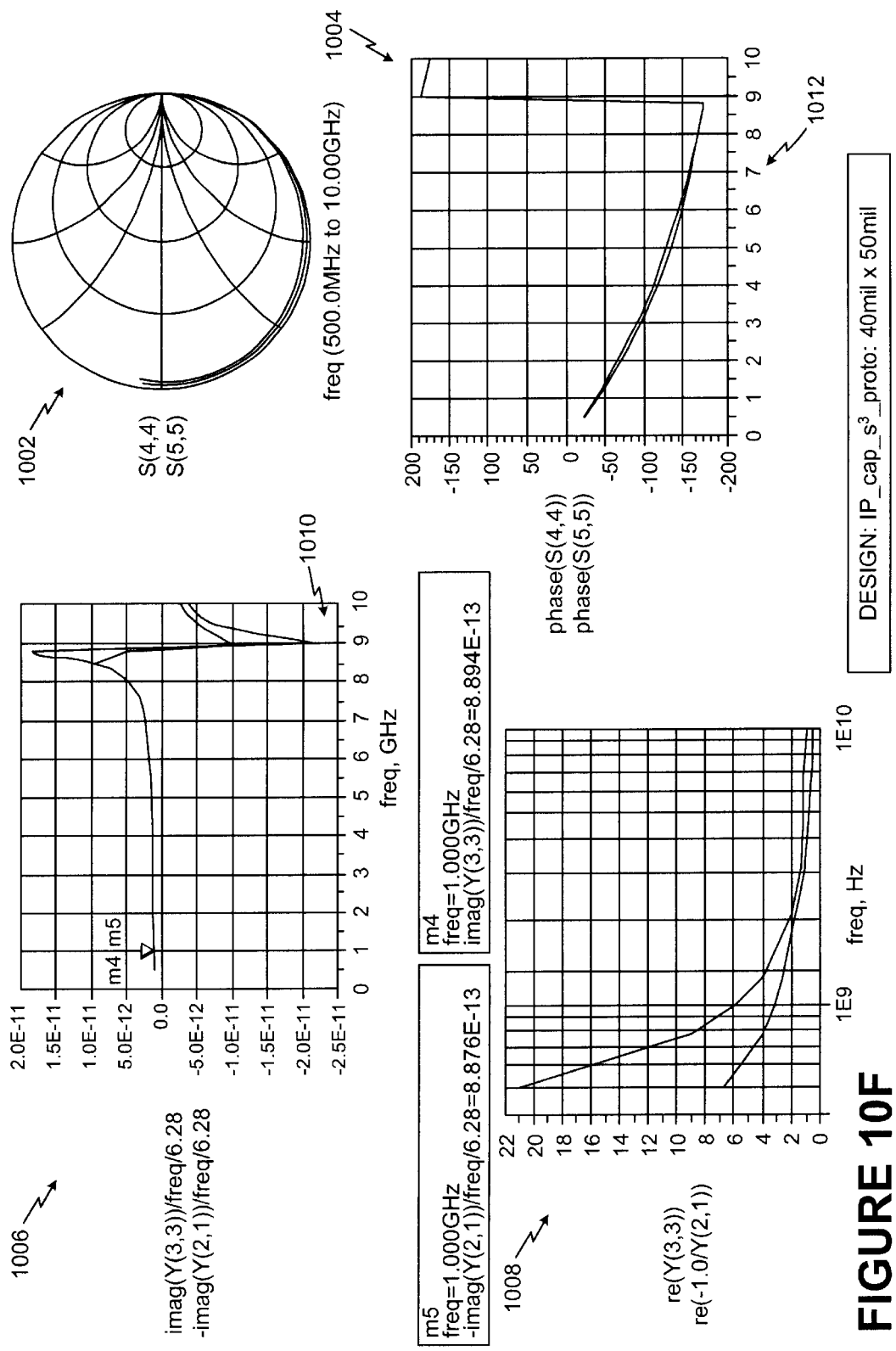
FIG. 10F are plots illustrating the high frequency performance of a prototype domain implementation of the capacitor of FIG. 8C.

The results are illustrated in graphical form in FIGS. 10A–10F, where FIG. 10A presents the results for the production domain implementation of the template of FIG. 8A; FIG. 10B presents the results for the prototype domain implementation of the template of FIG. 8A; FIG. 10C presents the results for the production domain implementation of the template of FIG. 8B; FIG. 10D presents the results for the prototype domain implementation of the template of FIG. 8B; FIG. 10E presents the results for the production domain implementation of the template of FIG. 8C; and FIG. 10F presents the results for the prototype domain implementation of the template of FIG. 8C.

Numeral 1002 in each of these figures identifies a plot on a Smith chart comparing, over a desired frequency range (500 MHz to 10.0 GHz), $S_{55}$ for the second lumped element model with $S_{44}$ for the one-port EM simulation model; numeral 1004 identifies a plot, over the desired frequency range, comparing the phase of $S_{55}$ with the phase of $S_{44}$; numeral 1006 identifies a plot, over the desired frequency range, comparing the imaginary portion of $Y_{33}$ for the first lumped element model with the negative of the imaginary portion of $Y_{21}$ for the two-port EM simulation model; and numeral 1008 identifies a plot, over the desired frequency range, comparing the real part of the inverse of $Y_{33}$ (equivalently, the real part of $Z_{33}$), with the negative of the inverse of $Y_{21}$ (equivalently, the negative of the real part of $Z_{21}$).

Except possibly for the plots identified with numeral 1008, all these plots demonstrate a high degree of correlation between the respective characteristics. However, since implementations of a capacitor are involved, it is more important to obtain correlation between characteristics having to do with reactance or susceptance than it is for characteristics relating to resistance or conductance. Since the plots identified with numeral 1008 all relate to resistance, they are less important for model validation than the other plots. Since these other plots demonstrate a high degree of correlation, they are sufficient to validate the lumped element models for each of the implementations of each template.

Next, for each of the templates, the model characteristics for the production domain implementation are compared with those of the prototype domain implementation to ensure that the two implementations can be characterized as interchangeable. To this end, the lumped element characteristics of FIG. 10A are compared with those of FIG. 10B; the lumped element characteristics of FIG. 10C are compared with those of FIG. 10D; and the lumped element characteristics of FIG. 10E and compared with those of FIG. 10F.

Comparing the plots of FIG. 10A with those of FIG. 10B, it can be seen that the most significant deviation is between the plots of the imaginary part of $Y_{33}$, identified in both figures with numeral 1006, at the higher end of the desired frequency range.

Comparing the plots of FIG. 10C with those of FIG. 10D, it can be seen that the most significant deviation is again between the plots of the imaginary part of $Y_{33}$. In particular, the plot of FIG. 10C is displaced upwards over the entire frequency range in relation to the plot of FIG. 10D.

Comparing the plots of FIG. 10E with those of FIG. 10F, it can be seen that there are significant deviations between the plots of the imaginary part of $Y_{33}$, and between the plots of the phase of $S_{55}$, identified in the figure with numeral 1004. In particular, the plot 1006 of FIG. 10E is displaced upwards over the entire frequency range in relation to the plot 1006 of FIG. 10F, and the resonant frequency, identified in both figures with numeral 1010, is displaced to the left. In addition, the resonant frequency of the plot 1004 in FIG. 10E, identified with numeral 1012, is displaced to the left in relation to the resonant frequency of the plot 1004 in FIG. 10F, also identified with numeral 1012.

To rectify this situation, one or more changes are made to one or both the implementations, in either or both the prototype or the production domain, until the plots match satisfactorily. In the event the prototype domain implementation has already been built, then it may be desirable to only make changes to the production domain implementation. On the other hand, suitable changes may also be made to the prototype domain implementation, even if already built, through techniques such as laser trimming.

Referring to FIGS. 8A–8C, suitable changes that may be considered include changing the degree of overlap between the bottom and top plates 802, 808 of the capacitor, changing the width or height of the capacitor plates, changing one or both of the input ports, or changing the size of the gap between the top and bottom plates of the capacitor. The effect of these changes may then be interpolated, or alternatively, calculated exactly through re-modeling, and the results compared until they match satisfactorily to warrant a conclusion that the implementations are interchangeable.

Although the above examples concern capacitors, similar examples are possible with inductors using, for example, the inductor templates of FIGS. 8D–8Q, or with resisters. Some of the changes which may be made to the implementations of the inductor templates include changing width or height of the main body of the inductor, one or both of the input ports to the inductor, the number of coils in the inductor, etc.

Embodiments of Products According to the Invention

Figure 11A:
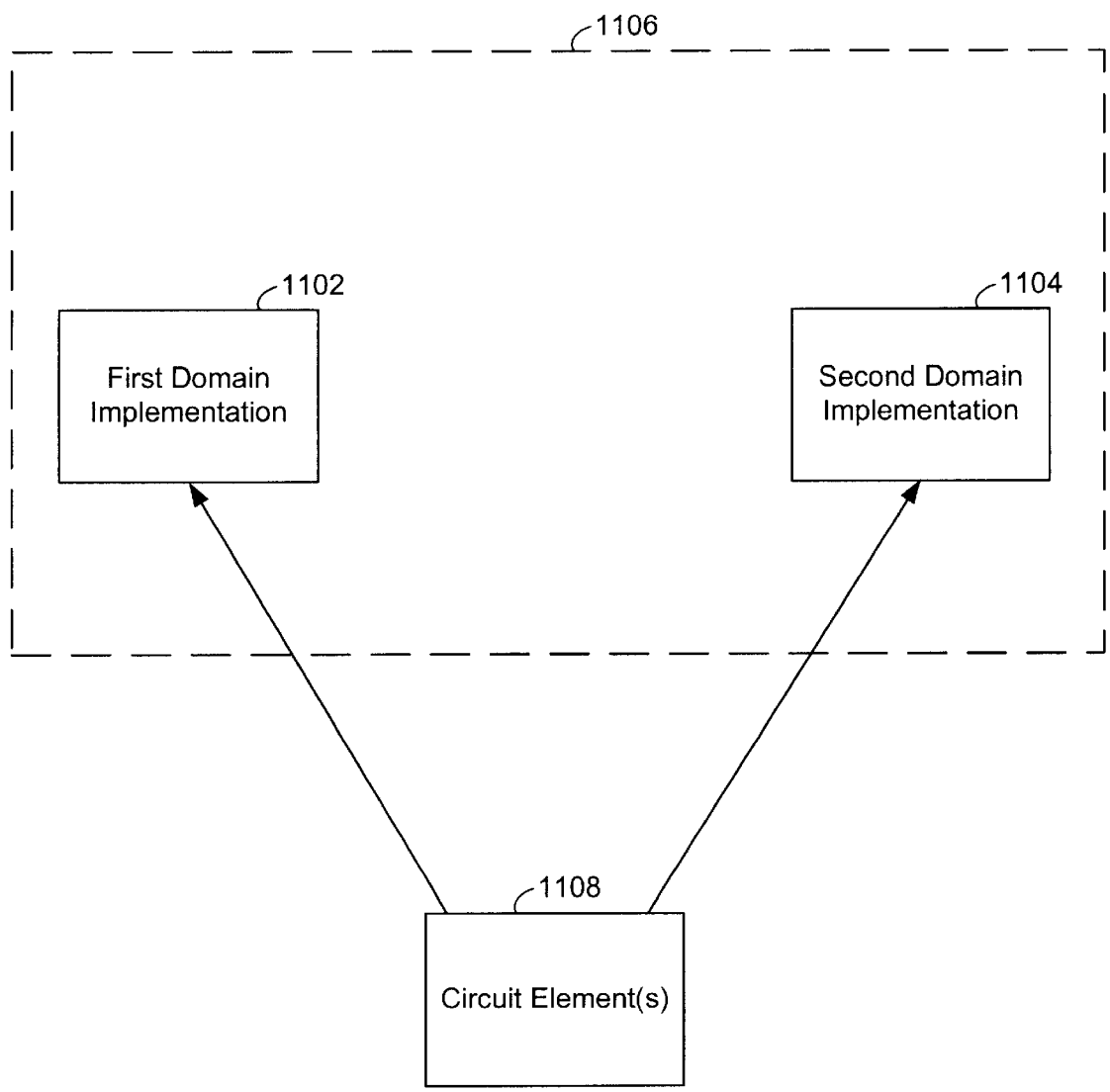
FIG. 11A is a block diagram of a first embodiment of a product of the invention comprising interchangeable implementations in first and second domains.

Referring to FIG. 11A, a first embodiment of a product of the invention, i.e., interchangeable implementations 1102, 1104 in first and second domains of one or more circuit elements of a high frequency circuit, is illustrated. The product may comprise just the first and second implementations, as indicated by identifying numeral 1106, or may also include a representation of the corresponding one or more circuit elements, as indicated by identifying numeral 1108. Again, these interchangeable implementations may be embodied in any tangible form, including but not limited to forms where the implementations are embodied on human readable or audible media, on processor readable media in the form of data or data structures, or as physical circuitry. Similarly, the representation of the one or more circuit elements, if present, may comprise a parameterized representation of the one or more circuit elements, e.g., one that has meaning to a circuit designer.

Figure 11B:
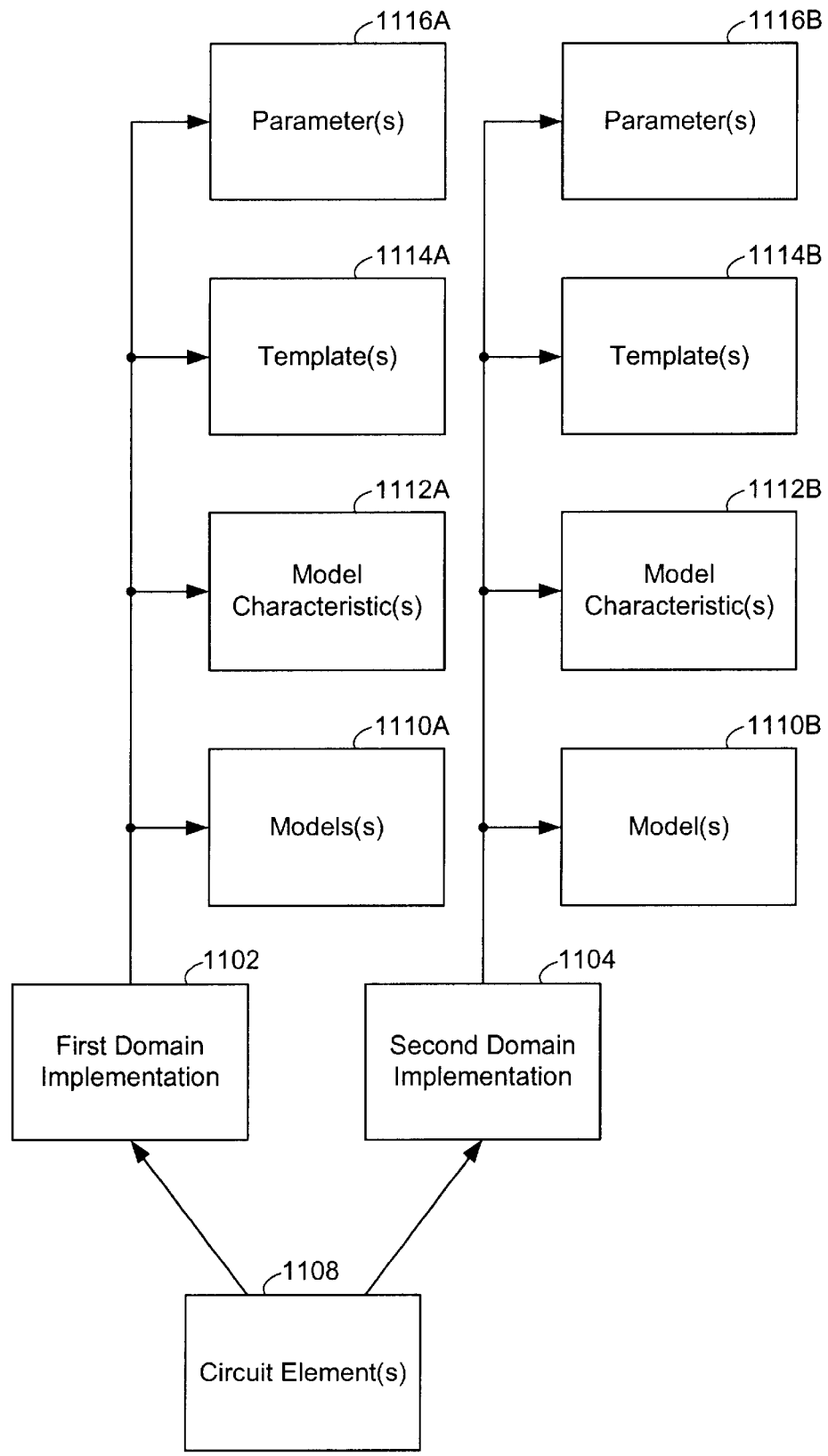
FIG. 11B is a block diagram of a second embodiment of a product of the invention comprising interchangeable implementations and corresponding background information formed from one or more of the corresponding models, model characteristics, templates, and parameters.

Referring to FIG. 11B, in a second embodiment, the implementations 1102, 1104 may be accompanied by corresponding models of the implementations, identified respectively with numerals 1110*a* and 1110*b*, and/or one or more model characteristics, identified respectively with numerals 1112*a* and 1112*b*. In addition, the implementations 1102, 1104 may also be accompanied by one or more corresponding templates, identified respectively with numerals 1114*a* and 1114*b*. (Although, in the case where the templates are domain-independent, the two boxes may be combined into one and associated with both implementations.).

Moreover, the implementations 1102, 1104 may also be accompanied by one or more of the corresponding (physical and/or electrical) parameters, identified respectively with numerals 1116*a* and 1116*b*. This background information may be useful for determining whether the two implementations can be interchangeable despite changes in the technology, one or more operating assumptions, or one or more of the parameters, or whether additional changes need to be made to one or both of the implementations. For example, consider a case whether the two implementations have been determined to be interchangeable over a certain frequency range, but it is desired to utilize the two implementations in a different frequency range. This background information would be useful for determining whether the two implementations can still be considered interchangeable over the new frequency range, or whether additional changes to one or both of the implementations need to be made for this characterization to still apply.

The models, model characteristics, templates, and parameters in this embodiment may be embodied in any tangible form, including but not limited to forms where these items are embodied on human readable or audible media, or on processor readable media in the form of data or data structures. In one example, all the items identified in FIG. 11B are tangibly embodied in the form of data or data structures stored on processor readable media.

A third embodiment of a product of the invention comprises any of the processes described or illustrated in the previous section tangibly embodied on processor readable media, e.g., where the process is embodied in the form of a series of processor executable instructions stored on processor readable media.

A fourth embodiment of a product of the invention comprises a computer program product, e.g., computer program, executable code or code module, that embodies any of the processes described or illustrated in the previous section.

Embodiments of Systems According to the Invention

Figure 12A:
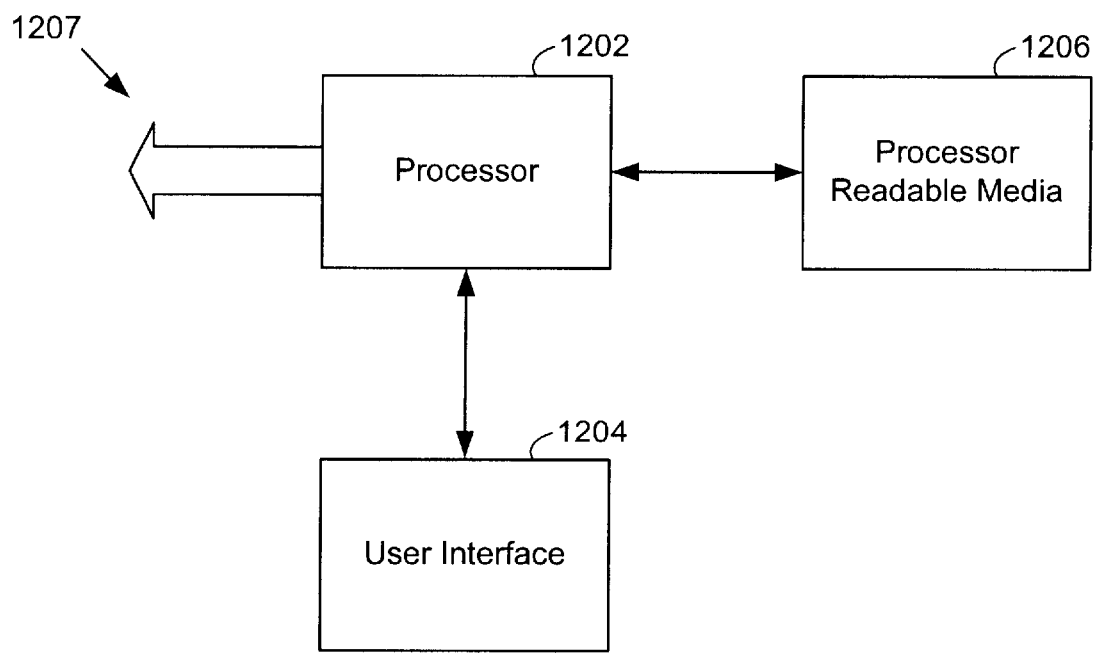
FIG. 12A is a simplified block diagram of a first embodiment of a system according to the invention.

Referring to FIG. 12A, a first embodiment of a system according to the invention comprises a processor 1202, user interface 1204, and processor readable media 1206 coupled together as shown. In addition, one or more interfaces 1207 for exchanging information with other processors may be provided.

A user inputs one or more parameters (physical and/or electrical) for first and second domains into the processor 1202 through the user interface 1204 which may without limitation comprise a keyboard, mouse, touch screen, serial or parallel port (for receiving the one or more parameters from another processor, or from processor readable media), display screen, etc. A series of instructions embodying any of the processes described or illustrated in the first section may be stored on processor readable media 1206. The processor 1202 retrieves these instructions from the media 1206, and executes them, thereby performing the process embodied in the instructions. Any of the products of these processes, such as described in the previous section, may be stored on the processor readable media 1206, transferred over interface 1207, or presented to the user over user interface 1204 upon the conclusion of the execution of the process.

Moreover, although embodiments are envisioned where the processes in the first section are entirely automated, the invention is not so limited, and embodiments are possible where one or more steps of the process are performed manually. In this case, the processor 1202 would only execute the portions of the underlying process which have been automated.

Figure 12B:
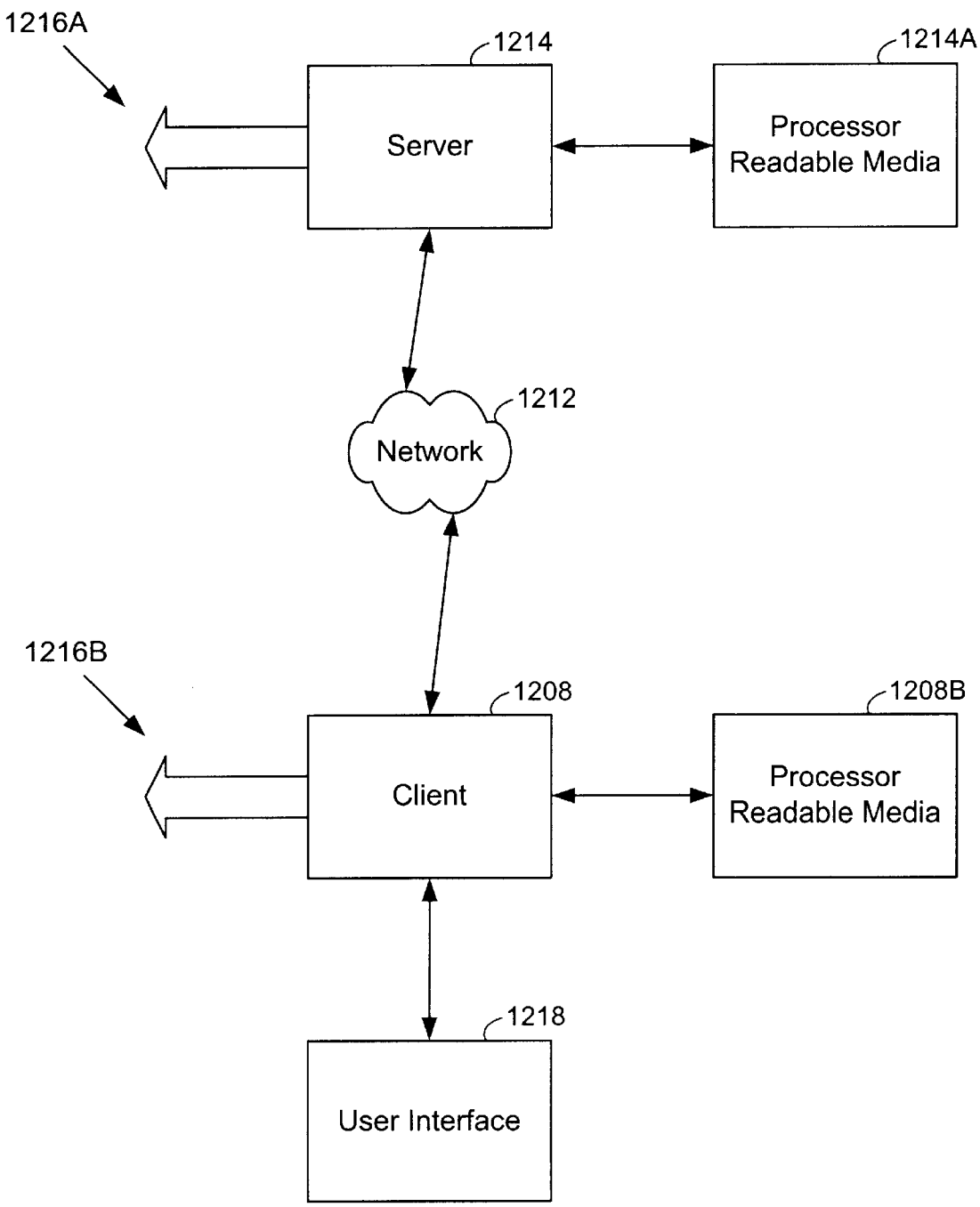
FIG. 12B is a simplified block diagram of a second embodiment of a system according to the invention having a client-server architecture.

A second embodiment of a system according to the invention is illustrated in FIG. 12B. In this embodiment, the system embodies a client-server architecture in which a server 1210 is accessible to a client 1208 over a network 1212 such as but not limited to a TCP/IP network such as the Internet. Both the client 1208 and the server 1210 may be processors. A user interface 1218 and processor readable media 1214*b* may be coupled to the client 1208. Moreover, the client 1208 may be configured with one or more interfaces 1216*b* for exchanging information with other processors. Processor readable media 1214*a* may also be coupled to the server 1210. In addition, the server 1210 may be configured with one or more interfaces 1216*a* for exchanging information with other processors.

One of the processes described or illustrated in the first section may be embodied as a series of instructions stored on processor readable media 1214*a* coupled to server 1210. A user inputs one or more parameters (physical and/or electrical) for first and second domains into the client 1208 through the user interface 1218 which may without limitation be embodied in any of the forms described in relation to the embodiment of FIG. 12A. Responsive thereto, the client 1208 communicates to the server 1210 over network 1212 indicating that the user wishes to invoke one of the processes described or illustrated in the first section. The server 1210 retrieves these instructions from the media 1214*a*, and executes them, thereby performing the process embodied in the instructions. Any of the products of these processes, described in the previous section, may, upon the conclusion of the execution of the process, be stored on the processor readable media 1214*a*, transferred over interface 1216*a* to another processor, or transferred back to client 1208 over the network 1212. Upon receipt of the one or more products by the client, the one or more products may be stored on processor readable media 1214*b*, provided to the user over user interface 1218, or transferred to another processor through interface 1216*b*.

Moreover, although embodiments are envisioned where the process is entirely automated, as discussed previously, embodiments are also possible where one or more steps of the process are performed manually. In this case, the server 1210 would only execute the portions of the underlying process which have been automated.

Further, although the foregoing description has been in terms of the server 1210 executing instructions embodying the underlying process, it should be appreciated that embodiments are possible where the underlying process is executed by the client, or where the client and server share responsibility for execution of the process.

While various embodiments of the invention have been described, it will be apparent to those of ordinary skill in the art that many more embodiments and implementations are possible that are within the scope of this invention.

What is claimed is:

1. A method of designing an electrical circuit, comprising:
obtaining a parameter relating to said circuit to be implemented in a production domain including an integrated circuit element;

obtaining said parameter relating to said circuit to be implemented in a prototype domain including a surface mounted circuit element;

mapping said parameters between said production and prototype domain implementations;

and using said mapping to select said integrated and surface mounted circuit elements to produce said electrical circuit, wherein said selected integrated and surface mounted circuit elements behave in substantially the same way in said production and prototype domain implementations with respect to said mapped parameters.

2. The method of claim 1 wherein said integrated and surface mounted circuit elements are passive elements.

3. The method of claim 1 wherein said circuit in at least one of said domains is a circuit board.

4. The method of claim 1 wherein said circuit in at least one of said domains is a printed wiring board.

5. The method of claim 1 wherein said circuit in at least one of said domains is silicon.

6. The method of claim 1 wherein said circuit in at least one of said domains is low temperature co-fired ceramic.

7. The method of claim 1 wherein said circuit in at least one of said domains comprises a circuit board having multiple layers.

8. The method of claim 7 wherein one of said multiple layers contains microvias.

9. The method of claim 1 further comprising deriving models of implementations in said production and prototype domains using said mapping.

10. The method of claim 1 wherein said obtaining said parameters in said production and prototype domains comprises obtaining primary and secondary characteristics of said integrated and surface mounted elements in said production and prototype domains.

11. The method of claim 1 wherein said obtaining said parameters in said production and prototype domains comprises obtaining primary and secondary characteristics of said circuit in said production and prototype domains.

12. The method of claim 1 wherein said integrated and surface mounted circuit elements are embodied on processor readable media.

13. The method of claim 1 wherein said integrated and surface mounted circuit elements are embodied as physical circuitry.

14. The method of claim 1 wherein said obtaining said parameters for said integrated and surface mounted elements for said production and prototype domains comprises obtaining a parameter relating to substrates for respectively supporting said integrated and surface mounted circuit elements.

15. The method of claim 14 wherein said obtaining said parameters for said integrated and surface mounted elements for said production and prototype domains comprises obtaining a parameter relating to a transmission media associated with said respective substrates for supporting said integrated and surface mounted circuit elements.

16. The method of claim 1 wherein said circuit in said production domain comprises a multi-layer circuit board and said circuit in said prototype domain comprises a single layer circuit board.

17. The method of claim 1 wherein the circuit elements are embodied on audible media.

18. The method of claim 1 wherein said circuit implementations are high frequency circuit implementations.

19. A computer program product, comprising:

a computer usable storage medium having computer readable code for designing an electrical circuit, such computer readable code comprising:

computer readable code for:

obtaining a parameter relating to said circuit to be implemented in a production domain including an integrated circuit element;

obtaining said parameter relating to said circuit to be implemented in a prototype domain including a surface mounted circuit element;

mapping said parameters between said production and prototype domain implementations;

and using said mapping to select said integrated and surface mounted circuit elements to produce said electrical circuit, wherein said selected integrated and surface mounted circuit elements behave in substantially the same way in said production and prototype domain implementations with respect to said mapped parameters.

20. A method of designing a circuit in production and prototype domains comprising:

obtaining for said production domain at least one parameter relating to a production domain circuit substrate for supporting at least one circuit element;

deriving, responsive to said at least one production domain parameters, at least one parameter relating to transmission media associated with the production domain circuit substrate;

obtaining for said prototype domain said at least one parameter relating to a prototype domain circuit substrate for supporting at least one circuit element;

deriving, responsive to said at least one production domain parameters, at least one parameter relating to transmission media associated the prototype domain circuit substrate; and deriving, responsive to said substrate and transmission media parameters for said production and prototype domains, interchangeable implementations in said production and prototype domains for said at least one circuit element, and models of the interchangeable implementations in said production and prototype domains, wherein a characteristic of one of the models matches a corresponding characteristic of another of said models over a desired frequency range.

21. The method of claim 20 wherein said circuit substrates in said production and prototype domains are circuit boards.

22. The method of claim 20 wherein said circuit substrates in said production and prototype domains are printed wiring boards.

23. The method of claim 20 wherein said circuit substrate in said production and prototype domains are silicon substrates.

24. The method of claim 20 wherein said circuit substrates in said production and prototype domains are low temperature co-fired ceramic.

25. The method of claim 20 wherein said production domain circuit substrate is a substrate having multiple layers.

26. The method of claim 25 wherein a layer of said production domain circuit substrate has a microvia layer.

27. The method of claim 20 wherein said implementations are high frequency implementations.

28. The method of claim 20 further comprising matching a primary characteristic of one of said models with a corresponding primary characteristic of another of said models over said desired frequency range.

29. The method of claim 20 further comprising matching primary and secondary characteristics of one of said models with, respectively, corresponding primary and secondary characteristics of another of said models over said desired frequency range.

30. A computer program product, comprising:
a computer usable storage medium having computer readable code for designing a circuit in production and prototype domains, such computer readable code comprising:
  computer readable code for:
    obtaining for said production domain at least one parameter relating to a production domain circuit substrate for supporting at least one circuit element;
    deriving, responsive to said at least one production domain parameters, at least one parameter relating to transmission media associated with the production domain circuit substrate;
    obtaining for said prototype domain said at least one parameter relating to a prototype domain circuit substrate for supporting at least one circuit element;
    deriving, responsive to said at least one production domain parameters, at least one parameter relating to transmission media associated the prototype domain circuit substrate; and
    deriving, responsive to said substrate and transmission media parameters for said production and prototype domains, interchangeable implementations in said production and prototype domains for said at least one circuit element, and models of the interchangeable implementations in said production and prototype domains, wherein a characteristic of one of the models matches a corresponding characteristic of another of said models over a desired frequency range.

31. Interchangeable circuit implementations, comprising:
a circuit implementation in a production domain, including a circuit element and a model of thereof;
a circuit implementation in a prototype domain, including a circuit element and a model thereof;
wherein a characteristic of one of said models matches a corresponding characteristic of another of said models over a desired frequency range.

32. The interchangeable circuit implementations of claim 31 wherein said circuit element in the production domain is an integrated circuit element, and wherein said circuit element in the prototype domain is a surface mounted element.

33. The interchangeable circuit implementations of claim 31 wherein said circuit elements are resistors.

34. The interchangeable circuit implementations of claim 31 wherein said circuit elements are capacitors.

35. The interchangeable circuit implementations of claim 31 wherein said circuit elements are inductors.

36. The interchangeable circuit implementations of claim 31 wherein said circuit implementations are tangibly embodied on human readable media.

37. The interchangeable circuit implementations of claim 31 wherein said circuit implementations are tangibly embodied on audible media.

38. The interchangeable implementations of claim 31 wherein said circuit implementations are tangibly embodied on processor readable media.

39. The interchangeable circuit implementations of claim 31 wherein said circuit implementations are tangibly embodied as physical circuitry.

40. A method for designing an electrical circuit, comprising:
mapping parameters between production and prototype implementations of said electrical circuit in which said production implementation includes an integrated circuit element and said prototype implementation includes a surface mounted circuit element;
and using results of said mapping to establish values of said integrated and surface mounted circuit elements so that said selected integrated and surface mounted circuit elements behave in substantially the same way in said production and prototype implementations with respect to said mapped parameters.

41. The method of claim 40 wherein said integrated and surface mounted circuit elements are passive elements.

42. The method of claim 40 wherein said circuit in at least one of said domains is a circuit board.

43. The method of claim 40 wherein said circuit in at least one of said domains is a printed wiring board.

44. The method of claim 40 wherein said circuit in at least one of said domains is silicon.

45. The method of claim 40 wherein said circuit in at least one of said domains is low temperature co-fired ceramic.

46. The method of claim 40 wherein said circuit in at least one of said domains comprises a circuit board having multiple layers.

47. The method of claim 46 wherein one of said multiple layers contains microvias.

48. The method of claim 40 further comprising deriving models of implementations in said production and prototype domains using said mapping.

49. The method of claim 40 wherein said obtaining said parameters in said production and prototype domains comprises obtaining primary and secondary characteristics of said integrated and surface mounted elements in said production and prototype domains.

50. The method of claim 40 wherein said obtaining said parameters in said production and prototype domains comprises obtaining primary and secondary characteristics of said circuit in said production and prototype domains.

51. The method of claim 40 wherein said integrated and surface mounted circuit elements are embodied on processor readable media.

52. The method of claim 40 wherein said integrated and surface mounted circuit elements are embodied as physical circuitry.

53. The method of claim 40 wherein said obtaining said parameters for said integrated and surface mounted elements for said production and prototype domains comprises obtaining a parameter relating to substrates for respectively supporting said integrated and surface mounted circuit elements.

54. The method of claim 53 wherein said obtaining said parameters for said integrated and surface mounted elements for said production and prototype domains comprises obtaining a parameter relating to a transmission media associated with said respective substrates for supporting said integrated and surface mounted circuit elements.

55. The method of claim 40 wherein said circuit in said production domain comprises a multi-layer circuit board and said circuit in said prototype domain comprises a single layer circuit board.

56. The method of claim 40 wherein the circuit elements are embodied on audible media.

57. The method of claim 40 wherein said circuit implementations are high frequency circuit implementations.

58. A production implantation of an electrical circuit having at least some integrated components having at least some parameters substantially the same as parameters of a prototype implementation of said electrical circuit having at least some surface mounted components, made by the process comprising:

mapping said parameters between said production and prototype implementations;

and using results of said mapping to establish values of said integrated and surface mounted circuit components whereby said selected integrated and surface mounted circuit components behave in substantially the same way in said production and prototype implementations with respect to said mapped parameters.

59. The production implantation of claim 58 wherein said integrated and surface mounted components are passive components.

60. The production implantation of claim 58 at least one of said implementations comprises a circuit board.

61. The production implantation of claim 58 wherein at least one of said implementations comprises a printed wiring board.

62. The production implantation of claim 58 wherein at least one of said implementations comprises a silicon substrate.

63. The production implantation of claim 58 wherein at least one of said implementations comprises a low temperature co-fired ceramic substrate.

64. The production implantation of claim 58 wherein at least one of said implementations comprises a circuit board having multiple layers.

65. The production implantation of claim 64 wherein one of said multiple layers contains microvias.

66. The production implantation of claim 58 further comprising deriving models of said implementations using said mapping.

67. The production implantation of claim 58 wherein said parameters comprise primary and secondary characteristics of said integrated and surface mounted components.

68. The production implantation of claim 58 wherein said parameters comprise primary and secondary characteristics of said circuit in said implementations.

69. The production implantation of claim 58 wherein said integrated and surface mounted circuit components are embodied on processor or readable media.

70. The production implantation of claim 58 wherein said integrated and surface mounted circuit components are embodied as physical circuitry.

71. The production implantation of claim 58 wherein said parameters comprise a parameter relating to substrates for respectively supporting said integrated and surface mounted circuit components.

72. The production implantation of claim 71 wherein said parameters comprise a parameter relating to a transmission media associated with said respective substrates for supporting said integrated and surface mounted circuit components.

73. The production implantation of claim 58 wherein said circuit in said production implementation comprises a multilayer circuit board and said circuit in said prototype implementation comprises a single layer circuit board.

74. The production implantation of claim 58 wherein the circuit components are embodied on audible media.

75. The production implantation of claim 58 wherein said implementations are high frequency circuit implementations.

* * * * *